US 8,733,281 B2

(12) United States Patent
Hirayama et al.

(10) Patent No.: US 8,733,281 B2
(45) Date of Patent: *May 27, 2014

(54) PLASMA PROCESSING APPARATUS

(71) Applicants: Tokyo Electron Limited, Tokyo (JP); Tohoku University, Sendai (JP)

(72) Inventors: Masaki Hirayama, Miyagi (JP); Tadahiro Ohmi, Miyagi (JP); Takahiro Horiguchi, Nirasaki (JP)

(73) Assignees: Tokyo Electron Limited, Tokyo (JP); Tohoku University, Sendai-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/726,913

(22) Filed: Dec. 26, 2012

(65) Prior Publication Data

US 2013/0112352 A1 May 9, 2013

Related U.S. Application Data

(62) Division of application No. 12/663,764, filed as application No. PCT/JP2008/060692 on Jun. 11, 2008, now abandoned.

(30) Foreign Application Priority Data

Jun. 11, 2007 (JP) ................................. 2007-153580

(51) Int. Cl.
*C23C 16/00* (2006.01)
*C23F 1/00* (2006.01)
*H01L 21/306* (2006.01)

(52) U.S. Cl.
USPC ....... 118/723 MW; 118/723 ME; 118/723 R; 156/345.36; 156/345.41

(58) Field of Classification Search
USPC ....... 118/723 MW, 723 R, 723 ME, 723 MR; 156/345.36, 345.41; 315/111.21
See application file for complete search history.

(56) References Cited

U.S. PATENT DOCUMENTS 5,342,472 A * 8/1994 Imahashi et al. ......... 156/345.42
6,109,208 A    8/2000 Tsuchihashi et al.
(Continued)

FOREIGN PATENT DOCUMENTS

JP    03-262119 A    11/1991
JP    10-158847 A    6/1998
(Continued)

OTHER PUBLICATIONS

English Machine Translation JP 10158847, Yamauchi et al dated Jun. 16, 1998.*

(Continued)

*Primary Examiner* — Rakesh Dhingra
(74) *Attorney, Agent, or Firm* — Pearne & Gordon LLP

(57) ABSTRACT

A plasma processing apparatus includes: a processing chamber produced from a metal; a susceptor configured to mount a substrate; an electromagnetic wave source that supplies an electromagnetic wave; one or more dielectric member provided at an inner wall of the processing chamber, and configured to transmit the electromagnetic wave into an inside of the processing chamber; one or more metal electrode, wherein each metal electrode is installed on a bottom surface of each dielectric member such that a part of the each dielectric member is exposed to the inside of the processing chamber; and a surface wave propagating section which is a metal surface facing the susceptor, the surface wave propagating section being installed adjacent to the dielectric member and being exposed to the inside of the processing chamber. The surface wave propagating section and a bottom surface of the metal electrode are positioned on the same plane.

16 Claims, 52 Drawing Sheets

(56) References Cited

U.S. PATENT DOCUMENTS

| | | | |
|---|---|---|---|
| 6,388,632 B1* | 5/2002 | Murakawa et al. | 343/770 |
| 6,427,621 B1* | 8/2002 | Ikegawa et al. | 118/723 MW |
| 6,622,650 B2* | 9/2003 | Ishii et al. | 118/723 MW |
| 6,638,392 B2* | 10/2003 | Yamamoto et al. | 156/345.41 |
| 2001/0050058 A1* | 12/2001 | Yamamoto et al. | 118/723 MW |
| 2002/0123200 A1* | 9/2002 | Yamamoto et al. | 438/345 |
| 2003/0132198 A1* | 7/2003 | Ono et al. | 216/69 |
| 2004/0029339 A1* | 2/2004 | Yamamoto et al. | 438/222 |
| 2006/0238132 A1 | 10/2006 | Kitamura et al. | |
| 2007/0264441 A1* | 11/2007 | Ishibashi et al. | 427/488 |
| 2009/0065480 A1* | 3/2009 | Ohmi et al. | 216/69 |

FOREIGN PATENT DOCUMENTS

| | | | | |
|---|---|---|---|---|
| JP | 11-214196 A | 8/1999 | | |
| JP | 2000-286237 A | 10/2000 | | |
| JP | 2001-284331 A | 10/2001 | | |
| JP | 2002-170818 A | 6/2002 | | |
| JP | 2002-355550 A | 12/2002 | | |
| JP | 2003-133232 A | 5/2003 | | |
| JP | 2004-186303 A | 7/2004 | | |
| JP | 2004-200307 A | 7/2004 | | |
| JP | 2005-019508 A | 1/2005 | | |
| JP | 2005-135801 A | 5/2005 | | |
| JP | 2006-310794 A | 11/2006 | | |
| JP | 2007-048718 | * | 2/2007 | H05H 1/46 |
| WO | WO 2005078782 | * | 8/2005 | C23C 16/00 |

OTHER PUBLICATIONS

International Search Report for PCT/JP2008/060692 dated Sep. 16, 2008.
Japanese Office action for 2009-519277 dated Dec. 14, 2010.
Korean Office action for 10-2009-7026408 dated Jun. 13, 2011.

* cited by examiner

PLASMA PROCESSING APPARATUS

CROSS-REFERENCE TO RELATED APPLICATION

This is a divisional application of U.S. patent application Ser. No. 12/663,764 filed on Dec. 9, 2009, which claims the benefit of Japanese Patent Application No. 2007-153580, filed on Jun. 11, 2007, the entire disclosures of which are incorporated herein by reference.

TECHNICAL FIELD

The present invention relates to a plasma processing apparatus for performing a process such as a film formation on a substrate by exciting plasma.

BACKGROUND ART

In a manufacturing process of, for example, a LCD device or the like, there has been used a plasma processing apparatus which performs a CVD (Chemical Vapor Deposition) process, an etching process or the like on a LCD substrate (glass substrate) by exciting plasma in a processing chamber by using microwaves. Known as such a plasma processing apparatus is an apparatus which supplies a microwave to a dielectric member provided on an inner surface of the processing chamber from a microwave source through a coaxial waveguide or a waveguide and excites a gas supplied into the processing chamber to plasma by using the energy of the microwave.

Recently, along with the scale-up of the substrate and so forth, the plasma processing apparatus is also getting bigger. If the dielectric member provided on the inner surface of the processing chamber is configured as a single plate, it is difficult to manufacture a large-size dielectric member, which may leads to an increase of manufacturing cost. To solve such a problem, the present inventors have proposed a technique of employing a dielectric plate divided into plurality by installing a plurality of dielectric members to a bottom surface of a cover of the processing chamber (see, for example, Patent Document 1).

Patent Document 1: Japanese Patent Laid-open Publication No. 2006-310794

DISCLOSURE OF THE INVENTION

Problems to be Solved by the Invention

In the above-described plasma processing apparatus using the microwave, a microwave source which outputs a microwave of about 2.45 GHz has been generally utilized because such a microwave source has been widely applied to the industry and thus is readily obtainable as well as economical.

The conventional plasma processing apparatus has a configuration in which the microwave of about 2.45 GHz outputted from the microwave source is supplied into the inside of the processing chamber after transmitted through the dielectric member provided on the bottom surface of the cover of the processing chamber. In such a case, the dielectric member is installed to cover the substantially entire processing surface (top surface) of the substrate accommodated in the processing chamber, and the dielectric member's surface area exposed to the inside of the processing chamber has the substantially same size as the area of the processing surface of the substrate. With this configuration, uniform processing can be performed on the entire processing surface of the substrate by using the plasma generated under the entire bottom surface of the dielectric member.

If, however, the exposed area of the dielectric member is set to be substantially same as the area of the processing surface of the substrate as in the conventional plasma processing apparatus, a great amount of dielectric member is required and thus is deemed to be uneconomical. Especially, with the recent trend for the scale-up of the substrate, a greater amount of dielectric member needs to be used, resulting in an increase of cost.

Furthermore, in case that the dielectric member is installed on the entire bottom surface of the cover of the processing chamber, it becomes difficult to uniformly supply the processing gas onto the entire substrate processing surface. For example, if $Al_2O_3$ is used as the dielectric member, it is more difficult to form gas supply holes in the dielectric member than in the metal cover. Thus, the gas supply holes are provided only at exposed positions of the cover, so that uniform supply of the processing gas onto the entire processing surface of the substrate in a shower plate-like manner becomes difficult.

In the plasma process such as etching or CVD, a self bias voltage (negative DC voltage) may be generated on the substrate by applying a high frequency bias to the substrate to control ion energy incident on the substrate surface from the plasma. At this time, it is desirable that the high frequency bias applied to the substrate has an effect only on a sheath around the substrate. However, the high frequency bias also has an effect on a sheath around a ground surface when most of the processing chamber inner surface is covered by the dielectric member so that the ground surface (processing chamber inner surface) is hardly seen from the plasma. Therefore, an excessively great high frequency power needs to be applied to the substrate, so that ion energy incident on the ground surface increases. As a result, the ground surface is etched, resulting in metal contamination.

Moreover, if a high power microwave is inputted to raise a processing rate, the temperature of the dielectric member would increase due to ions or electrons incident from the plasma, resulting in damage of the dielectric member due to thermal stress or contamination by impurities caused by an etching reaction on the surface of the dielectric member.

In view of the foregoing, the present invention provides a plasma processing apparatus capable of reducing a use amount of the dielectric member.

Means for Solving the Problems

In the above-described plasma processing apparatus using the microwave, the microwave source which outputs the microwave of about 2.45 GHz has been generally employed due to its easy acquisition, economical efficiency and so forth. Meanwhile, a plasma process using a microwave of a low frequency equal to or less than about 2 GHz has been recently proposed, and, for example, a plasma process using a microwave of about 915 MHz is under investigation. A minimum electron density for obtaining stable plasma having a low electron temperature is proportional to the square of the frequency. Thus, if the frequency of the microwave is lowered, plasma suitable for a plasma process can be obtained under a wider range of conditions.

The prevent inventors have investigated the plasma process using the microwave of the low frequency equal to or less than about 2 GHz in various aspects. As a result, it was newly found out that when the electromagnetic wave of a frequency equal to or less than about 2 GHz is transmitted through the dielectric member provided on the processing chamber inner surface, the electromagnetic wave can be propagated effectively along a metal surface such as the processing chamber inner surface from the vicinity of the dielectric member, and plasma can be excited within the processing chamber by the electromagnetic wave which is propagated along the metal surface. Further, the electromagnetic wave propagated along the metal surface between the metal surface and the plasma is referred to as a "conductor surface wave" in the specification.

The present invention has been conceived based on such a novel knowledge. In accordance with one aspect of the present invention, there is provided a plasma processing apparatus including: a processing chamber produced from a metal; a susceptor configured to mount a substrate and installed in the processing chamber; an electromagnetic wave source that supplies an electromagnetic wave necessary to excite plasma in the processing chamber; one or more dielectric member provided at an inner wall of the processing chamber, and configured to transmit the electromagnetic wave supplied from the electromagnetic wave source into an inside of the processing chamber, the inner wall facing the susceptor; one or more metal electrode, wherein each metal electrode is installed on a bottom surface of each dielectric member such that a part of the each dielectric member is exposed to the inside of the processing chamber; and a surface wave propagating section which is a metal surface facing the susceptor, the surface wave propagating section being installed adjacent to the dielectric member and being exposed to the inside of the processing chamber. Further, the surface wave propagating section and a bottom surface of the metal electrode may be positioned on the same plane.

In this plasma processing apparatus, an area of the metal electrode may be smaller than an area of the dielectric member, and the bottom surface of the dielectric member may be exposed to the inside of the processing chamber in the vicinity of the metal electrode. Further, an area of the metal electrode may be larger than an area of the dielectric member, and a side surface of the dielectric member may be exposed to the inside of the processing chamber.

Further, the processing chamber may comprise a chamber main body and a cover, and the surface wave propagating section may serve as a bottom surface of the cover. Furthermore, the plasma processing apparatus may comprise one or more gas discharge hole through which a gas is discharged into the processing chamber, and the gas discharge hole may be provided in the bottom surface of the cover.

The processing chamber may comprise a chamber main body and a cover, and the dielectric member and a metal cover may be installed at an inner surface of the cover, and the surface wave propagating section may serve as a bottom surface of the metal cover. Further, the metal cover may have a thickness equivalent to a sum of thicknesses of the dielectric member and the metal electrode. Furthermore, the plasma processing apparatus may comprise one or more gas discharge hole through which a gas is discharged into the processing chamber, and the gas discharge hole may be provided in the bottom surface of the metal cover.

Further, in the plasma processing apparatus, the surface wave propagating section may be a single continuous flat section.

Further, one or more metal rod serving to propagate the electromagnetic wave to the dielectric member may be provided in a top portion of the dielectric member such that a bottom end of each metal rod is adjacent or close to a top surface of the dielectric member. Furthermore, sealing members may be installed between a top surface of the dielectric member and the inner wall of the processing chamber, and between the bottom surface of the dielectric member and the metal electrode.

The plasma processing apparatus may further comprise one or more connecting member provided to connect the metal electrode and the inner wall of the processing chamber through a hole in the dielectric member. Further, the metal electrode may be provided with one or more gas discharge hole through which a gas is discharged into the processing chamber, and the connecting member may be provided with a gas passage through which the gas flows to reach the gas discharge hole.

Further, a frequency of the electromagnetic wave supplied from the electromagnetic wave source may be equal to or less than about 2 GHz. Furthermore, a surface of the dielectric member exposed to the inside of the processing chamber may be extended discontinuously or continuously while forming a circle or a polygon.

Further, the one or more dielectric member may be plural in number, and at least two dielectric members may be spaced apart from each other, and the surface wave propagating section may be positioned between the two dielectric members. Furthermore, the plasma processing apparatus may comprise a groove or a protrusion installed at the inner wall of the processing chamber, and a plurality of the dielectric members may be surrounded by the groove or the protrusion.

Further, a surface of the surface wave propagating section may be covered with a protective film having a thin thickness so as not to substantially affect the propagation of the electromagnetic wave.

Effect of the Invention

In accordance with the present invention, since the plasma can be excited by the electromagnetic wave (conductor surface wave) propagated along the surface wave propagating section installed around the dielectric member, the used amount of the dielectric member can be greatly reduced. Furthermore, by reducing the area of the dielectric member exposed to the inside of the processing chamber, damage or etching of the dielectric member due to overheating thereof can be suppressed, and metal contamination from the inner surface of the processing chamber can be avoided. Further, since the decrease of the exposed area of the dielectric member results in an increase of the exposed area of the cover, the gas supply holes can be readily formed in the metal cover. By arranging the gas supply holes in the entire bottom surface of the metal cover, the processing gas can be uniformly supplied onto the entire processing surface of the substrate in a shower plate-like manner. In addition, when a microwave of about 915 MHz is used as an electromagnetic wave having a frequency equal to or less than about 2 GHz, for example, a minimum electron density for obtaining stable plasma having a lower electron temperature can be reduced to about $1/7$ of an electron density in case of using a microwave of 2.45 GHz. Thus, plasma suitable for plasma processes can be obtained under various conditions wider than those of the conventional case, and the wide range of applications of the processing apparatus can be greatly improved. As a result, it becomes possible to perform a plurality of consecutive processes under different processing conditions in a single processing apparatus, so that high-quality products can be manufactured in a short period of time with low cost.

EXPLANATION OF CODE

Figure 1:
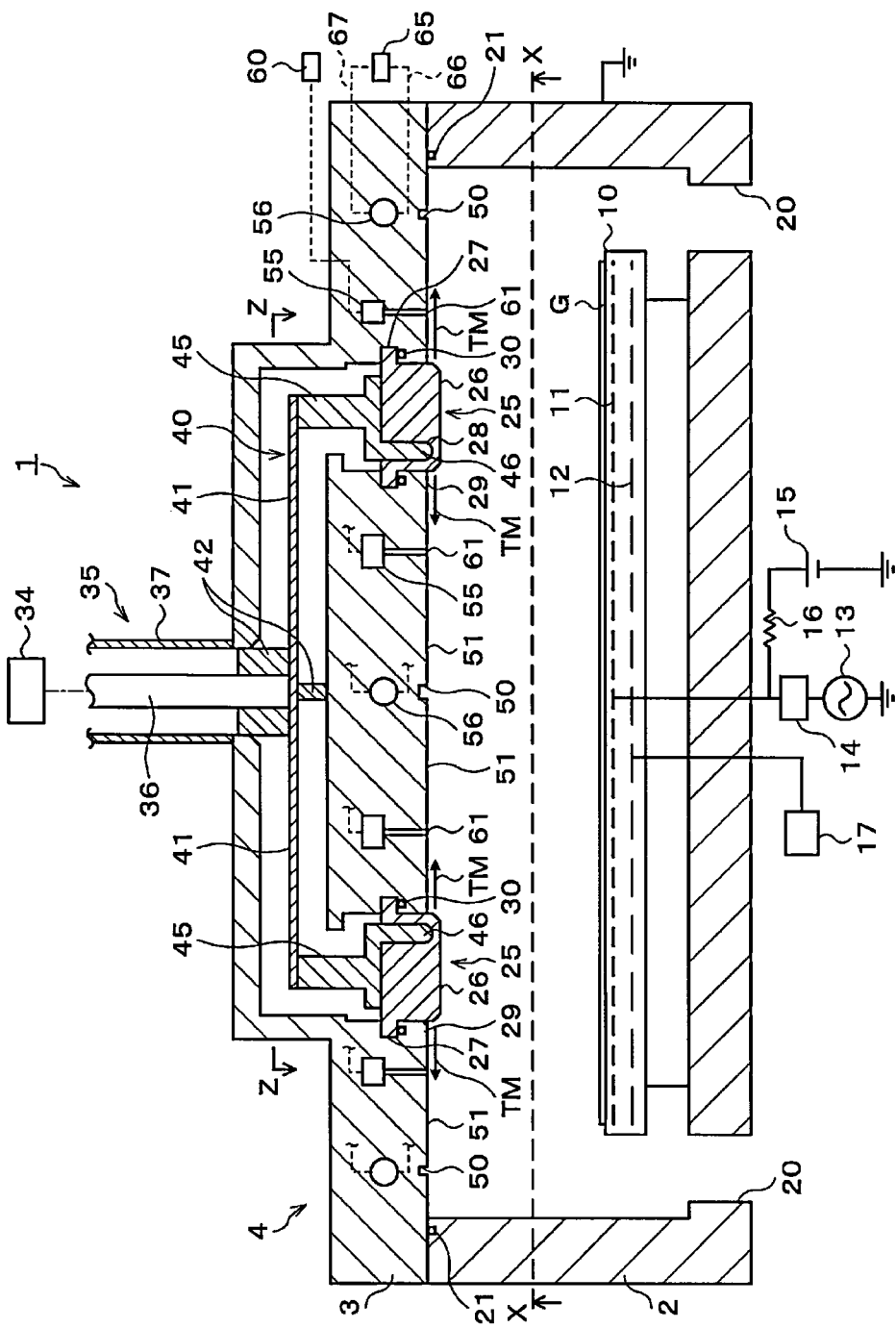
FIG. 1 provides a longitudinal cross section view (taken along a line X-X of FIG. 2) showing a schematic configuration of a plasma processing apparatus in accordance with an embodiment of the present invention.

G: Substrate
1: Plasma processing apparatus
2: Chamber main body
3: Cover
4: Processing chamber
10: Susceptor
11: Power feed unit
12: Heater
20: Gas exhaust port
25: Dielectric member
34: Microwave source
35: Coaxial waveguide
45: Metal rod
50: Grooves
51: Surface wave propagating section
55: Gas pipe
56: Coolant pipe
61: Gas discharge hole

BEST MODE FOR CARRYING OUT THE INVENTION

Hereinafter, an embodiment of the present invention will be described with respect to a plasma processing apparatus 1 configured to perform a CVD process as one example of a plasma process. Further, the embodiment will be described with respect to the plasma processing apparatus 1 using a microwave as an example of an electromagnetic wave.

(Basic Configuration of the Plasma Processing Apparatus 1)

Figure 2:
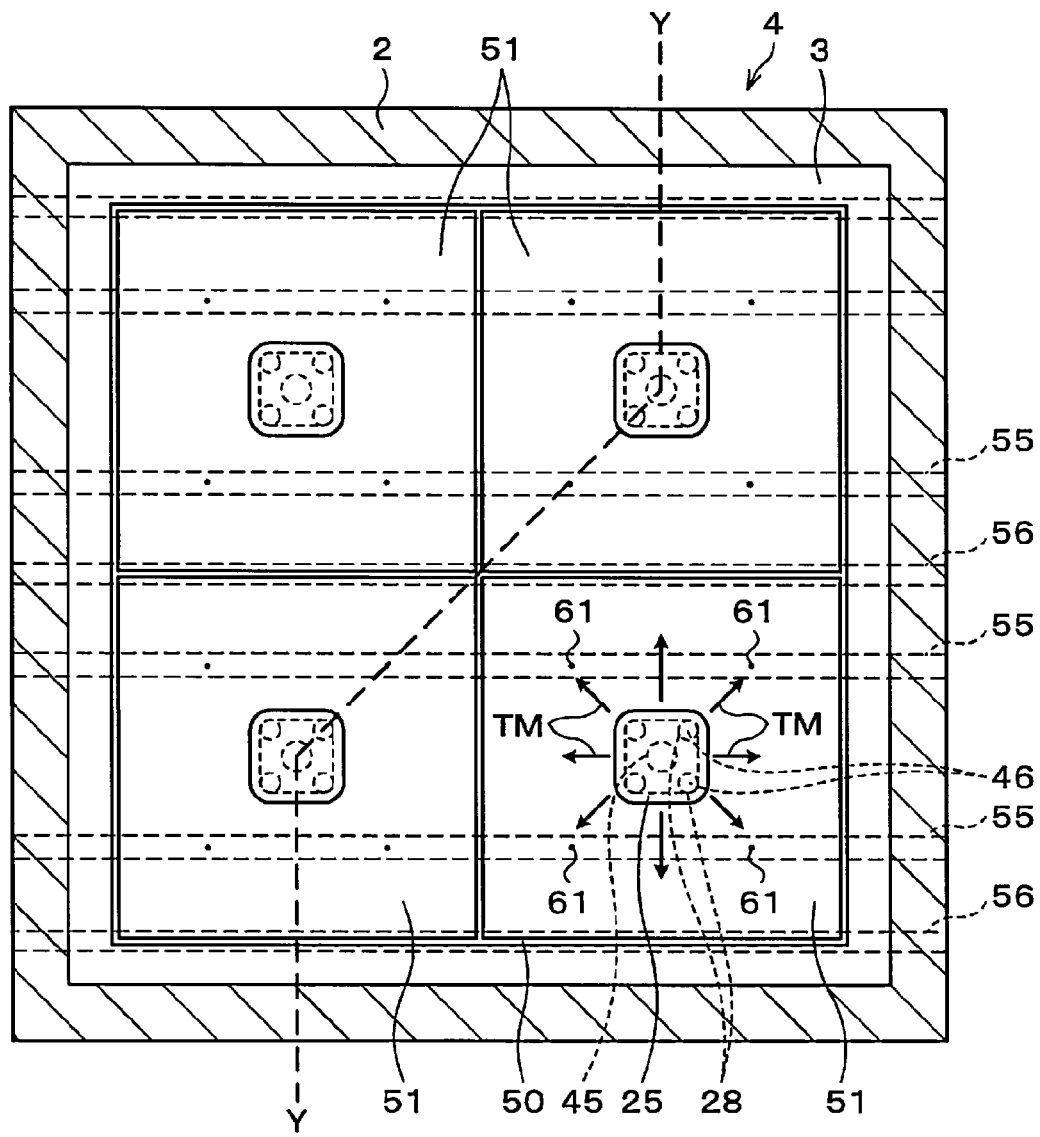
FIG. 2 provides a bottom view (taken along a line X-X of FIG. 1) of a cover.
Figure 3:
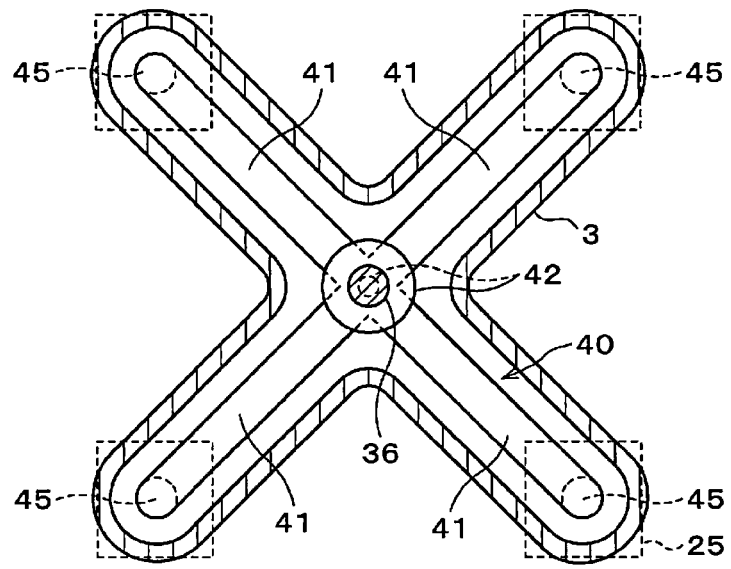
FIG. 3 provides a transversal cross section view of a top part of the cover 3 taken along a line Z-Z of FIG. 1.
Figure 4:
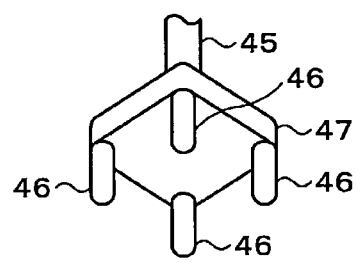
FIG. 4 is a perspective view of an electrode member which propagates a microwave to a dielectric member.
Figure 5:
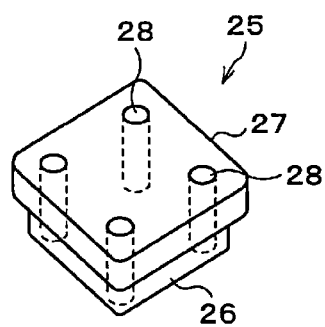
FIG. 5 is a perspective view of a dielectric member.

FIG. 1 is a longitudinal cross section view (taken along a line Y-Y of FIG. 2) illustrating a schematic configuration of the plasma processing apparatus 1 in accordance with the embodiment of the present invention. FIG. 2 is a bottom view (taken along a line X-X of FIG. 1) of a cover 3 included in this plasma processing apparatus 1. FIG. 3 is a transversal cross section view of a top part of the cover 3 taken along a line Z-Z of FIG. 1. FIG. 4 is a perspective view of an electrode member 47 configured to propagate a microwave to a dielectric member 25 and FIG. 5 is a perspective view of the dielectric member 25. Further, like parts having the substantially same function and configuration will be assigned like reference numerals through the whole document, and redundant description will be omitted.

The plasma processing apparatus 1 includes a processing chamber 4 having a cube-shaped chamber main body 2 with an open top and a cover 3 enclosing the top of the chamber main body 2. By enclosing the top of the chamber main body 2 with the cover 3, a sealed space is formed within the processing chamber 4. The entire processing chamber 4 (including the chamber main body 2 and the cover 3) is made of a conductive material, e.g., an aluminum alloy and is electrically grounded.

A susceptor 10 serving as a mounting table for mounting a substrate, e.g., a glass substrate (hereinafter, simply referred to as a "substrate") G is installed in the processing chamber 4. The susceptor 10 is made of, e.g., aluminum nitride, and incorporates therein a power feed unit for electrostatically attracting and holding the substrate G and applying a preset bias voltage to the inside of the processing chamber 4 and a heater 12 for heating the substrate G to a preset temperature. A high frequency power supply 13 for bias application installed outside the processing chamber 4 is connected to the power feed unit 11 via a matching unit 14 including a capacitor or the like, and a high voltage DC power supply 15 for electrostatic attraction is also connected to the power feed unit 11 via a coil 16. The heater 12 is also connected to an AC power supply 17 installed outside the processing chamber 4.

Installed in a bottom portion of the processing chamber 4 is a gas exhaust port 20 that exhaust the atmosphere within the processing chamber 4 by using a gas exhaust device (not shown) such as a vacuum pump installed outside the processing chamber 4. As illustrated, when the top of the chamber main body 2 is covered by the cover 3, air-tightness of the inside of the processing chamber 4 is kept by an O-ring 21 positioned between the bottom surface peripheral portion of the cover 3 and the top surface of the chamber main body 2 and an O-ring 30 positioned between the cover 3 and each dielectric member 25 to be described later.

Four dielectric members 25 made of, e.g., $Al_2O_3$ are installed on the bottom surface of the cover 3 such that their lower parts are exposed to the inside of the processing chamber 4. A dielectric material such as a fluorine resin or quartz may be also used as the dielectric member 25. The dielectric member 25 has a configuration in which a quadrangular plate-shaped flange portion 27 is formed on the top surface of each dielectric plate 26 having a rectangular parallelepiped shape as one body. Holes 28 for accommodating electrode rods 46 inserted therein, as will be described later, are provided at four corner positions of the top surface of the dielectric member 25 (i.e., on the top surface of the flange portion 27).

As for the dielectric member 25, by mounting the flange portion 27 on a stepped portion 29 formed on a lower part of the cover 3, the dielectric member 25 is held on the bottom surface of the cover 3. Further, the O-ring 30 is provided between the bottom surface of the flange portion 27 and the stepped portion 29 as a sealing member between the inside and the outside of the processing chamber 4.

A coaxial waveguide 35 configured to propagate a microwave supplied from a microwave source 34 is connected to the center of the top surface of the cover 3. The coaxial waveguide 35 includes an internal conductor 36 and an external conductor 37. The internal conductor 36 is connected to a branch plate 40 positioned inside the cover 3.

As illustrated in FIG. 3, the branch plate 40 has a configuration in which four branch conductors 41 are arranged crosswise with respect to a connection point with the internal conductor 36 as a center. Each of the coaxial waveguide 35 and the branch plate 40 is made of a conductive member such as Cu. The branch plate 40 is supported in the cover 3 by using dielectric members 42 serving as an impedance matching unit of a transmission line.

A metal rod 45 is installed to a leading end bottom surface of each branch conductor 41. Further, as illustrated in FIG. 4, an electrode member 47 having four electrode rods 46 on its bottom surface is installed at a lower end of each metal rod 45. The four electrode rods 46 on the bottom surface of the electrode member 47 are inserted into the holes 28 provided at four corners of the top surface of the above-described dielectric member 25. The metal rod 45, the electrode rods 46 and the electrode member 47 are formed of a conductive member such as Cu.

A microwave of a frequency less than or equal to about 2 GHz, e.g., about 915 MHz is introduced into a coaxial waveguide 35 from the above-mentioned microwave supply unit 34. Accordingly, the microwave of about 915 MHz is branched by the branch plate 40 and propagated to each dielectric member 25 via the corresponding metal rod 45.

A groove 50 is provided on the bottom surface of the cover 3 and distanced away from each dielectric member 25 at a predetermined distance such that each dielectric member 25 is surrounded. On the bottom surface of the cover 3, areas surrounded by the groove 50 on the bottom surface of the cover 3 serve as surface wave propagating sections 51. In this embodiment, the bottom surface of the cover 3 is divided by the groove 50, so that four surface wave propagating sections are arranged around the respective dielectric members 25. During a plasma process, the microwave transmitted to each dielectric member 25 from the microwave supply unit 34 is propagated along the surface of each surface wave propagating section 51 from the vicinity of each dielectric member 25 exposed on the bottom surface of the cover 3. At this time, the groove 50 functions as a propagation obstacle which obstructs a propagation of the microwave, which has been transmitted along the surface of each surface wave propagating section, to the outside of the surface wave propagating section over the groove 50. A propagation state of a conductor surface wave on the bottom surface of the cover 3 and the groove 50's function as the propagation obstacle in the plasma process will be described later in detail.

Gas pipes 55 for supplying a gas necessary for the plasma process and coolant pipes 56 for supplying a coolant are installed inside the cover 3. The gas supplied from a gas supply source 60 installed outside the processing chamber 4 via the gas pipes 55 are provided into the processing chamber 4 from gas discharge holes 61 opened through the bottom surface of the cover 3.

A coolant supply pipe 66 and a coolant return pipe 67 that circulate the coolant supplied from a coolant supply source 65 installed outside the processing chamber 4 are connected to the coolant pipe 56. As the coolant is supplied and circulated from the coolant supply source 65 into the coolant pipe 56 through the coolant supply pipe 66 and the coolant return pipe 67, the cover 3 is maintained at a preset temperature.

(Plasma Process in the Plasma Processing Apparatus 1)

Formation of, for example, amorphous silicon film on the top surface of a substrate G, which is performed by the plasma processing apparatus 1 having the above-described configuration in accordance with the embodiment of the present invention, will be explained. First, the substrate G is loaded into the processing chamber 4 and mounted on the susceptor 10. Then, a preset plasma process is performed within the sealed processing chamber 4.

During the plasma process, a gas necessary for the plasma process, for example, a gaseous mixture of an argon gas/a silane gas/a hydrogen gas is supplied into the processing chamber from the gas supply source 60 via the gas pipes 55 and gas the discharge holes 61 and is exhausted from the gas exhaust port 20, and the inside of the processing chamber 4 is set to a predetermined pressure. While the preset gas is supplied into the processing chamber 4 as stated above, the substrate G is heated by the heater 12 to a preset temperature. Further, a microwave of, e.g., about 915 MHz generated from the microwave supply unit 34 is propagated to each dielectric plate 26 through the coaxial waveguide 45, the branch plate 40 and the electrode rods 46. Then, the microwave transmitted through the respective dielectric plates 26 is propagated in a conductor surface wave (TM) mode along the surfaces of the respective surface wave propagating sections 51 from the vicinities of the dielectric members 25 exposed on the bottom surface of the cover 3.

In the plasma processing apparatus 1 in accordance with the present embodiment, since plasma P can be excited by the microwave (conductor surface wave) propagated along the surface wave propagating sections 51 arranged around the dielectric members 25, the use amount of the dielectric member 25 can be reduced. In this case, since the area of the surface wave propagating section 51 can be changed by varying the arrangement of the groove 50, a plasma generation region within the processing chamber 4 can be controlled as desired. For example, by enlarging the area of the surface wave propagating section 51 to be bigger than the substrate size, uniform plasma processing can be performed on the entire top surface (processing surface) of the substrate G.

Furthermore, by reducing the exposed area of the dielectric member 25 exposed to the inside of the processing chamber 4, a damage of the dielectric member 25, a loss of the dielectric member 25 caused by etching performed in the plasma process, or the like can be reduced. In this case, by setting the exposed area of the dielectric member 25 to be equal to or less than about ⅕ of the processing area of the substrate G, the area of a ground electrode facing the plasma can be set to be at least about 1.5 (1.7−⅕) times as large as the surface area of the substrate G. In this configuration, a high frequency voltage supplied from the high frequency power supply 13 can be applied efficiently to a plasma sheath s in the vicinity of the surface of the substrate G without causing metal contamination of the substrate G that might be generated by the sputtering on the bottom surface of the cover 3.

Further, since the exposed area of the cover 3 increases with a decrease of the exposed area of the dielectric member 25, the gas supply holes 61 can be readily formed in the metal cover 3. By arranging the plurality of gas supply holes 61 across the bottom surface of the cover 3, the processing gas can be uniformly supplied to the entire processing surface of the substrate G in a shower plate-like manner. Accordingly, uniform plasma processing can be carried out on the entire processing surface of the substrate G.

(Relationship Between Propagation of the Conductor Surface Wave W and Frequency)

The dielectric constant of the plasma P generated in the processing chamber 4 is expressed as $\epsilon_r'-j\epsilon_r''$. Since there is a loss component, the dielectric constant of the plasma P is expressed as a complex number. A real number part ($\epsilon_r'$) of the dielectric constant of the plasma P is typically smaller than −1. The dielectric constant of the plasma P can be calculated from the following formula (1).

[Eq. 1]

$$\varepsilon_r' = j\varepsilon'' = 1 - \frac{(\omega_{pe}/\omega)}{1 - j(v_c/\omega)}, \varepsilon_r' < -1 \quad (1)$$

Further, when the microwave is incident on the plasma P, its propagation property is shown by the following formula (2).

[Eq. 2]

$$k = k_0 \left(1 - \frac{(\omega_{pe}/\omega)^2}{1 - j(v_c/\omega)}\right)^{1/2} \quad (2)$$

Here, k is a wave number; $k_0$ is a wave number under the vacuum; ω is a microwave angular frequency; $v_c$ is an electron collision frequency; and $\omega_{pe}$ is an electron plasma frequency indicated by the following formula (3).

[Eq. 3]

$$\omega_{pe} = \sqrt{\frac{e^2 n_e}{\varepsilon_0 m_e}} \quad (3)$$

Here, e is an elementary electric charge; $n_e$ is an electron density of the plasma P; $\epsilon_0$ is a dielectric constant under the vacuum; and $m_e$ is an electron mass.

A penetration length δ indicates how far the microwave can reach the inside of the plasma when the microwave is incident on the plasma. Specifically, the penetration length δ is a distance by which the microwave propagates until the electric field strength E of the microwave decreases to about 1/e of the electric field strength $E_0$ at a boundary surface of the plasma P. The penetration length δ can be calculated from the following formula (4).

$$\delta = -1/Im \quad (4)$$

When the electron density $n_e$ is higher than a cutoff density $n_c$ expressed as the following formula (5), the microwave can no more propagate through the plasma, so that the microwave incident on the plasma P is attenuated rapidly.

$$n_c = \epsilon_0 m_e \omega^2/e^2 \quad (5)$$

According to the formula (4), the penetration length δ ranges from several mm to several tens of mm and is shortened as the electron density increases. Further, when the electron density $n_e$ is sufficiently higher than the cutoff density $n_c$, the penetration length δ hardly relies on the frequency.

Meanwhile, the sheath thickness t of the plasma P can be calculated from the following formula (6).

[Eq. 4]

$$t = 0.606\lambda_D \left\{\frac{2eV_P}{k_B T_e}\right\} \quad (6)$$

Here, $V_p$ is plasma potential; $k_B$ is a Boltzmann constant; $T_e$ is an electron temperature; $\lambda_D$ is a debye length expressed by the following formula (7). The debye length $\lambda_D$ shows the rate of decay of the plasma potential.

[Eq. 5]

$$\lambda_D = \sqrt{\frac{\varepsilon_0 k_B T_e}{n_e e^2}} \quad (7)$$

According to the formula (6), the sheath thickness t ranges from several tens of μm to several hundreds of μm. Further, it can be seen that the sheath thickness t is proportional to the debye length $\lambda_D$. Moreover, it is understood from the formula (6) that the debye length $\lambda_D$ decreases as the electron density $n_e$ increases.

⌈Wavelength and Attenuation Amount of Conductor Surface Wave TM⌋

Figure 6:
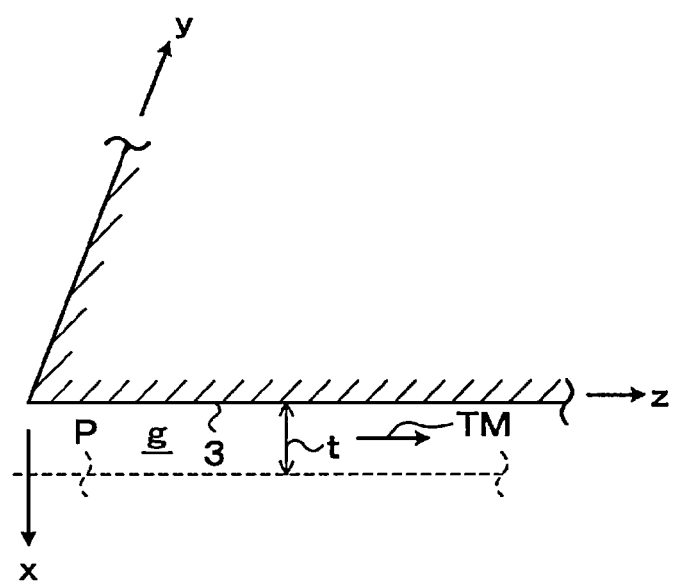
FIG. 6 is a diagram for describing a propagation model of a conductor surface wave.

As illustrated in FIG. 6, as a propagation model of the conductor surface wave TM, propagation of the conductor surface wave TM through an indefinitely large sheath g having a thickness t, which is formed between the bottom surface of the cover 3 (surface propagating section 51) and the plasma P, in a Z direction, will be explained. The dielectric constant $\epsilon_r$ of the sheath g is set to be 1 ($\epsilon_r$=1), and the dielectric constant of the plasma P is set to be $\epsilon_r'-j\epsilon_r''$. If an equation satisfied by a magnetic field Hy in a Y direction of FIG. 6 is derived from Maxwell's equations, the following equation is obtained.

[Eq. 6]

$$\frac{\partial^2 H_y}{\partial x^2} + hH_y = 0 \quad (8)$$

Here, h is an eigen value and the inside and outside of sheath are expressed as follows.

[Eq. 7]

$$h^2 = \begin{cases} k_0^2 + \gamma^2 \equiv h_i^2 & 0 < x < t \quad (9) \\ (\varepsilon_r' - j\varepsilon_r'')k_0^2 + \gamma^2 \equiv h_e^2 & x > t \quad (10) \end{cases}$$

Here, γ is a propagation constant; hi is an eigen value in the sheath g; and he is an eigen value in the plasma P. The eigen values hi and he are generally complex numbers.

A general solution of the formula (8) is obtained from a boundary condition that the Z-directional electric field strength on the bottom surface of the cover 3 becomes 0, as follows.

[Eq. 8]

$$H_y = A \cos(h_i x)e^{-\gamma_0} < x < 1 \quad (11)$$

$$H_y = Be^{-jh_e x}e^{-\gamma_t} x > 1 \quad (12)$$

Here, A and B are arbitrary constants.

If the arbitrary constant are cancelled based on a condition that tangent components of a magnetic field and an electric field at a boundary between the sheath g and the plasma P become continuous, the following characteristic equation is derived.

[Eq. 9]

$$(\epsilon_r' - j\epsilon_r'')h_i \tan(h_i t) = jh_e$$

$$h_i^2 - h_e^2 = (1 - \epsilon_r' + j\epsilon_r'')k_0^2 \quad (13)$$

In the characteristic equation (13), the sheath thickness t is obtained from the formula (6) and the dielectric constant $\epsilon_r' - j\epsilon_r''$ of the plasma P is obtained from the formula (1). Accordingly, the eigen values hi and he can be both obtained by calculating the simultaneous equation (13). When there are plural solutions, a solution that allows the magnetic field distribution in the sheath to become a hyperbolic function is selected. Further, the propagation constant γ is obtained from the formula (9).

The propagation constant γ is expressed as γ=α+jβ by using an attenuation constant α and a phase constant β. The electric field strength E of the plasma is calculated from the following formula (14) based on the definition of the propagation constant.

$$E = E_0 \times e^{-j\gamma z} = E_0 e^{-\alpha z} e^{j\beta z} \quad (14)$$

Here, z is a propagation distance of the conductor surface wave TM and $E_0$ is electric field strength when the propagation distance z is 0. Further, $e^{-\alpha z}$ indicates an attenuation effect of the conductor surface wave TM in an exponential function along with its propagation, and $e^{j\beta z}$ indicates a phase rotation of the conductor surface wave TM. Further, since $\beta = 2\pi/\lambda_c$, the wavelength $\lambda_c$ of the conductor surface wave TM is obtained from the phase constant β. Thus, if the propagation constant γ is known, the attenuation amount of the conductor surface wave TM and its wavelength $\lambda_c$ can be calculated. Furthermore, a unit of the attenuation constant α is Np(neper)/m, and there is a relationship as follows between Np/m and dB/m which is a unit of each graph to be described later.

1 Np/m=20/ln(10) dB/m=8.686 dB/m

By using the above-mentioned formulas, the penetration length δ, the sheath thickness t, the wavelength $\lambda_c$ of the conductor surface wave TM were calculated when the microwave frequency was 915 MHz; the electron temperature $T_e$ was 2 eV; the plasma potential $V_p$ was 24 V; and the electron density $n_e$, was $1 \times 10^{11}$ cm$^{-3}$, $4 \times 10^{11}$ cm$^{-3}$ and $1 \times 10^{12}$ cm$^{-3}$, respectively. The result is provided in the following table.

TABLE 1

| Electron density | Penetration Length (δ) | Conductor surface wave wavelength | Sheath thickness |
|---|---|---|---|
| $1 \times 10^{11}$ cm$^{-3}$ | 17.8 mm | 11.7 mm | 0.22 mm |
| $4 \times 10^{11}$ cm$^{-3}$ | 8.5 mm | 23.6 mm | 0.11 mm |
| $1 \times 10^{12}$ cm$^{-3}$ | 5.3 mm | 30.4 mm | 0.07 mm |

The conductor surface wave is cut off and cannot be propagated if the electron density is equal to or less than a certain electron density. This electron density is called a resonance density $n_r$ of the conductor surface wave and becomes twice as large as the cutoff density $n_c$ indicated by the formula (5). Since the cutoff density is proportional to the square of the frequency, the conductor surface wave can be propagated with a lower electron density as its frequency becomes lower.

If the value of the resonance density $n_r$ of the conductor surface wave is calculated, it becomes about $1.5 \times 10^{11}$ cm$^{-3}$ when the frequency is 2.45 GHz. In actual plasma processing conditions, though the electron density in vicinity of the surface may become equal to or less than $1 \times 10^{11}$ cm$^{-3}$, the conductor surface wave does not propagate under such a condition. Meanwhile, when the frequency is 915 MHz, the resonance density $n_r$ becomes about $2.1 \times 10^{10}$ cm$^{-3}$, which is about 1/7 of the resonance density at 2.45 GHz. When the frequency is 915 MHz, the conductor surface wave is still propagated even when the electron density in vicinity of the surface becomes equal to or less than $1 \times 10^{11}$ cm$^{-3}$. Thus, a frequency equal to or lower than 2 GHz needs to be selected to propagate the surface wave in low-density plasma whose electron density in vicinity of the surface is about $1 \times 10^{11}$ cm$^{-3}$.

Meanwhile, in the plasma processing apparatus 1 illustrated in FIG. 1, if the conductor surface wave TM emitted from the dielectric member 25 is propagated to the vicinity of the substrate G along the inner wall (bottom surface of the cover 3 and inner surface of the chamber main body 2) of the processing chamber 4, the plasma P generated within the processing chamber 4 becomes non-uniform, resulting in problems such as deterioration of the process uniformity, degradation of a gate valve opened or closed when the substrate G is loaded or unloaded in the processing chamber 4 or deterioration of the susceptor 10 for mounting the substrate G. In case that the conductor surface wave TM is not sufficiently attenuated during the propagation between the dielectric member 25 and the substrate G (when the attenuation amount is equal to or lower than about 20 dB), there is required a means for suppressing the propagation of the conductor surface wave TM by reflecting it. Here, a solid line in the graph of FIG. 7 indicates frequency dependency of the attenuation amount of the conductor surface wave TM under a typical condition of a modification example 8 to be described later. In the plasma processing apparatus 1, a typical distance between the dielectric member 25 and the substrate G is about 0.1 m, and if the attenuation amount is about 20 dB when the conductor surface wave TM is propagated by this typical distance, an attenuation amount per 1 m becomes about 200 dB/m. It can be found from FIG. 7 that the frequency at this time is about 1.9 GHz. That is, when the frequency is equal to or lower than about 1.9 GHz, the means for reflecting the conductor surface wave TM is required.

(Necessity of the Groove 50)

As described above, in accordance with the plasma processing apparatus 1 in accordance with the present embodiment, uniform plasma P can be generated by the conductor surface wave TM propagated across the surface wave propagating section 51 from the vicinity of the dielectric member 25 by using the microwave equal to or lower than about 2 GHz. However, if the conductor surface wave TM is propagated up to an improper position, the plasma P generated in the processing chamber 4 may become non-uniform. Further, if the conductor surface wave TM is propagated up to the gate valve or a viewport, an O-ring installed in the vicinity of these components may be burned out due to the conductor surface wave TM's energy or reaction products may be adhered to the surfaces of these components due to plasma generated right next to these components. Thus, in the plasma processing apparatus 1 in accordance with the present embodiment, the vicinity of each dielectric member 25 exposed on the bottom surface of the cover 3 is surrounded by the groove 50 such that the conductor surface wave TM is effectively propagated only within the surface wave propagating sections 51 surrounded by the groove 50. Further, the present inventors optimized the shape of the groove 50 to enhance a propagation suppressing effect.

⌈Aspect Ratio D/W of the Groove 50⌋

Figure 8:
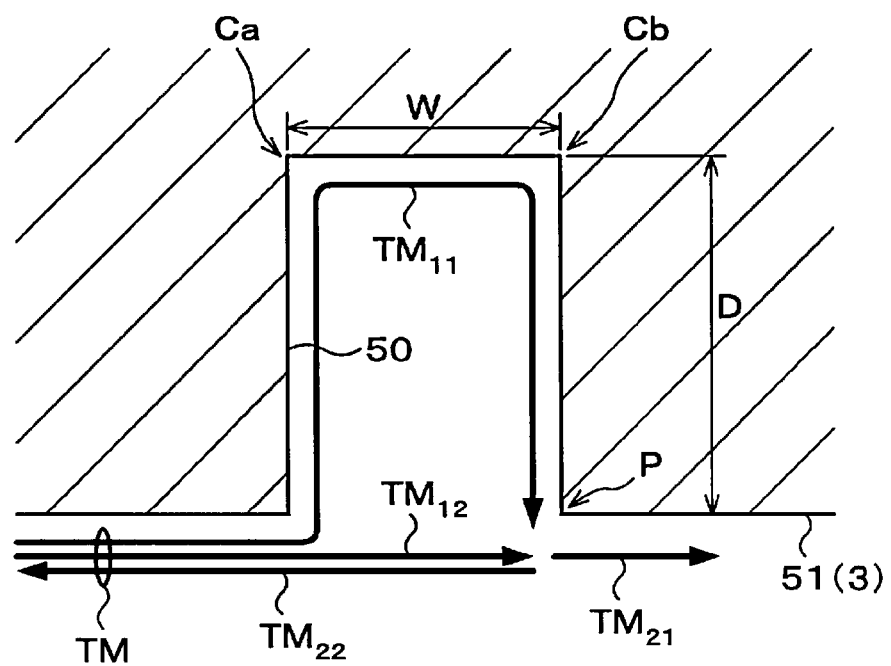
FIG. 8 is a diagram for describing a conductor surface wave propagated in a groove.

To optimize the shape of the groove 50, it is important how to set an electron density used in calculation. The depth of the conductor surface wave entering the plasma is approximately equivalent to the penetration length δ, which ranges from several mm to several tens of mm (see Table 1). An electron density near the plasma surface was measured under various measurement conditions, and it was found to range from about $1 \times 10^{11}$ cm$^{-3}$ to $1 \times 10^{12}$ cm$^{-3}$. Thus, the electron density $n_e$ was set to be in the range of about $1 \times 10^{11}$ cm$^{-3}$ to $1 \times 10^{12}$ cm$^{-3}$. As shown in FIG. 8, the groove 50 having a substantially rectangular cross section was selected. The groove 50 has a width W and a depth D.

In order to derive a suitable value of aspect ratio D/W of the groove, an attenuation amount of the conductor surface wave TM at the groove 50 was calculated by simulation when the electron density $n_e$ was set to be $1 \times 10^{11}$ cm$^{-3}$, $4 \times 10^{11}$ cm$^{-3}$ and $1 \times 10^{12}$ cm$^{-3}$, respectively. At this time, the width W of the groove 50 was set to be about 4 mm. The result is shown in FIG. 9 and will be considered hereinafter with reference to FIG. 10.

As shown in FIG. 8, if the conductor surface wave TM reaches the groove 50, it is split into a conductor surface wave $TM_{11}$ propagated along the bottom surface of the groove and a transmitted wave $TM_{12}$ directly transmitted through the plasma by jumping the groove 50. The conductor surface wave $TM_{11}$ and the transmitted wave $TM_{12}$ join again at an end portion P of the groove 50. At this time, a part of the conductor surface wave is reflected and becomes a reflected wave (conductor surface wave $TM_{22}$), and the rest of the wave is further propagated as a progressive wave (conductor surface wave $TM_{21}$).

At this time, if the conductor surface wave $TM_{11}$ and the transmitted wave $TM_{12}$ have a phase difference of 180 degrees, these two waves are cancelled out at the joining point P and most of them are totally reflected. At this time, no progressive wave (conductor surface wave $TM_{21}$) exists. That is, the conductor surface wave TM is not propagated beyond the groove 50.

Figure 9:
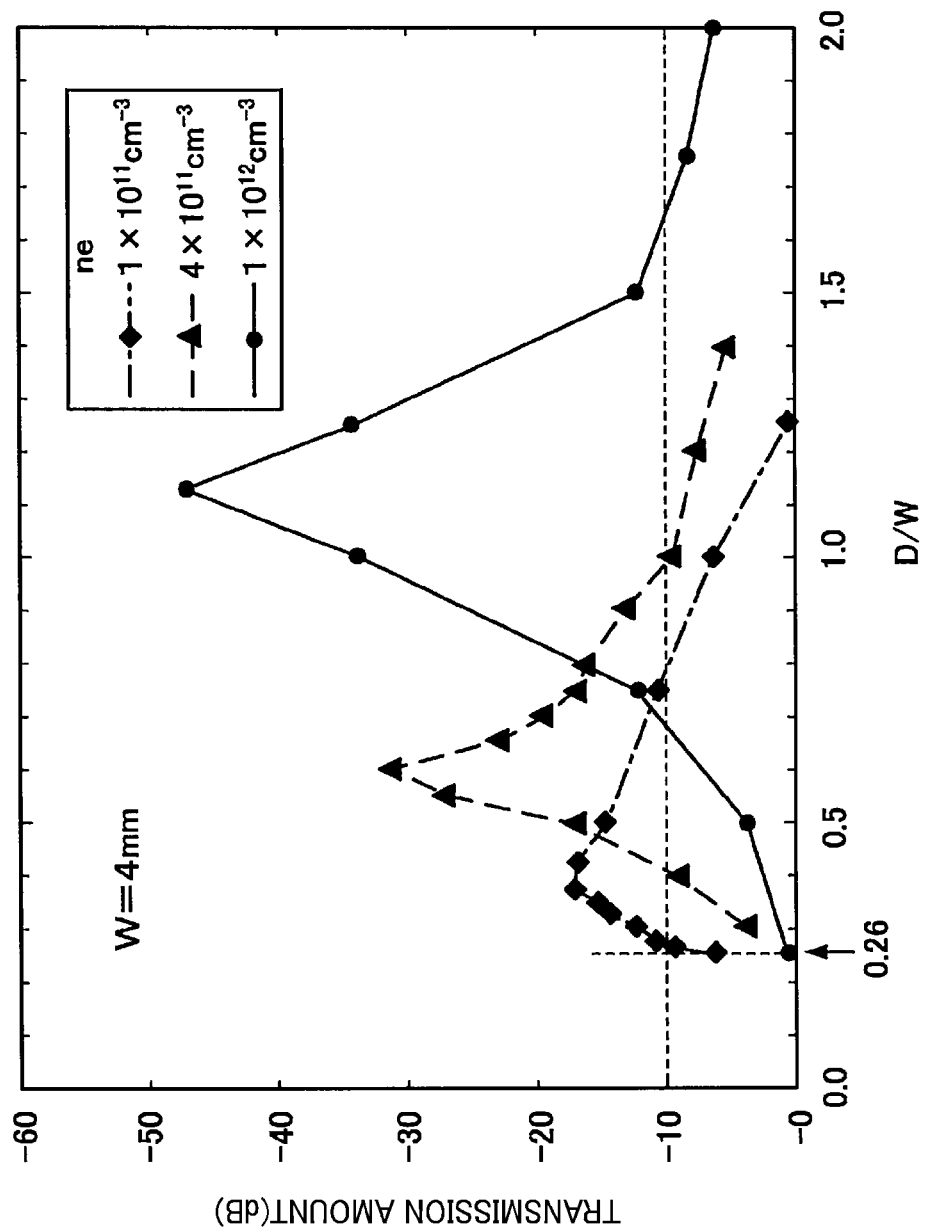
FIG. 9 is a graph showing a relationship between a D/W of a groove and a transmission amount when an electron density is varied.

For example, in FIG. 9, when the transmission amount of the conductor surface wave TM is −10 dB, 90% of the conductor surface wave TM is reflected by the groove 50 and is returned as the reflected wave $TM_{22}$, while only the rest 10% is propagated as the conductor surface wave $TM_{21}$ over the groove 50. That is, in such a case, the groove 50 functions as an obstacle, and 90% of the conductor surface wave is attenuated by the groove 50.

As can be seen from FIG. 9, it is found that as the electron density $n_e$ becomes higher, the aspect ratio D/W allowing a minimum transmission amount is shifted toward a larger value. Further, in all of the cases where the electron density $n_e$ is $1 \times 10^{11}$ cm$^{-3}$, $4 \times 10^{11}$ cm$^{-3}$ and $1 \times 10^{12}$ cm$^{-3}$, the aspect ratio D/W capable of reflecting 90% of the conductor surface wave TM at the groove 50 is about 0.26. If 90% of the conductor surface wave TM is reflected from the groove 50, the groove 50 is deemed to perform a function of sufficiently suppressing propagation of the conductor surface wave TM. Accordingly, the present inventors have set the value of 0.26 as a lower limit of the aspect ratio D/W because 90% of the conductor surface wave TM is reflected under all the different electron density conditions.

Figure 10:
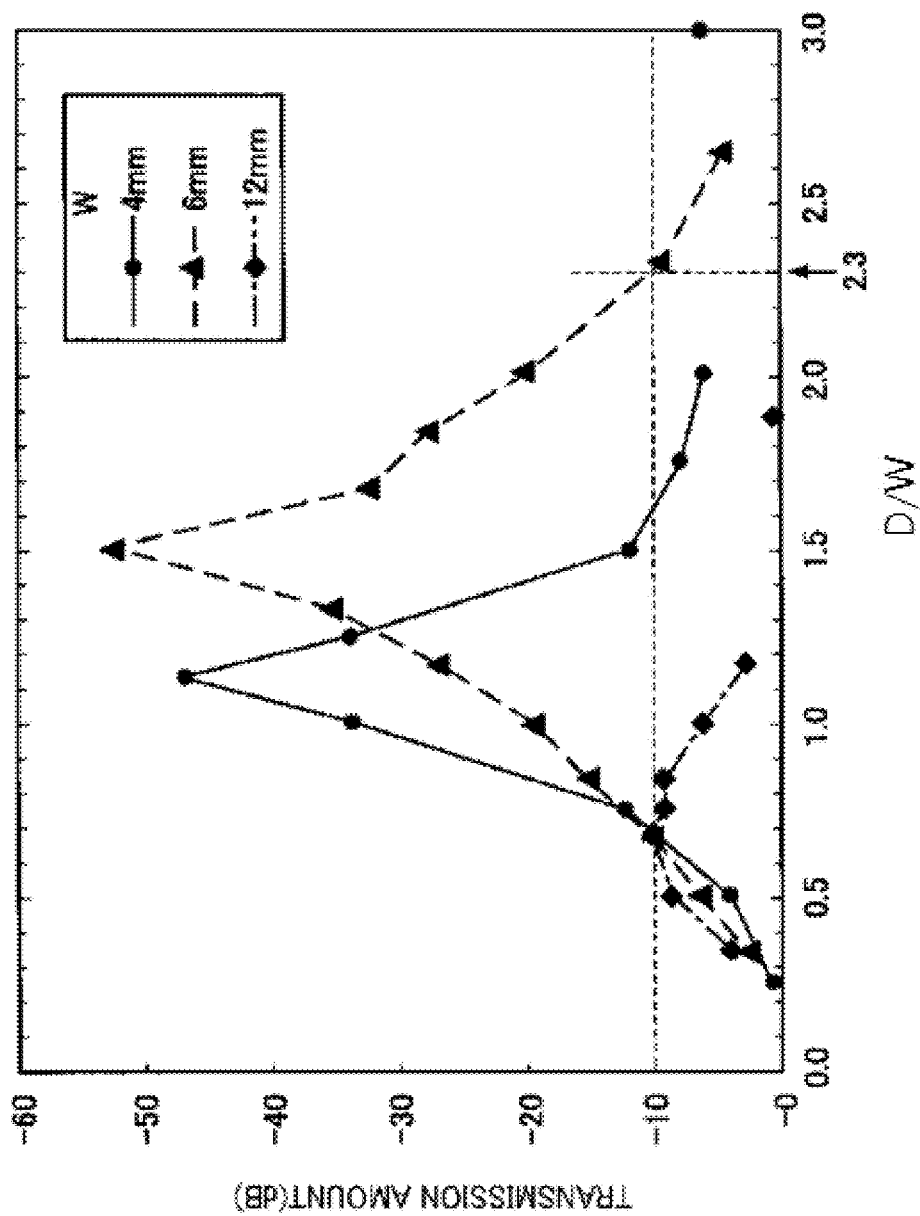
FIG. 10 is a graph showing a relationship between a D/W of a groove and a transmission amount when a groove width is varied.

Now, a transmission amount of the conductor surface wave TM with respect to an aspect ratio D/W was calculated when the width W of the groove 50 was set to be about 4 mm, 6 mm and 12 mm, respectively, and the calculated result is provided in FIG. 10. Here, the electron density $n_e$ was set to be about $1 \times 10^{12}$ cm$^{-3}$. As stated above, as the electron density $n_e$ increases, the aspect ratio D/W allowing the minimum transmission amount is shifted to a larger value. Accordingly, by setting a highest electron density $n_e$ of the conductor surface wave TM in the simulation, the upper limit of the aspect ratio D/W can be calculated.

When the width W of the groove is varied, the aspect ratio D/W allowing the minimum transmission amount is maximum when the width is about 6 mm (W=6 mm). At this time, an aspect ratio D/W at which 90% of the conductor surface wave W is reflected from the grove 50 can be found to be about 2.3. From the above considerations, the present inventors reached a conclusion that the aspect ratio D/W of the groove 50 needs to satisfy a condition of 0.26≤D/W≤2.3 to suppress the propagation of the conductor surface wave TM.

(Width of the Groove 50)

Figure 11A:
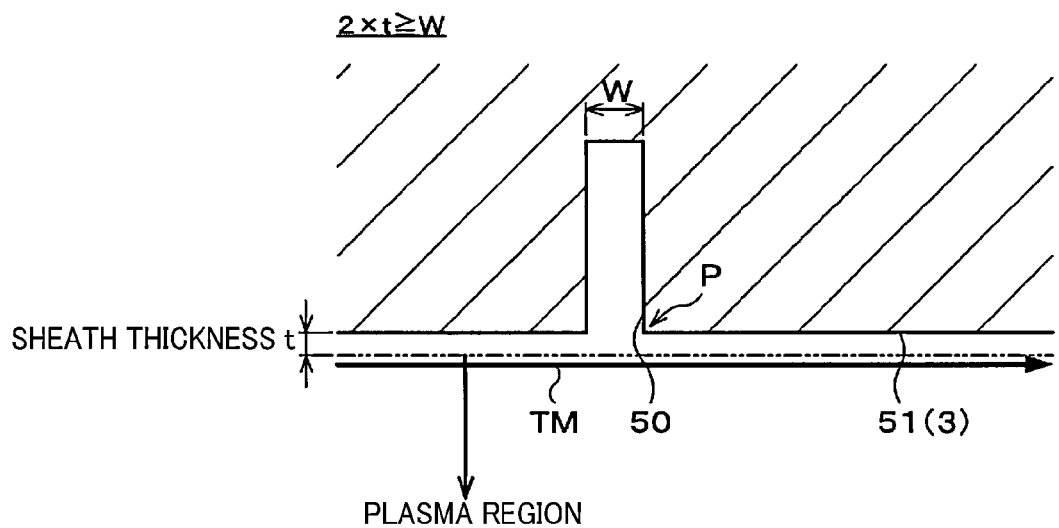
FIGS. 11A and 11B are diagrams for describing a relationship between a groove width and a sheath thickness.

The present inventors paid attention to the relationship between the width W of the groove 50 and the sheath thickness t and between the width W of the groove 50 and the penetration length δ, and the following consideration have been made for an optimal value of the width W of the groove 50. As shown in FIG. 11A, when the width W of the groove 50 is equal to or less than twice the sheath thickness t (2t≥W), the entire inner space of the groove 50 becomes a sheath region. As a result, a level difference is not generated between sheath thicknesses t at a portion where the groove is present and a portion where it is not present. Accordingly, even in case the groove 50 is provided, it is the same as when the groove 50 is not present for the conductor surface wave TM. Accordingly, under the condition of 2t≥W, the groove 50 does not perform the propagation suppressing function.

Figure 11B:
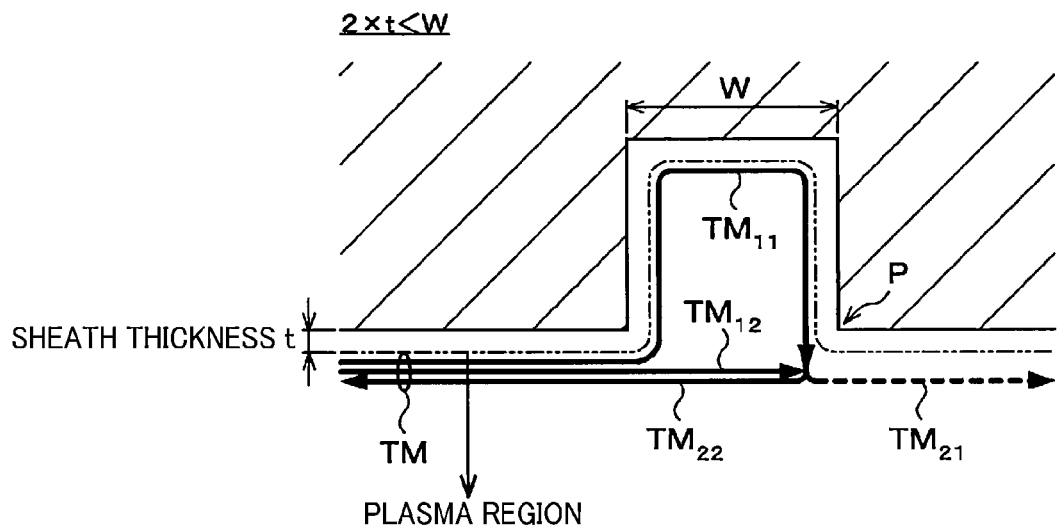

Meanwhile, as illustrated in FIG. 11B, when the width W of the groove 50 is larger than twice the sheath thickness t (2t<W), a sheath region generated along the bottom surface of the groove 50 has a width as small as about 0.1 mm. Thus, by forming the groove 50, a level difference is generated in the sheath region. As a result, the conductor surface wave $TM_{11}$ propagated along the bottom surface of the groove 50 and the conductor surface wave $TM_{12}$ propagated over the groove are reflected at the end portion P of the groove 50. Accordingly, a part of the conductor surface wave TM becomes a reflected wave (conductor surface wave $TM_{22}$), and only the rest conductor surface wave $TM_{21}$ is propagated over the groove 50. In view of the foregoing, the present inventors have found that the width W of the groove 50 needs to be larger than twice the sheath thickness t (2t<W) to allow the groove 50 to have the propagation suppressing function for the conductor surface wave TM.

Then, the inventors directed their attention to the relationship between the width W of the groove 50 and the penetration length δ as another method for optimizing the width W of the groove 50. As stated above, the penetration length δ indicates the depth of the microwave introduced into the plasma P.

Figure 12A:
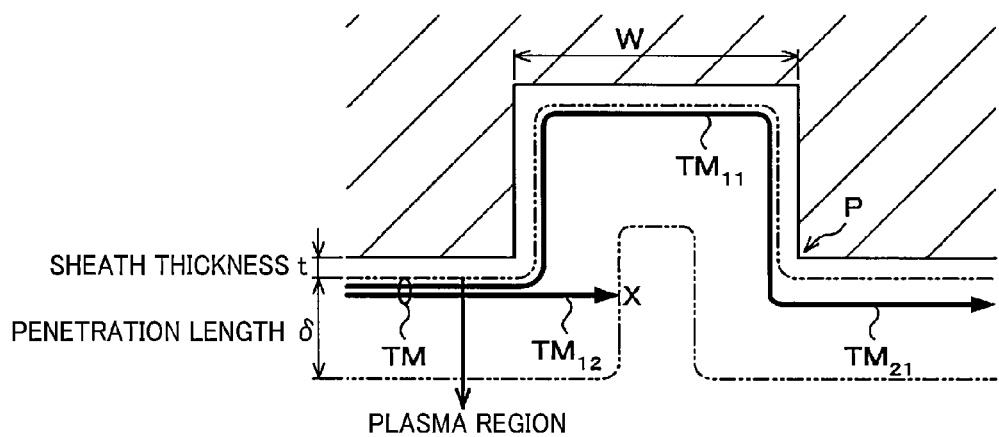
FIGS. 12A and 12B are diagrams for describing a relationship between a groove width and a penetration length.

The conductor surface wave TM cannot enter the inside of the plasma deeper than the penetration length δ from the boundary surface of the plasma P. Accordingly, when the width W of the groove 50 is larger than twice the penetration length δ (2δ≤W), the transmitted wave $TM_{12}$ cannot enter the inside of the plasma deeper than the penetration length δ and cannot be propagated over the groove 50, as illustrated in FIG. 12A. Therefore, even if a groove 50 having a width W equal to or larger than twice the penetration length δ is provided, reflection of the conductor surface wave W effective to suppress its propagation does not occur at the end portion P of the groove 50, but the conductor surface wave TM is propagated forward beyond the groove 50.

Figure 12B:
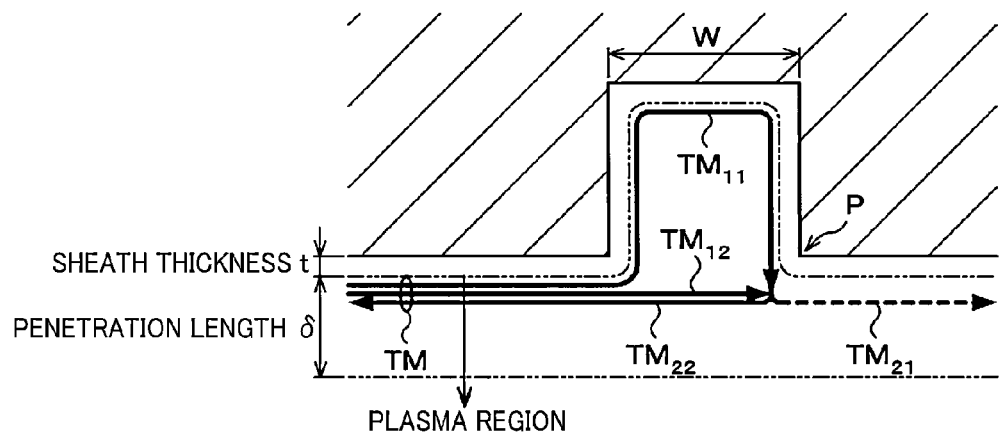

Meanwhile, as illustrated in FIG. 12B, when the width W of the groove 50 is smaller than twice the penetration length δ (2δ>W), a region where the transmitted wave $TM_{12}$ cannot propagate is not generated. As a result, the conductor surface wave $TM_{11}$ propagated along the bottom surface of the groove 50 and the conductor surface wave $TM_{12}$ propagated over the groove are reflected at the end portion P of the groove 50. Accordingly, a part of the conductor surface wave TM becomes a reflected wave (conductor surface wave $TM_{22}$), and only the rest conductor surface wave $TM_{21}$ is propagated over the groove 50. From the above considerations, the present inventors have proved that the width W of the groove 50 needs to be equal to or smaller than twice the penetration length (2δ>W) to allow the groove 50 to have the propagation suppressing function for the conductor surface wave TM.

Referring back to FIG. 10, the electron density $n_e$ is about $1 \times 10^{12}$ cm$^{-3}$ and the penetration length δ is about 5.3 mm at this time. When the width W of the groove 50 is 4 mm and 6 mm, respectively, the width W of the groove 50 is smaller than twice the penetration length δ. Thus, it can be seen that the transmission amount can be reduced to equal to or less than about −40 dB if the aspect ratio D/W is optimized. Meanwhile, when W=12 mm, since the groove width is larger than twice the penetration length δ, the transmission amount cannot be reduced to equal to or less than about −10 dB even if the aspect ratio D/W is optimized.

⌈Curvature Radius⌋

Since impedance is discontinuous at corner portions (corners Ca and Cb of FIG. 8) or edge portions of a groove, a part of a propagating conductor surface wave is reflected thereat. If the angle of the corner portion or edge portion is rounded, a transmission amount increases because of reduction of impedance discontinuity. Especially, if the curvature radius of the corner portion or edge portion increases so as not to be negligible for the wavelength of the conductor surface wave, the transmission amount increases greatly.

Figure 13:
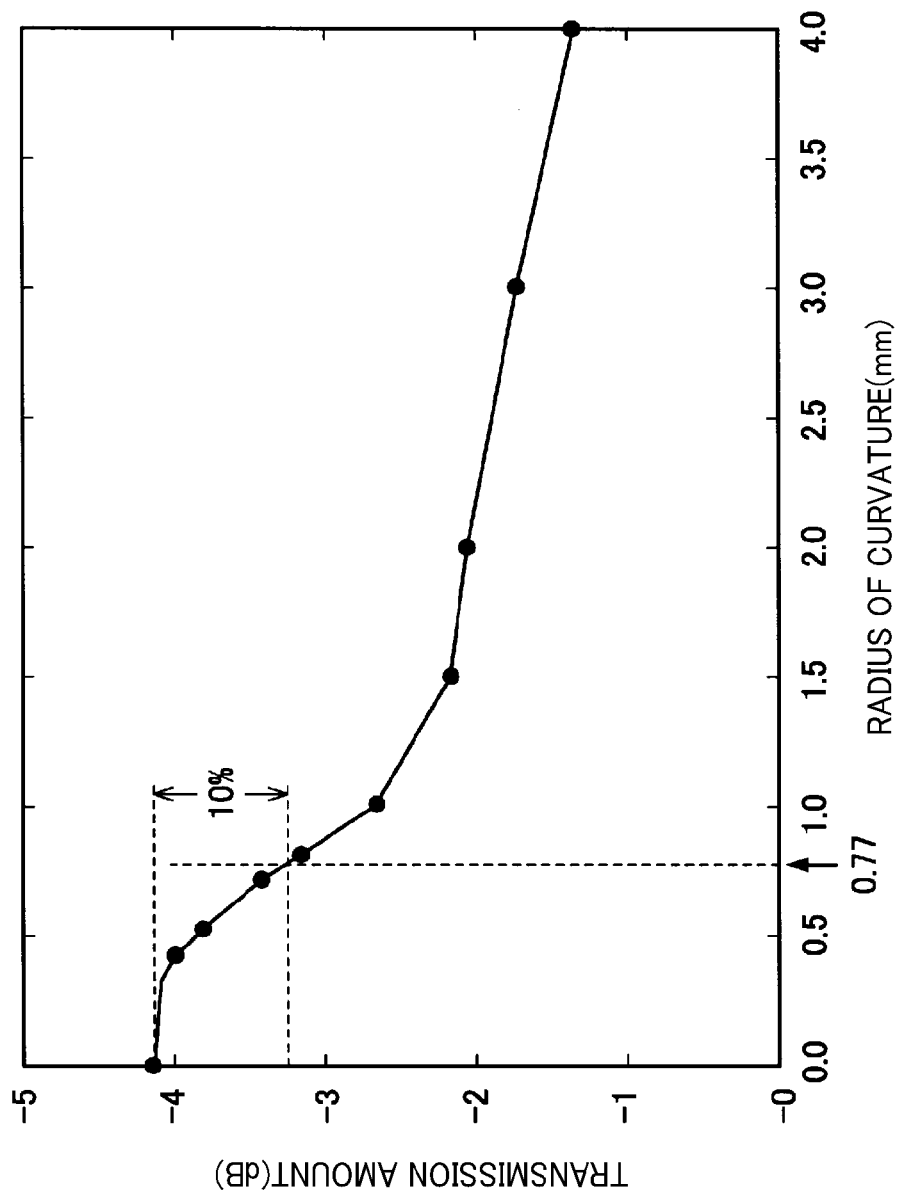
FIG. 13 is a graph showing a relationship between a radius of curvature and a transmission amount.

A transmission amount when the conductor surface wave passes through one corner portion having a curvature radius was calculated by simulation, and the calculated result is provided in FIG. 13. The electron density $n_e$ was set to be about $1 \times 10^{12}$ cm$^{-3}$, and a plasma potential was set to be about 24 V. At this time, the sheath thickness t was about 0.07 mm; the wavelength $\lambda_c$ of the conductor surface wave was about 30.4 mm; and the penetration length δ was about 5.3 mm.

It is found that the transmission amount of the conductor surface wave is smallest when the curvature radius is 0 mm, that is, when the corner portion has a right angle, and increases with the increase of the curvature radius. Given that the groove 50 has a propagation suppressing function if the transmission amount increase does not exceed 10% as compared to the transmission amount when the corner portion has the right angle, a tolerance range of the curvature radius of the corner portion is equal to or less than about 0.77 mm. 0.77 mm is equivalent to about 1/40 (=0.77/30.4) of the wavelength 30.4 mm of the conductor surface wave TM. From the above simulation result and considerations, the inventors have reached a conclusion that the curvature radius of the corner portion of the groove 50 needs to be smaller than about 1/40 of the wavelength λ of the conductor surface wave TM.

⌈Position of the Groove 50⌋

As stated above, plasma P can be generated by the conductor surface wave TM propagated within the entire surface wave propagating section 51 by forming the groove 50. That is, since the plasma P can be generated at the entire bottom surface of the surface wave propagating section 51 surrounded by the groove 50, the region of the plasma P generated within the processing chamber 4 can be controlled by varying the position of the groove 50.

Typically, within the processing chamber 4 of the plasma processing apparatus 1, the plasma P is generated above the substrate G in a region larger than a substrate size, and a uniform plasma process is performed on the entire top surface (processing surface) of the substrate G. Accordingly, it is desirable to provide the groove 50 on the bottom surface of the cover 3 to be located outside the substrate G and to install the surface wave propagating section 51 above the substrate G in the area larger than the substrate size.

Further, the groove 50 may be provided at any position on a metal surface of the inner wall of the processing chamber 4 which is in contact with the plasma during the plasma process. For example, the groove 50 may be formed so as to surround another component such as a gate valve or a viewport. In such a case, problems such as loss of the gate valve or the viewport and adhesion of reaction products can be avoided.

(Relationship Between the Exposed Area of the Dielectric Member 25 and the Surface Area of the Substrate G (1/5))

In a plasma process performed within the processing chamber 4, ion incidence on the surface of the substrate G mounted on the susceptor 10 has an important role. For example, in a plasma film forming process, by performing film formation while allowing ions in the plasma to reach the surface of the substrate G, a high-quality thin film can be rapidly formed even when the temperature of the substrate G is low. Further, in a plasma etching process, a fine pattern can be accurately formed by performing anisotropic etching by vertical incidence of ions on the surface of the substrate G. Thus, as for any kinds of plasma processes, optimizing ion incident energy on the surface of the substrate G for every process is inevitable to carry out the process successfully. The ion incident energy on the surface of the substrate G can be controlled by a high frequency bias voltage applied to the substrate G from the high frequency power supply 13 through the susceptor 10.

Figure 14:
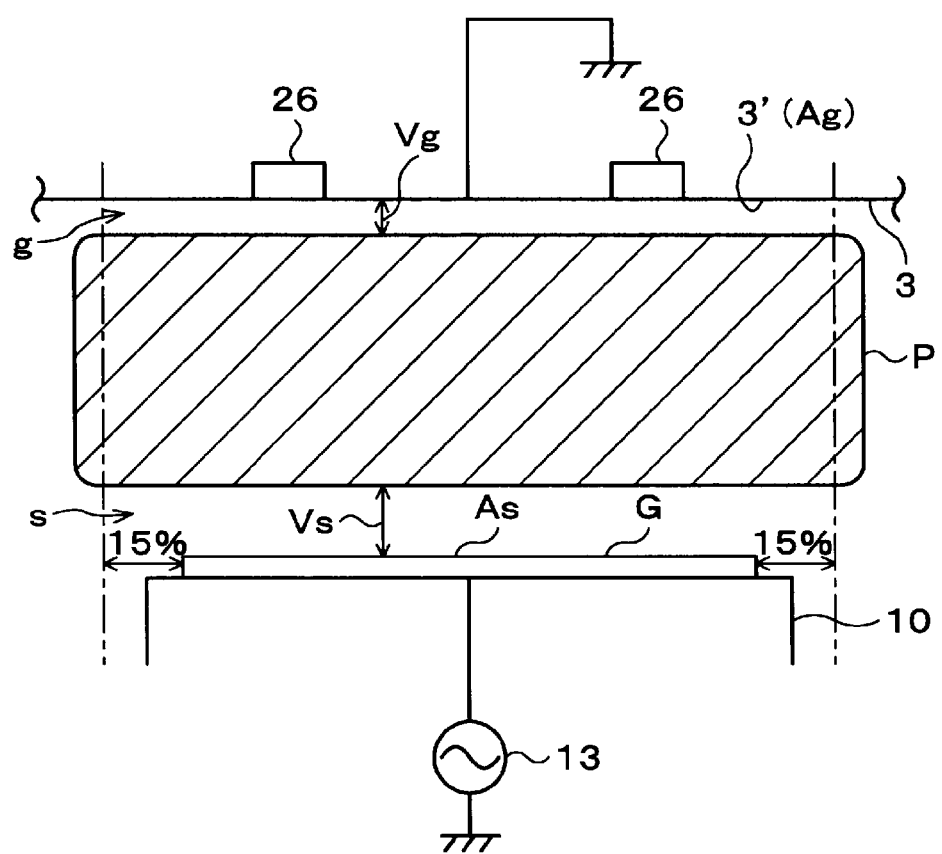
FIG. 14 is a diagram for describing an internal state of a processing chamber which is performing a plasma process.

FIG. 14 illustrates an internal state of the processing chamber 4 in which a high frequency voltage is applied between the susceptor 10 (high frequency voltage application electrode) and the cover 3 (facing electrode=ground electrode) during a plasma process. In the processing chamber 4 of the plasma processing apparatus 1, high-density plasma P is generated above the substrate G in a region larger than the substrate size. In this way, by generating the plasma in the region larger than the substrate size, a uniform plasma process can be carried out on the entire top surface (processing surface) of the substrate G. For example, when a glass substrate having a size of about 2.4 m×2.1 m is processed, a generation region of plasma P is larger than the substrate size by about 15% in one side and about 30% in both sides. Thus, on the bottom surface of the cover 3, an area about 15% larger than the substrate size at one side (about 30% at both sides) becomes a ground electrode 3'.

Meanwhile, as the high frequency bias voltage is applied from the high frequency power supply 13 to the substrate G, plasma sheaths g and s are generated between the plasma P and the top surface (processing surface) of the substrate G and between the plasma P and the ground electrode 3' on the bottom surface of the cover 3 in the processing chamber 4 during a plasma process, respectively. The high frequency bias voltage supplied from the high frequency power supply 13 is divided and the divided voltages are respectively applied to the plasma sheath g and s.

Here, the surface area of the processing surface (top surface) of the substrate G is denoted by As; the area serving as the ground electrode 3' on the cover 3's bottom surface facing the plasma P, Ag; the high frequency voltage applied to the plasma sheath s between the processing surface of the substrate G and the plasma P, Vs; and the high frequency voltage applied to the plasma sheath g between the bottom surface of the cover 3 and the plasma P, Vg. These high frequency voltages Vs and Vg and the areas As and Ag satisfy the following formula (15).

$$(Vs/Vg)=(Ag/As)^4 \quad (15)$$

Brian Chapman, "Glow Discharge Processes," A Wiley Interscience Publication, 1980.

If the high frequency voltages Vs and Vg applied to the plasma sheaths s and g are increased due to the influence of electronic current flowing through the plasma sheaths s and g, DC voltages applied to the plasma sheaths s and g are also increased. Increments of the DC voltages applied to the plasma sheaths s and g are almost equal to the amplitudes (0 to peak values) of the high frequency voltages Vs and Vg. Ions in the plasma P are accelerated by the DC voltages applied to the plasma sheaths s and g and allowed to reach the processing surface of the substrate G and the bottom surface of the cover 3 which serve as electrode surfaces. The ion incident energy can be controlled by using the high frequency voltages Vs and Vg.

In the plasma processing apparatus 1 in accordance with the present embodiment, the high frequency voltage (=Vs+Vg), applied between the processing surface of the substrate G and the bottom surface of the cover 3 by the high frequency power source 13, is divided and the divided high frequency voltages are applied to the plasma sheaths s and g generated in the vicinity of the surface of the substrate G and the bottom surface of the cover 3. At this time, it is desirable to minimize the high frequency voltage applied to the plasma sheath g in the vicinity of the bottom surface of the cover 3 and apply most of the high frequency voltage supplied from the high frequency power supply 13 to the plasma sheath s in the vicinity of the surface of the substrate G. It is because if the high frequency voltage Vg applied to the plasma sheath g in the vicinity of the bottom surface of the cover 3 increases, not only the power efficiency is deteriorated, but ion energy incident on the cover 3 (ground electrode) also increases, so that the bottom surface of the cover 3 is sputtered, resulting in metal contamination. In an actual plasma processing apparatus, no practical usage is allowed unless the high frequency voltage Vg applied to the plasma sheath g in the vicinity of the bottom surface of the cover 3 is equal to or less than about $1/5$ of the high frequency voltage Vs applied to the plasma sheath s in the vicinity of the surface of the substrate G. That is, it can be known from the formula (15) that the area serving as the ground electrode 3' on the cover 3's bottom surface facing the plasma P needs to be at least 1.5 times as large as the surface area of the substrate G.

In a conventional microwave plasma processing apparatus, since most of the bottom surface of the cover 3 facing the substrate G is covered with the dielectric member for transmitting the microwave, the area of the ground electrode in contact with the high-density plasma has been small especially in a plasma processing apparatus which processes a large-size substrate. As described above, in the plasma processing apparatus 1 configured to process the glass substrate of, e.g., about 2.4 m×2.1 m, the high-density plasma P is generated in a region larger than the substrate size by about 15% in one end and by about 30% in both ends, and a portion of the bottom surface of the cover 3 facing the plasma P serves as the ground electrode 3'. If the dielectric member 25 is not exposed to the inside of the processing chamber 4 at this ground electrode 3' portion such that the entire ground electrode 3' portion functions as a ground, the area of the ground electrode 3' facing the plasma P becomes about 1.7 times $((1+0.3)^2)$ as large as the substrate size. In the conventional plasma processing apparatus, however, since most area of the ground electrode 3' is covered with the dielectric member 25, a sufficient ground electrode area cannot be obtained. Thus, in the conventional plasma processing apparatus configured to process the large-size substrate, metal contamination may be generated if a high frequency bias is applied thereto.

Therefore, in the plasma processing apparatus 1 in accordance with the present embodiment, the exposed surface area of the dielectric member 25 is reduced to equal to or less than about $1/5$ of the top surface area of the substrate G in order to minimize the exposed surface area of the dielectric member 25 exposed to the inside of the processing chamber 4 (further, since the plasma P can be generated in the processing chamber 4 by using the conductor surface wave TM propagated along the bottom surface of the cover 3 in the present invention, as will be described later, the plasma P can be effectively generated on the entire bottom surface of the ground electrode 3' even if the exposed area of the dielectric member 25 is reduced). As described above, if the dielectric member 25's exposed surface area in contact with the plasma P is set to be equal to or less than about $1/5$ of the top surface area of the substrate G, the ground electrode 3' facing the plasma P inevitably comes to have an area about 1.5 ($1.7-1/5$) times as large as the surface area of the substrate G. As a result, the high frequency voltage supplied from the high frequency power supply 13 can be efficiently applied to the plasma sheath s in the vicinity of the substrate G without causing metal contamination due to the sputtering of the bottom surface of the cover 3.

(Flatness of the Surface Wave Propagating Section)

If an electron density increases, microwave electric field strength applied to a sheath is also increased. If there exists a minute angled portion at the surface wave propagating section, an electric field is concentrated at the angled portion and the angled portion is overheated, so that an abnormal electric discharge (arc discharge) may be generated. Once the abnormal electric discharge occurs, an electric discharge portion moves around on the metal surface while melting the metal surface, resulting in great damage on the metal surface. If the center line average roughness of the surface wave propagating section 51 is sufficiently smaller than the sheath thickness, the electric field may be uniformly applied to the metal surface even in case that the minute angled portion exists, so that the occurrence of the abnormal electric discharge due to the concentration of the electric field can be prevented.

As for the sheath thickness t described earlier, the sheath thickness t is in inverse proportion to the square root of the electron density. A maximum electron density may be assumed to be about $1×10^{13}$ cm$^{-3}$. At this time, the debye length is about 3.3 μm, and the sheath thickness of, for example, Ar plasma becomes about 12 μm which is about 3.5 times as long as the debye length. If the center line average roughness of the metal surface is set to be equal to or less than about $1/5$ of the sheath thickness, more desirably, equal to or less than about $1/20$, the electric field concentration at the minute angled portion can be neglected. Thus, the center line average roughness of the surface wave propagating section 51 may be set to be equal to or less than about 2.4 μm, more desirably, equal to or less than about 0.6 μm.

MODIFICATION EXAMPLES

Below, other embodiments of the plasma processing apparatus 1 will be explained. Parts identical with those described in the plasma processing apparatus 1 with reference to FIG. 1 and the like will be assigned like reference numerals, and redundant description will be omitted.

First Modification Example

Figure 15:
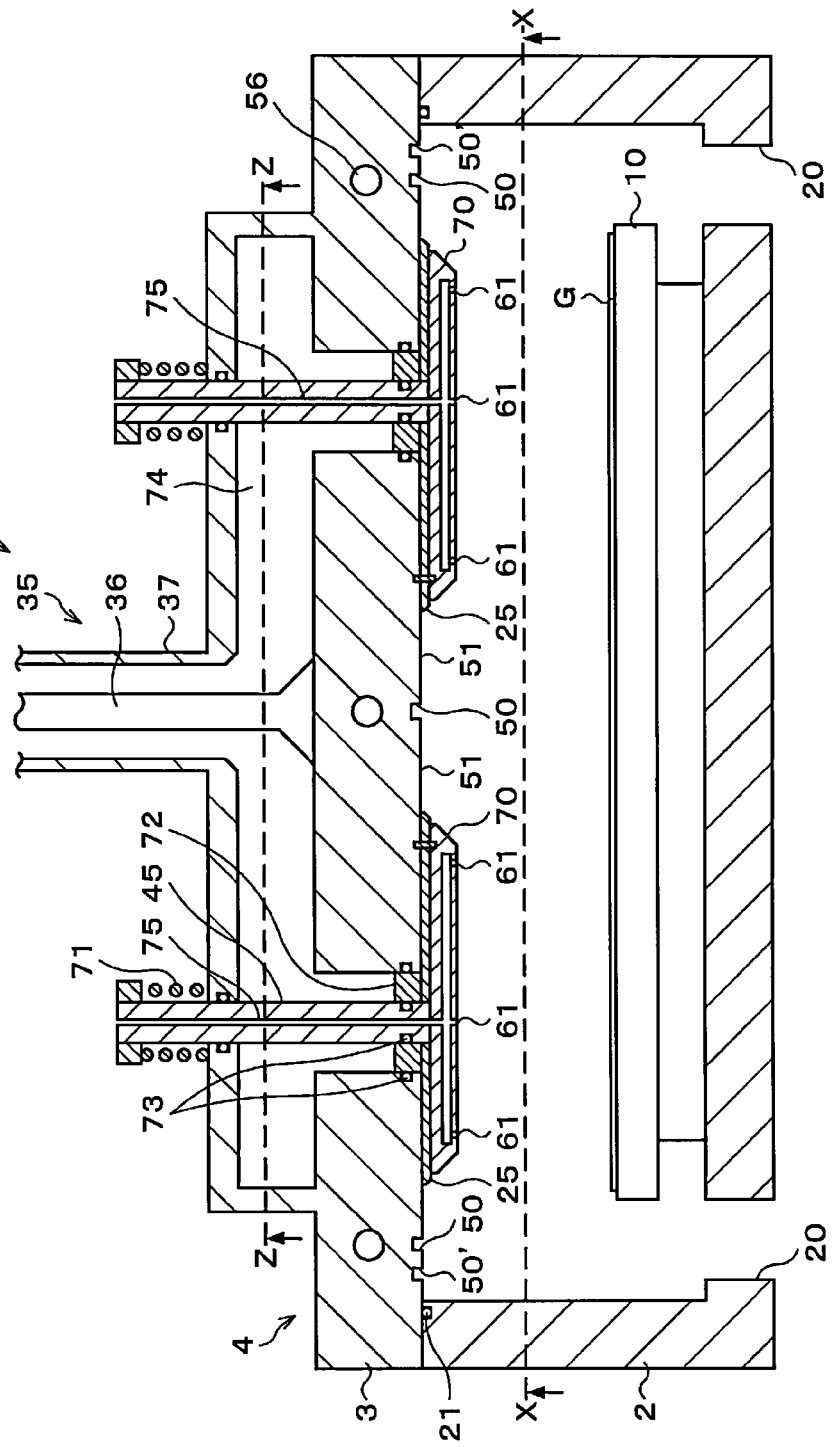
FIG. 15 presents a longitudinal cross section view (taken along a line Y-Y of FIG. 16) showing a schematic configuration of a plasma processing apparatus in accordance with a first modification example.
Figure 16:
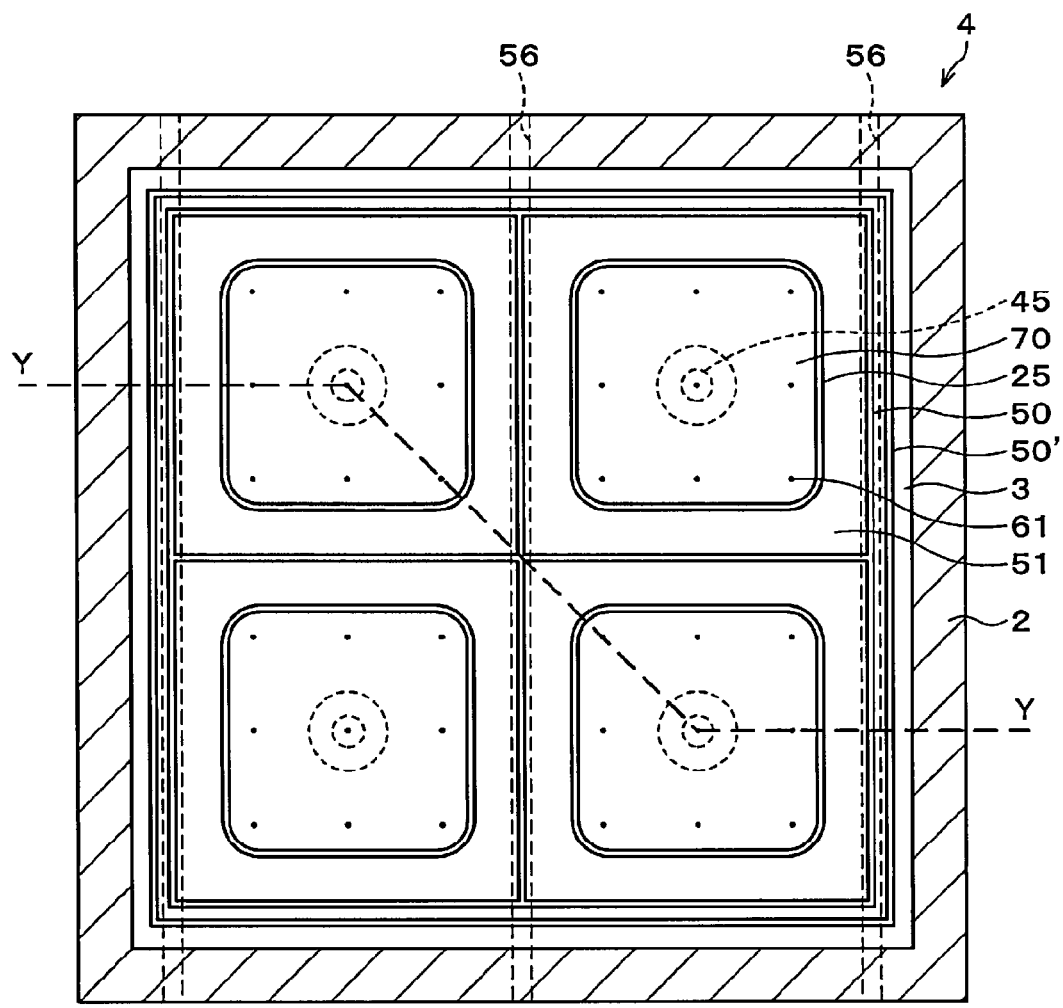
FIG. 16 presents a bottom view (taken along a line X-X of FIG. 15) of a cover included in the plasma processing apparatus in accordance with the first modification example.
Figure 17:
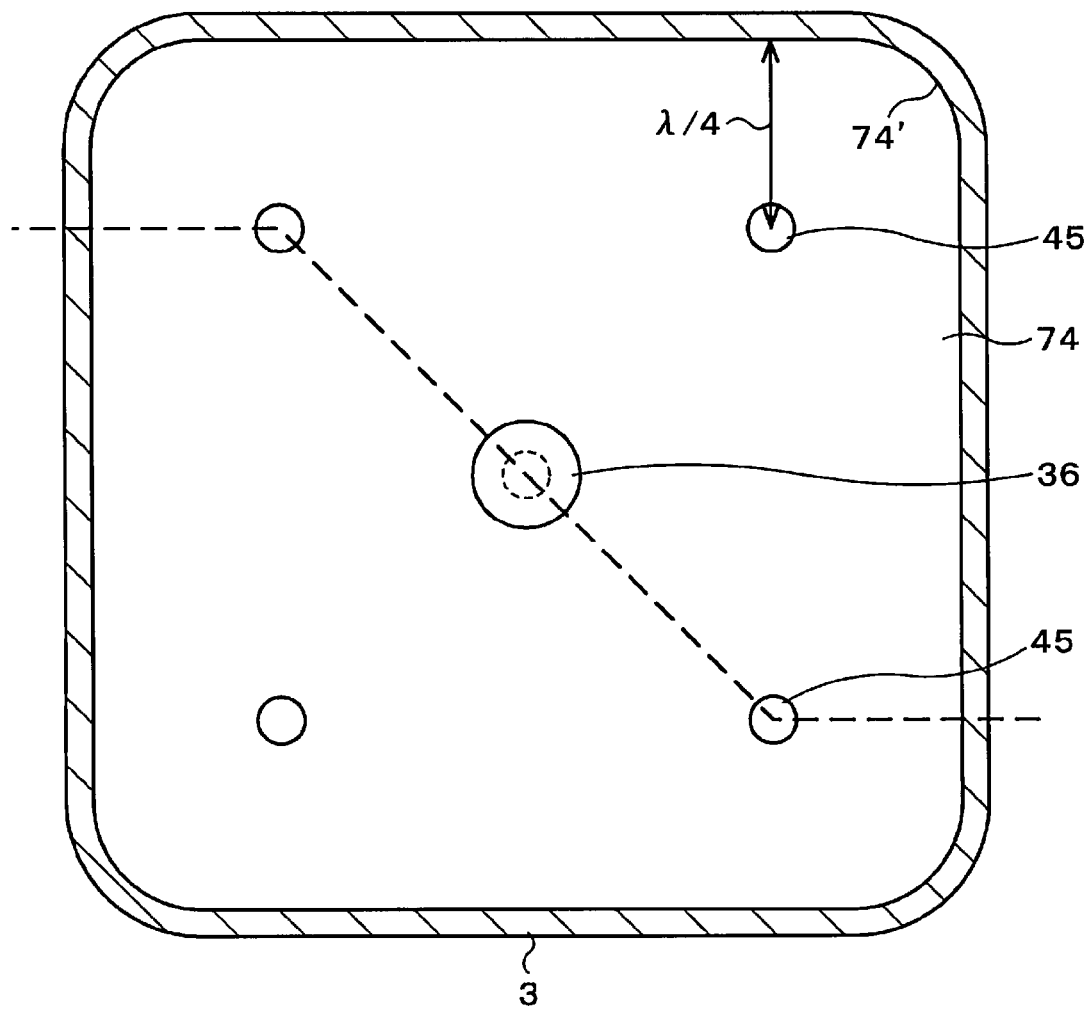
FIG. 17 presents a transversal cross section view of a top part of the cover taken along a line Z-Z of FIG. 15.

FIG. 15 is a longitudinal cross section view of a plasma processing apparatus 1 in accordance with a first modification example (taken along a line Y-Y of FIG. 16). FIG. 16 is a bottom view (taken along a line X-X of FIG. 15) of a cover 3 included in the plasma processing apparatus 1 in accordance with the first modification example. FIG. 17 is a transversal cross section view of a top part of the cover 3 taken along a line Z-Z of FIG. 15.

The plasma processing apparatus 1 in accordance with this first modification example has a configuration in which a plate-shaped metal electrode 70 is installed on a bottom surface of each of four plate-shaped dielectric members 25 made of, for example, $Al_2O_3$. The lower end of a metal rod 45 vertically inserted through the cover 3 and the dielectric member 25 is installed at the center of the metal electrode 70. The upper end of the metal rod 45 is suspended from the top surface of the cover 3 by a spring 71, and the dielectric member 25 mounted on the metal electrode 70 is pressed against the bottom surface of the cover 3 by the force of the spring 71.

Though both the dielectric member 25 and the metal electrode 70 are of substantially quadrangular shapes, the dielectric member 25 is slightly larger than the metal electrode 70. Accordingly, when viewed from the inside of the processing chamber 4, the dielectric member 25 is exposed around the metal electrode 70.

A ring member 72 made of a dielectric material is installed around the metal rod 45, and two O-rings 73 serving as sealing members are installed concentrically around the metal rod 45, between the ring member 72 and the metal rod 45 as well as between the ring member 72 and the cover 3. With this configuration, when the top of a chamber main body 2 is closed by the cover 3 as illustrated, air-tightness of the inside of the processing chamber 4 is maintained by an O-ring 21 positioned between the bottom surface peripheral portion of the cover 3 and the top surface of the chamber main body 2 and the two O-rings 73 positioned between the metal rod 45 and the cover 3.

A coaxial waveguide 35 including an internal conductor 36 and an external conductor 37 is connected to the center of the top surface of the cover 3. The lower end of the internal conductor 36 is positioned at the center of a distribution waveguide 74 formed within the cover 3, and a microwave having a frequency equal to or less than about 2 GHz supplied through the coaxial waveguide 35 is applied to the dielectric member 25 after propagated through the distribution waveguide 74, the metal rod 45 and the metal electrode 70. An end surface 74' of the distribution waveguide 74 formed within the cover 3 (i.e., the inner wall surface of the internal space of the cover 3 in which the distribution waveguide 74 is accommodated) is positioned apart from a central axis of the metal rod 45 at a distance of about $\lambda/4$, and the microwave supplied from the coaxial waveguide 35 is efficiently propagated to the metal rod 45 from the distribution waveguide 74.

Further, in the plasma processing apparatus 1 in accordance with the first modification example, an outer groove 50' is provided further outside of four surface wave propagating sections positioned on the bottom surface of the cover 3. In addition, a plurality of gas discharge holes 61 is formed in the bottom surface of the metal electrode 70, and a gas is supplied into the processing chamber 4 through each gas discharge hole 61 from a gas passage formed through the inside of the metal rod 45.

In the plasma processing apparatus 1 in accordance with the first modification example, plasma P can be excited by propagating a conductor surface wave TM to the surface wave propagating section 51 from the vicinity of the dielectric member 25, and the same function and effect as obtained by the plasma processing apparatus 1 described earlier with reference to FIG. 1 can also be acquired. Further, in this plasma processing apparatus 1 in accordance with the first modification example, plasma P can be excited by propagating the conductor surface wave TM to the bottom surface of the metal electrode 70 from the vicinity of the dielectric member 25. Moreover, in the plasma processing apparatus 1 in accordance with the first modification example, since the outer groove 50' is provided on the bottom surface of the cover 3 further outside of the surface wave propagating section 51, propagation of the conductor surface wave TM to the inner wall of the chamber main body 2 can be prevented more successfully, and a plasma generation region within the processing chamber 4 can be readily controlled. In addition, this apparatus employs the configuration in which the metal rod 45 is suspended by the force of the spring 71 so that the dielectric member 25 mounted on the metal electrode 70 is held in place. Thus, since the dielectric member 25 is not fixed to the cover 3, the metal electrode 70 and the metal rod 45, the dielectric member 25 can be protected from being affected by deformation of such metal members (cover 3, metal electrode 70 and metal rod 45) due to thermal expansion or the like, so that damage of the dielectric member 25 can be prevented.

Second Modification Example

Figure 18:
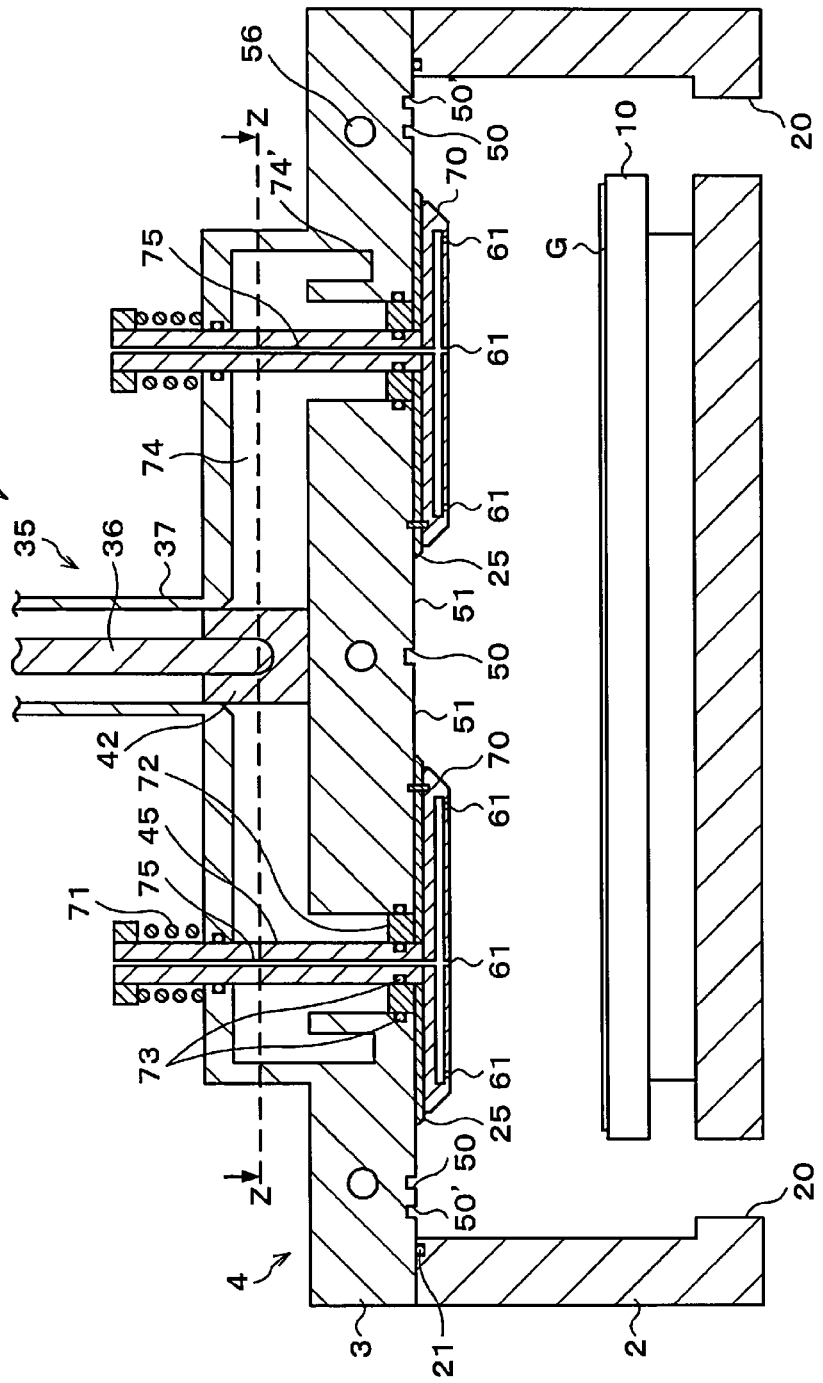
FIG. 18 presents a longitudinal cross section view showing a schematic configuration of a plasma processing apparatus in accordance with a second modification example.
Figure 19:
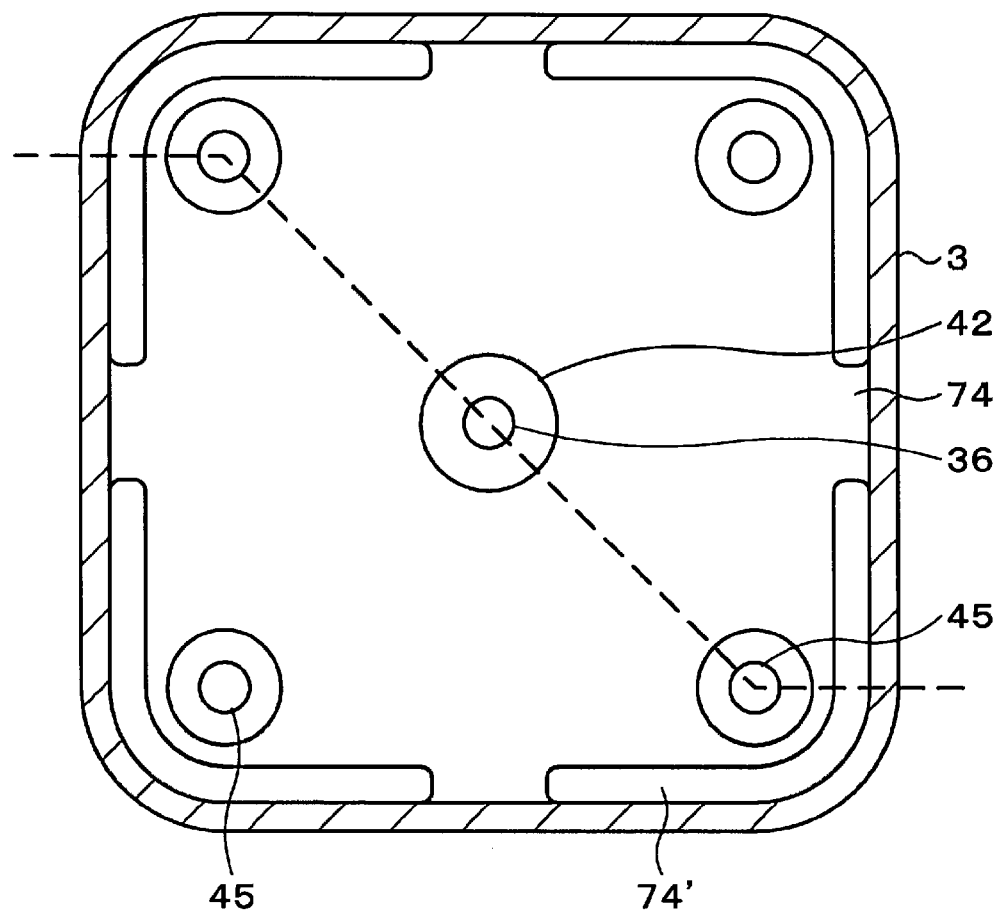
FIG. 19 presents a transversal cross section view of a top part of a cover taken along a line Z-Z of FIG. 18.

FIG. 18 is a longitudinal cross section view illustrating a schematic configuration of a plasma processing apparatus 1 in accordance with a second modification example. FIG. 19 is a transversal cross section view of a top part of a cover 3 taken along a line Z-Z of FIG. 18.

The plasma processing apparatus 1 in accordance with the second modification example basically has the same configuration as that of the plasma processing apparatus 1 in accordance with the first modification example described with reference to FIGS. 15 to 17 excepting that an end surface 74' of a distribution waveguide 74 is formed in a lower position and an internal conductor 36 is connected to the cover 3 via a dielectric member 42 serving as an impedance matching member. The plasma processing apparatus in accordance with this second modification example can also acquire the same function and effect as obtained by the plasma processing apparatus 1 in accordance with the first modification example described earlier with reference to FIGS. 15 to 17. Furthermore, in accordance with the plasma processing apparatus 1 of the second modification example, the distribution waveguide 74 formed inside the cover 3 can be scaled down.

Third Modification Example

Figure 20:
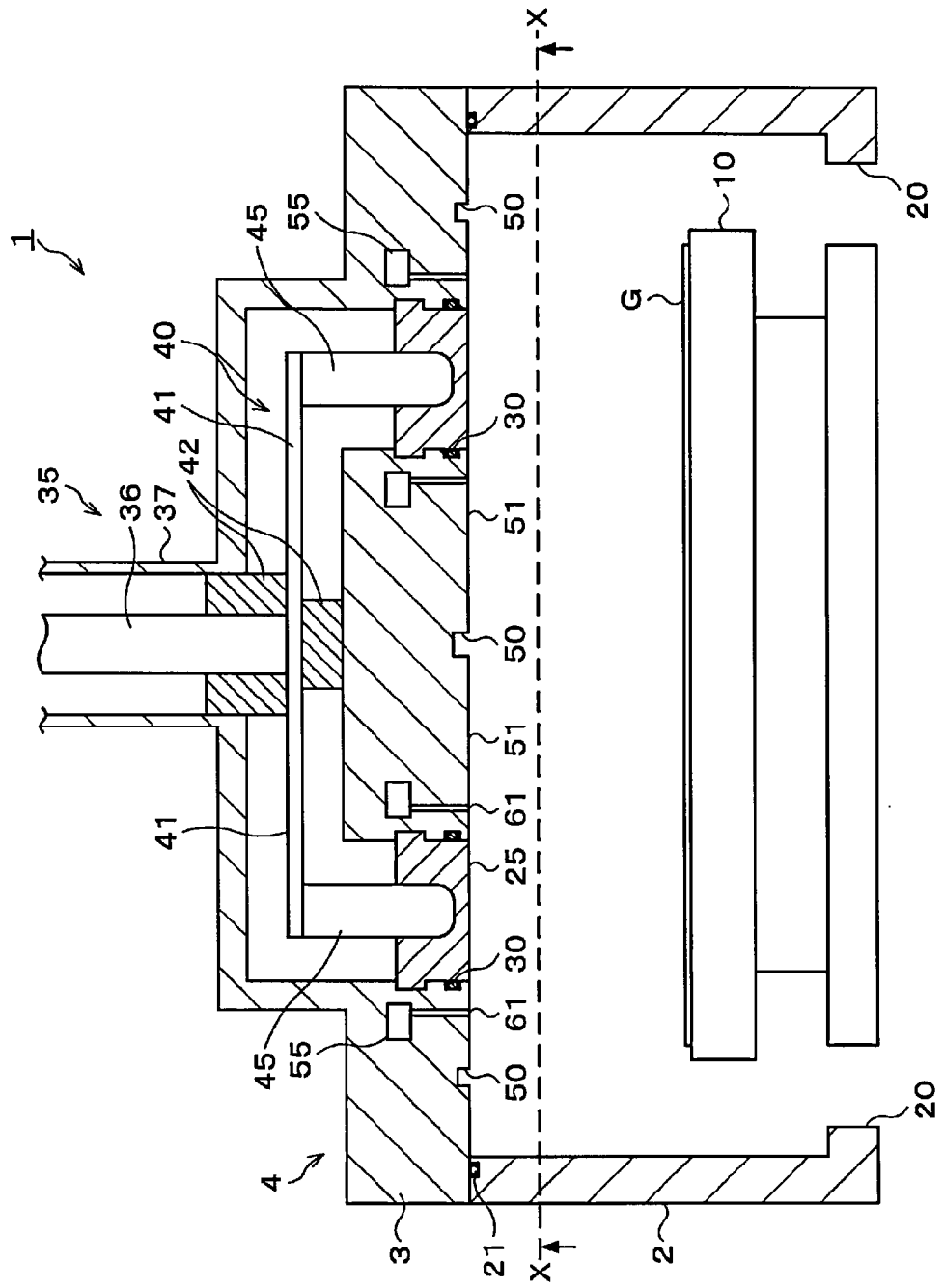
FIG. 20 sets forth a longitudinal cross section view (taken along a line Y-Y of FIG. 21) showing a schematic configuration of a plasma processing apparatus in accordance with a third modification example.
Figure 21:
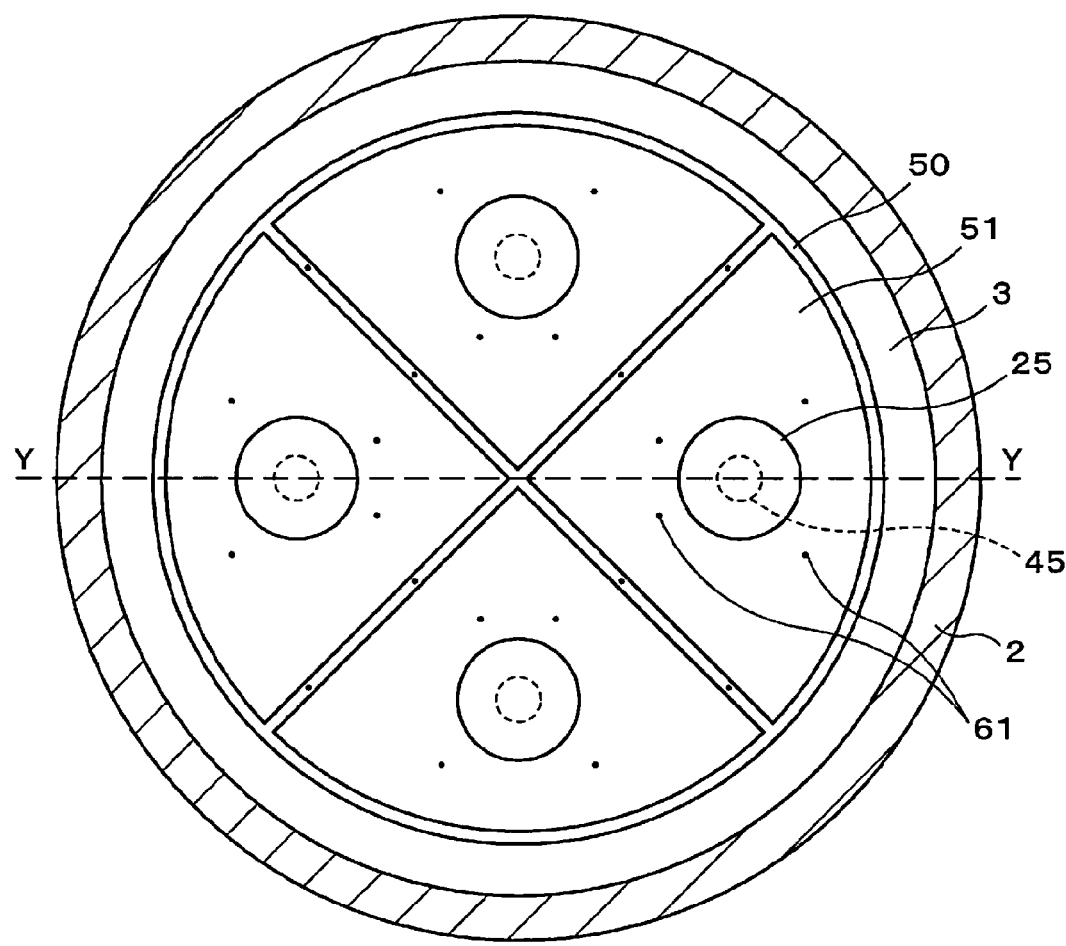
FIG. 21 sets forth a bottom view (taken along a line X-X of FIG. 20) of a cover included in the plasma processing apparatus in accordance with the third modification example.

FIG. 20 is a longitudinal cross section view (taken along a line Y-Y of FIG. 21) illustrating a schematic configuration of a plasma processing apparatus 1 in accordance with a third modification example. FIG. 21 sets forth a bottom view (taken along a line X-X of FIG. 20) of a cover 3 included in the plasma processing apparatus 1 in accordance with the third modification example.

The plasma processing apparatus 1 in accordance with the third modification example has a cylindrical chamber main body 2, and a cylindrical processing space within a processing chamber 4. The cover 3 and a susceptor 10 also have circular shapes. The plasma processing apparatus 1 in accordance with the third modification example is configured to perform plasma process on a disk-shaped substrate G such as a semiconductor wafer. This plasma processing apparatus 1 in accordance with the third modification example is also capable of exciting plasma P by propagating a conductor surface wave TM to a surface wave propagating section 51 from the vicinity of a dielectric member 25, so that the same function and effect as obtained by the plasma processing apparatus 1 described earlier with reference to FIG. 1 can also be attained.

Fourth Modification Example

Figure 22:
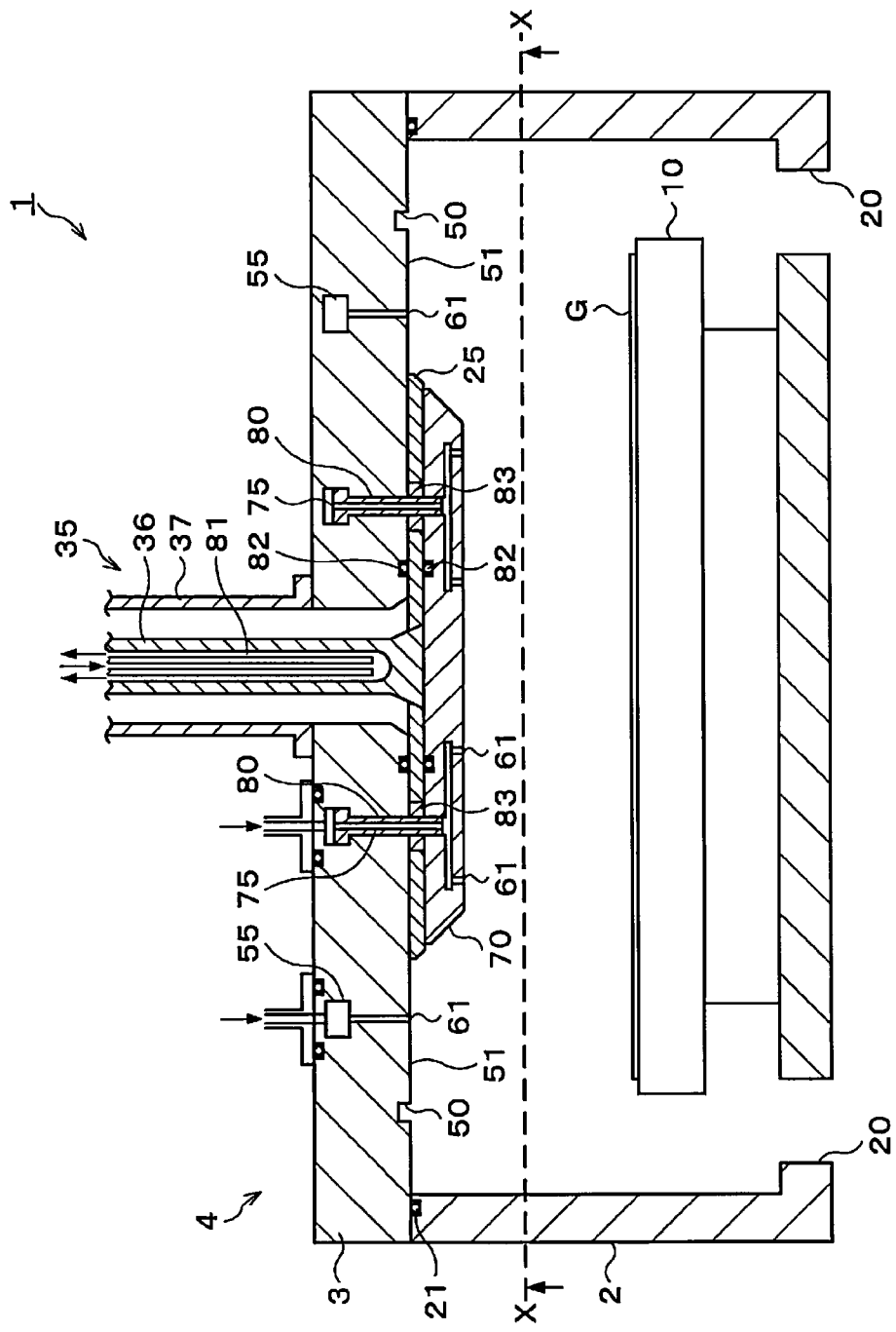
FIG. 22 depicts a longitudinal cross section view (taken along a line Y-Y of FIG. 23) showing a schematic configuration of a plasma processing apparatus in accordance with a fourth modification example.
Figure 23:
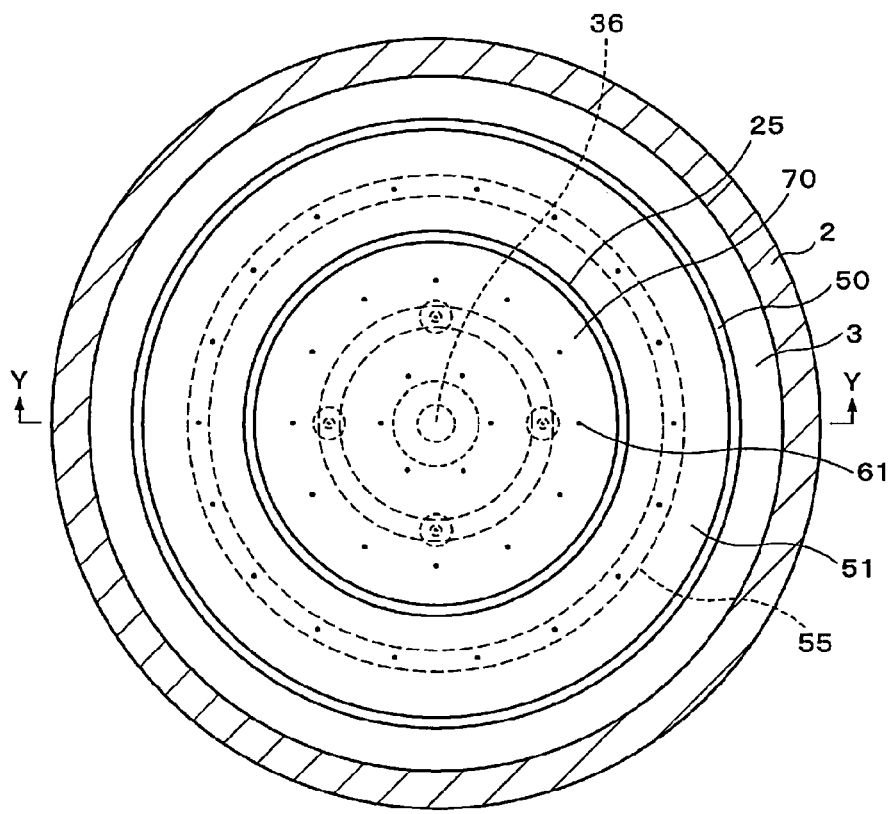
FIG. 23 sets forth a bottom view (taken along a line X-X of FIG. 22) of a cover included in the plasma processing apparatus in accordance with the fourth modification example.

FIG. 22 is a longitudinal cross section view (taken along a line Y-Y of FIG. 23) illustrating a schematic configuration of a plasma processing apparatus 1 in accordance with a fourth modification example. FIG. 23 is a bottom view of a cover 3 included in the plasma processing apparatus 1 in accordance with the fourth modification example.

The plasma processing apparatus 1 in accordance with the fourth modification example also has a cylindrical chamber main body 2 and is configured to perform plasma process on a disk-shaped substrate G such as a semiconductor wafer. The plasma processing apparatus 1 in accordance with the fourth modification example has a configuration in which a plate-shaped metal electrode 70 is installed on the bottom surface of a dielectric member 25. The plasma processing apparatus 1 in accordance with the fourth modification example includes only one dielectric member 25 and only one metal electrode 70. The metal electrode 70 is fixed to the cover 3 by metal bolts 80 used as a connecting member inserted through the dielectric member 25 and ring-shaped metal spacers 83. The metal spacers 83 and the cover 3 as well as the metal spacers 83 and the metal electrode 70 are fastened by the bolts 80. Further, gas discharge holes 61 are provided in the bottom surfaces of both the cover 3 and the metal electrode 70. A gas is supplied to the gas discharge holes 61 in the bottom surface of the metal electrode 70 from gas passages 75 formed through the inside of the bolts 80. Further, a coolant path 81 through which a coolant flows is formed within an internal conductor 36 of a coaxial waveguide 35. Further, two O-rings 82 serving as sealing members are installed between the top surface of the dielectric member 25 and the bottom surface of the cover 3 and between the bottom surface of the dielectric member 25 and the top surface of the metal electrode 70. In this configuration, when the top of the chamber main body 2 is closed by the cover 3 as illustrated, air-tightness of the inside of the processing chamber 4 is kept by an O-ring 21 positioned between the bottom surface peripheral portion of the cover 3 and the top surface of the chamber main body 2 and the two O-rings 82 positioned between the top surface of the dielectric member 25 and the bottom surface of the cover 3 as well as between the bottom surface of the dielectric member 25 and the top surface of the metal electrode 70.

The plasma processing apparatus 1 in accordance with the fourth modification example can also excite plasma P by propagating a conductor surface wave TM to a surface wave propagating section 51 and the bottom surface of the metal electrode 70 from the vicinity of the dielectric member 25. Thus, the same function and effect as obtained by the plasma processing apparatus 1 described earlier with reference to FIG. 1 can also be attained. Further, in the plasma processing apparatus 1 in accordance with the fourth modification example, since heat introduced to the metal electrode 70 from the plasma is transferred to the cover 3 via the highly heat-conductive metal spacers 83 and bolts 80, a temperature increase of the metal electrode 70 can be suppressed. Further, since the gas is supplied from the gas passages 75 provided through the inside of the bolts 80, attachment and detachment of the metal electrode 70 is easier than in case that the gas is supplied from the gas passages 75 provided through the inside of the metal rods 45 as in the second modification example, so that maintenance efficiency improves. Further, a temperature increase of the internal conductor 36 can be prevented. Furthermore, since the processing chamber 4 is vacuum-sealed on a flat surface by two O-rings 82 installed on the top and bottom surfaces of the dielectric member 25, attachment and detachment of the metal electrode 70 is easier than in case that the processing chamber 4 is vacuum-sealed on a curved surface as in the second modification example, so that maintenance efficiency improves.

Further, a concentric circle-shaped groove (not shown) for reflecting the conductor surface wave may be provided on the bottom surface of the metal electrode 70. Since the conductor surface wave propagated from the vicinity of the metal electrode 70 is concentrated at the central portion of the metal electrode 70, plasma density thereat readily increases. However, by providing the concentric circle-shaped groove on the metal electrode 70 as described, the conductor surface wave propagated inside it can be suppressed, so that more uniform plasma can be excited.

Fifth Modification Example

Figure 24:
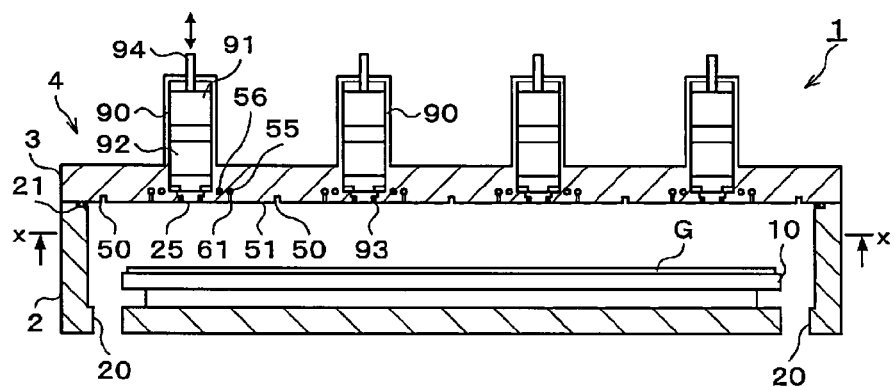
FIG. 24 offers a longitudinal cross section view (taken along a line Y-Y of FIG. 25) showing a schematic configuration of a plasma processing apparatus in accordance with a fifth modification example.
Figure 25:
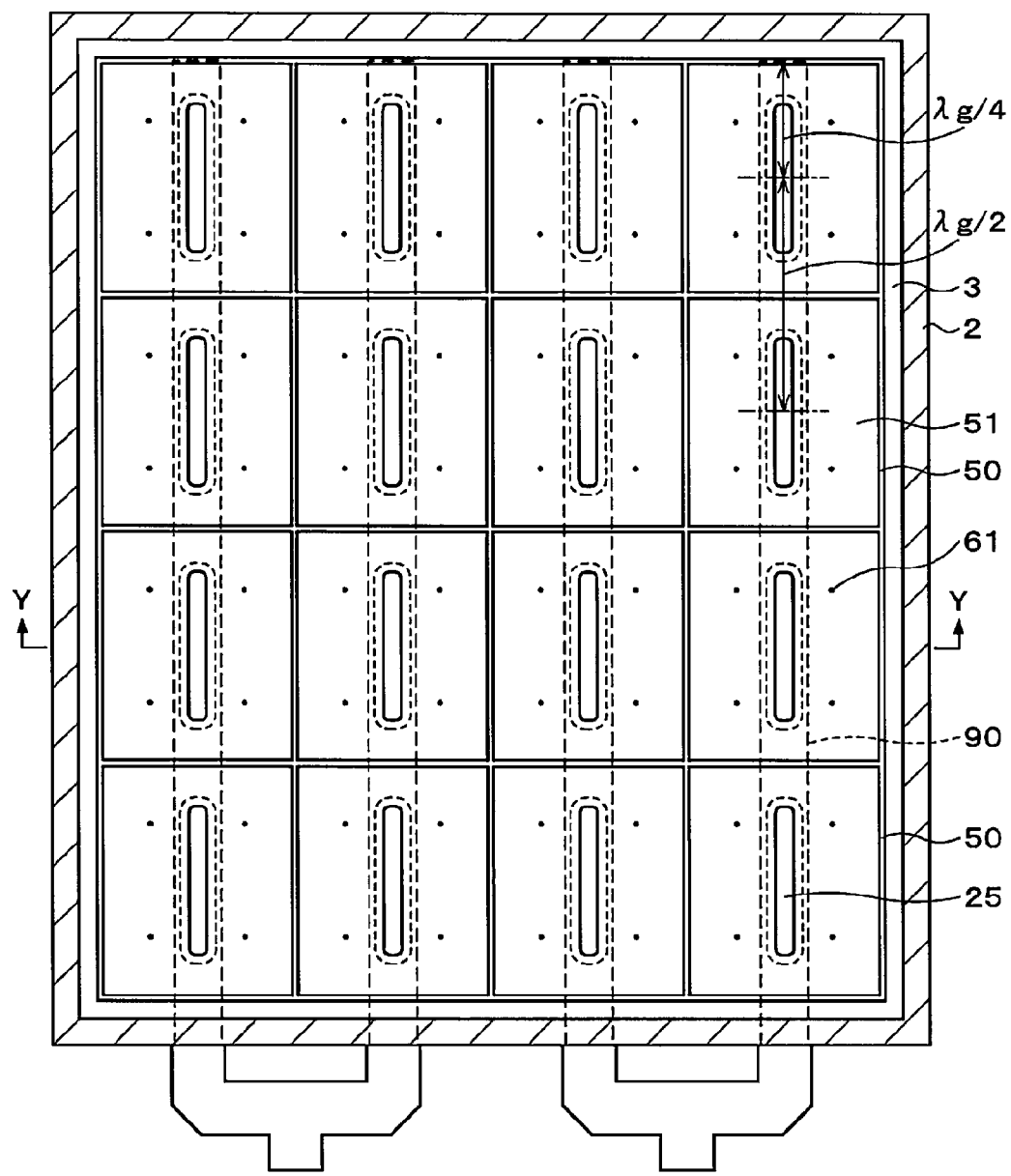
FIG. 25 offers a bottom view (taken along a line X-X of FIG. 24) of a cover included in the plasma processing apparatus in accordance with the fifth modification example.

FIG. 24 is a longitudinal cross section view (taken along a line Y-Y of FIG. 25) illustrating a schematic configuration of a plasma processing apparatus 1 in accordance with a fifth modification example. FIG. 25 is a bottom view (taken along a line X-X of FIG. 24) of a cover 3 included in the plasma processing apparatus 1 in accordance with the fifth modification example.

In this plasma processing apparatus 1 in accordance with the fifth modification example, a plurality of rectangular waveguides 90 are arranged at a same interval in parallel with each other such that E-Plane (narrow wall surfaces) face upward. Four slots (openings) communicating with the inside of the processing chamber 4 are formed in the bottom surface of each rectangular waveguide 90 at a same interval, and a dielectric member 25 made of, e.g., $Al_2O_3$ is installed within each slot. An O-ring 93 is installed between the dielectric member 25 and the cover 3 around the slot, so that air-tightness of the inside of the processing chamber 4 can be maintained.

In the rectangular waveguide 90, two dielectric members 91 and 92 made of, e.g., Teflon (registered trademark) are vertically arranged with a gap maintained therebetween. The lower dielectric member 92 is fixed to the rectangular waveguide 90. Meanwhile, a dielectric rod inserted into the rectangular waveguide 90 is connected to the top surface of the dielectric member 91. By moving the dielectric rod 94 vertically from the outside, the dielectric member 91 can be moved up and down. In the plasma processing apparatus 1 in accordance with the fifth modification example, a wavelength of a microwave propagated in the rectangular waveguide 90 can be controlled by adjusting a vertical position of the dielectric member 91 as described above. Below, this principle will be explained.

If a dielectric member is inserted in a waveguide, a wavelength $\lambda_g$ in the waveguide becomes shorter than a wavelength $\lambda_{g0}$ in a hollow waveguide. For example, the wavelength $\lambda_g$ is calculated from the following formula (16) when the inside of the waveguide is filled with a dielectric member having a dielectric constant $E_r$ such that no gap exists in the waveguide.

[Eq. 10]

$$\lambda_g = \lambda_{g0}/\sqrt{\varepsilon_r} \qquad (16)$$

When the dielectric member is inserted in a part of the waveguide, a wavelength becomes longer than the wavelength in the waveguide filled with the dielectric member without a gap present therein, but shorter than the wavelength in the hollow waveguide. Further, when a dielectric member having same volume is inserted in the waveguide, a wavelength becomes shorter at an H-Plane (wide wall surface)'s center line where an electric field is the strongest within the waveguide than at the H-Plane's end side where the electric field is weak. In this way, the wavelength can be controlled depending on the vertical position of the dielectric member 91 in the plasma processing apparatus 1 in accordance with the fifth modification example. Further, the fixed dielectric member 92 is installed to acquire symmetry of propagation mode in vertical direction.

To excite the plasma uniformly, microwaves having same intensity needs to be radiated from the respective slots provided in the rectangular waveguide 90. By setting a lengthwise pitch of the slot to be an integer multiple of ½ of a wavelength in the waveguide (in the present modification example, ½ of the wavelength in the waveguide), microwaves having same intensity can be radiated from the respective slots. In general, a wavelength in the waveguide varies depending on an impedance of the slot. In the present modification example, however, by allowing the wavelength in the waveguide to be maintained twice as long as that of the slot pitch by using the above-stated wavelength control mechanism, uniform plasma excitation can always be carried out even if plasma exciting conditions are varied. Therefore, a plasma processing apparatus highly compatible with a wide range of processing conditions can be implemented.

In the above-described plasma processing apparatus 1 in accordance with the fifth modification example, plasma P can also be excited by propagating a conductor surface wave TM to a surface wave propagating section 51 from the vicinity of the dielectric member 25, so that the same function and effect as obtained by the plasma processing apparatus 1 described earlier with reference to FIG. 1 can also be acquired. The plasma processing apparatus 1 in accordance with the fifth modification example can be appropriately applied to CMEP (Cellular Microwave Excitation Plasma) apparatus having a configuration in which divided dielectric members are arranged on the bottom surface of the cover 3.

Sixth Modification Example

Figure 26:
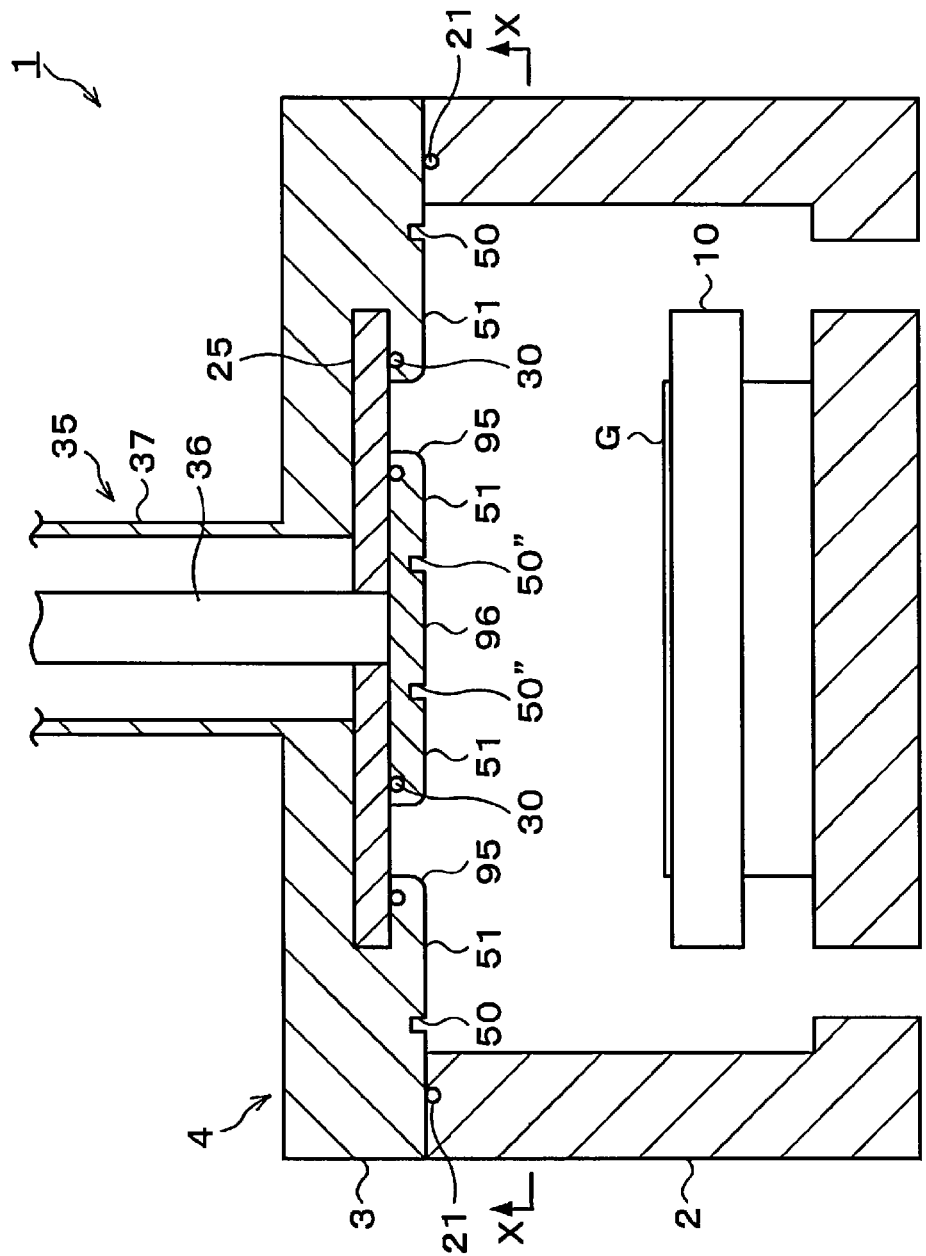
FIG. 26 is a longitudinal cross section view (taken along a line Y-Y of FIG. 27) showing a schematic configuration of a plasma processing apparatus in accordance with a sixth modification example.
Figure 27:
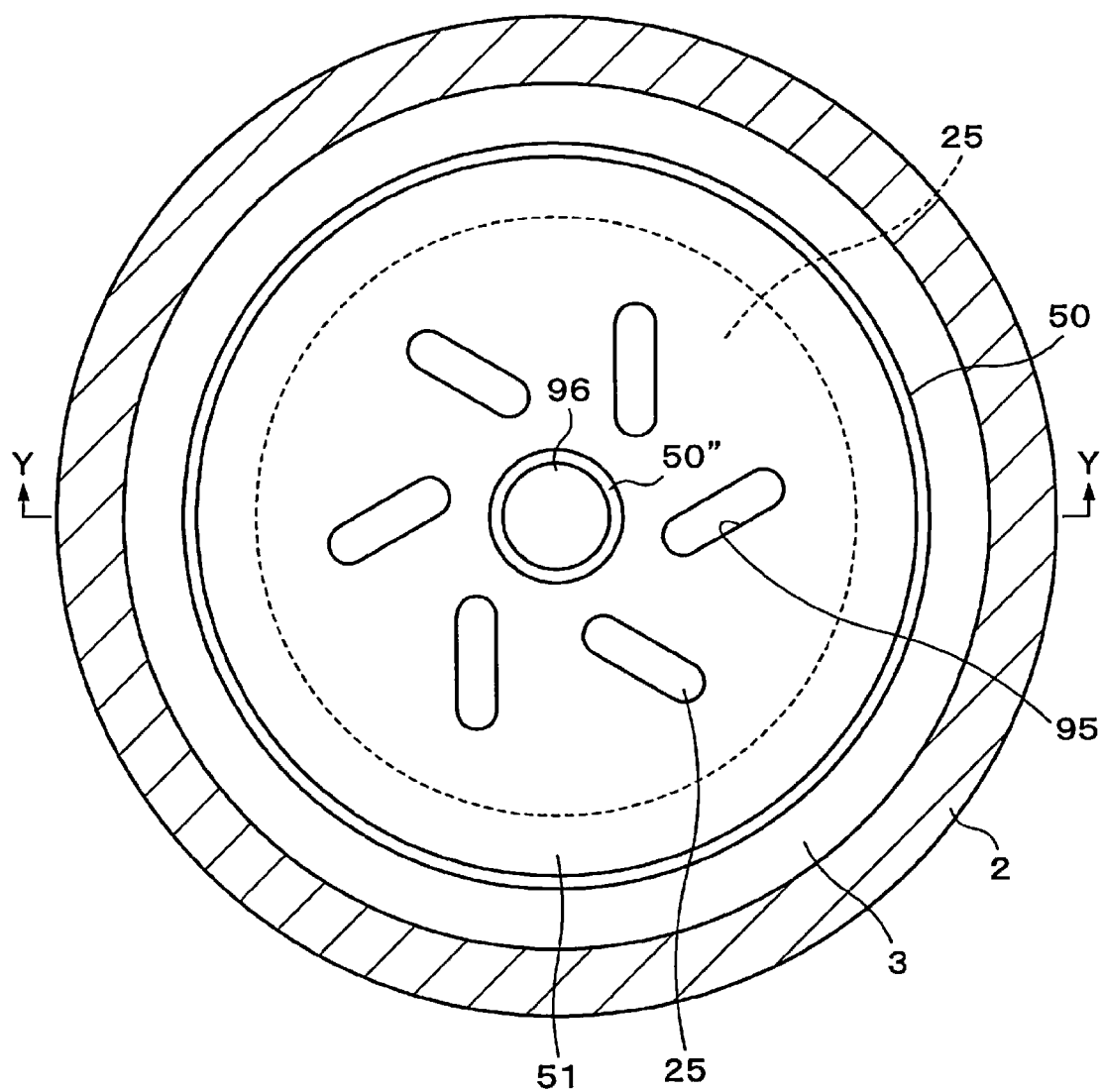
FIG. 27 is a bottom view (taken along a line X-X of FIG. 26) of a cover included in the plasma processing apparatus in accordance with the sixth modification example.

FIG. 26 is a longitudinal cross section view (taken along a line Y-Y of FIG. 27) illustrating a schematic configuration of a plasma processing apparatus 1 in accordance with a sixth modification example. FIG. 27 is a bottom view (taken along a line X-X of FIG. 26) of a cover 3 included in the plasma processing apparatus 1 in accordance with the sixth modification example.

The plasma processing apparatus 1 in the sixth modification example has a configuration in which a disk-shaped dielectric member 25 made of, e.g., $Al_2O_3$ is embedded in the cover 3, and the bottom portion of the dielectric member 25 is partially exposed to the inside of the processing chamber 4 through a plurality of slots 95 formed in the bottom surface of the cover 3. The slots 95 are arranged at point-symmetric positions on a concentric circle with respect to a central axis of a coaxial waveguide internal conductor 36, and microwaves having same intensity are radiated from the respective slots 95. The bottom surface of the cover 3 is configured as a radial line slot antenna (RLSA). In this plasma processing apparatus 1 in accordance with the sixth modification example, the plurality of slots 95 are all surrounded by a groove 50, and the bottom surface of the dielectric member 25 is exposed at plural positions within a single surface wave propagating section 51. Further, in this plasma processing apparatus 1 in accordance with the sixth modification example, a surface wave non-propagating section 96 surrounded by a concentric circle-shaped groove 50" is formed in an area surrounded by the plurality of slots 95.

In the above-described plasma processing apparatus 1 in accordance with the sixth modification example, plasma P can also be excited by propagating a conductor surface wave TM to the surface wave propagating section 51 from the vicinity of the dielectric member 25 exposed to the inside of the processing chamber, so that the same function and effect as obtained by the plasma processing apparatus 1 descried earlier with reference to FIG. 1 can also be acquired. Moreover, in the plasma processing apparatus 1 of the sixth modification example, since the surface wave non-propagating section 96 surrounded by the groove 50" is formed in the center of the surface wave propagating section 51, the plasma can be prevented from being concentrated at a central portion in the processing chamber 4. In this way, by using the grooves 50 and 50" formed in the bottom surface of the cover 3, the region of the plasma P generated within the processing chamber 4 can be controlled as desired.

Seventh Modification Example

Figure 28:
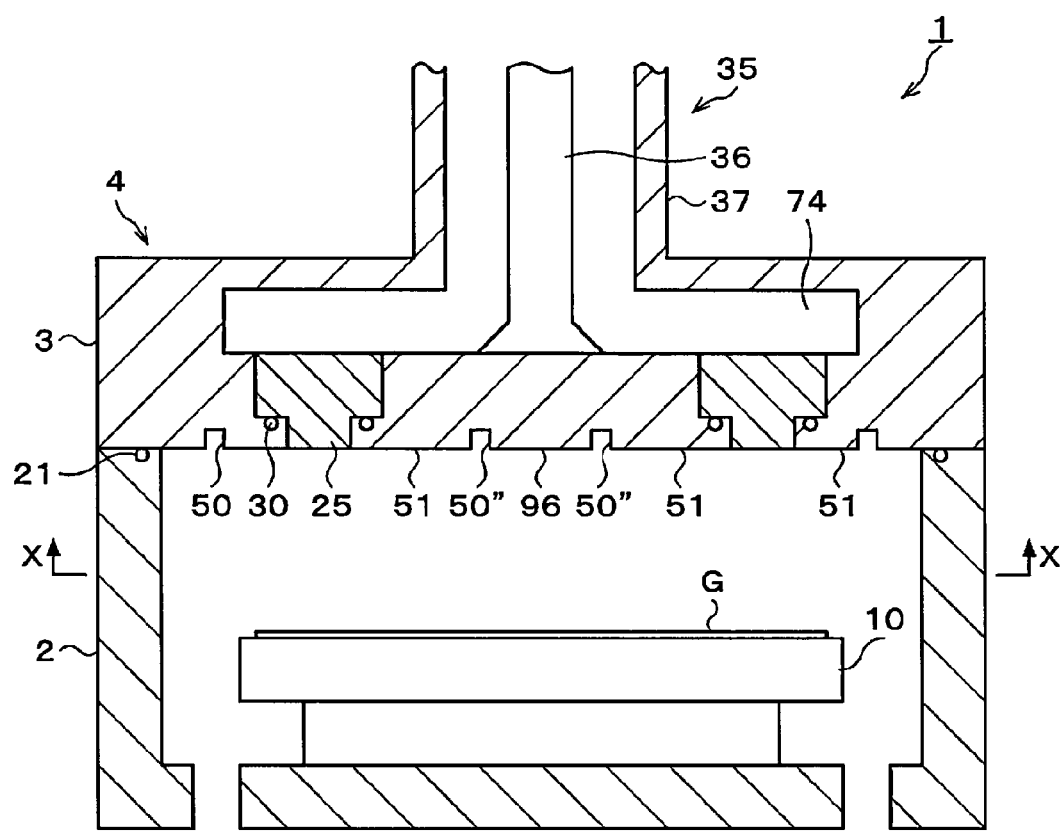
FIG. 28 provides a longitudinal cross section view (taken along a line Y-Y of FIG. 29) showing a schematic configuration of a plasma processing apparatus in accordance with a seventh modification example.
Figure 29:
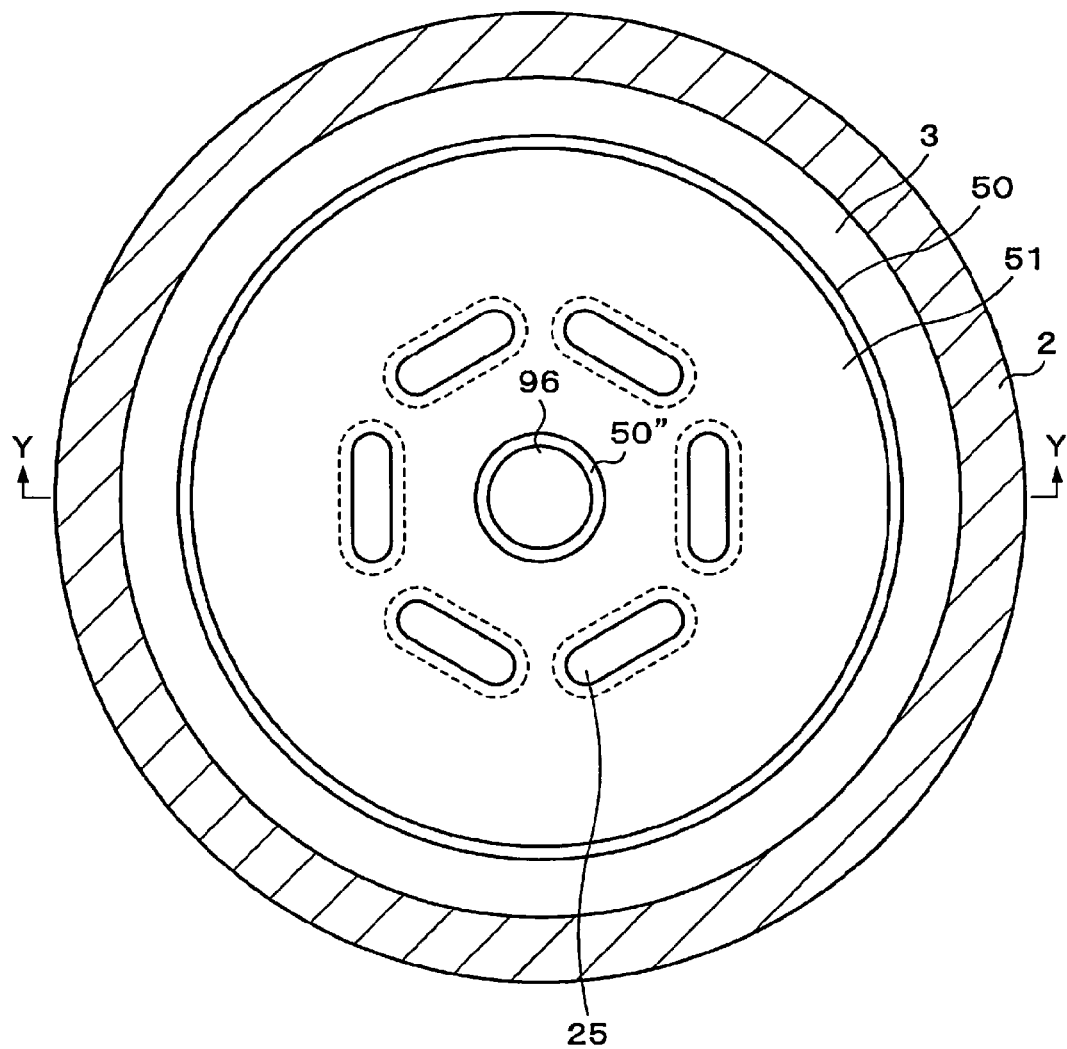
FIG. 29 provides a bottom view (taken along a line X-X of FIG. 28) of a cover included in the plasma processing apparatus in accordance with the seventh modification example.

FIG. 28 is a longitudinal cross section view (taken along a line Y-Y cross section of FIG. 29) illustrating a schematic configuration of a plasma processing apparatus 1 in accordance with a seventh modification example. FIG. 29 is a bottom view of a cover 3 included in a plasma processing apparatus in accordance with the seventh modification example.

In the plasma processing apparatus 1 in accordance with the seventh modification example, the bottom surfaces of dielectric members 25 made of, e.g., $Al_2O_3$ and mounted below the bottom surface of a waveguide 74 installed in the cover 3 are exposed to the inside of a processing chamber 4. In this plasma processing apparatus 1 in accordance with the seventh modification example, the dielectric members 25 are all surrounded by a groove 50, and the bottom surfaces of the dielectric members 25 are exposed at plural positions within a single surface wave propagating section 51. Further, a surface wave non-propagating section 96 surrounded by a grove 50" is formed in the center of the surface wave propagating section 51. The same function and effect as obtained by the plasma processing apparatus 1 in the sixth modification example can also be acquired by this plasma processing apparatus 1 in accordance with this seventh modification example.

Eighth Modification Example

Figure 30:
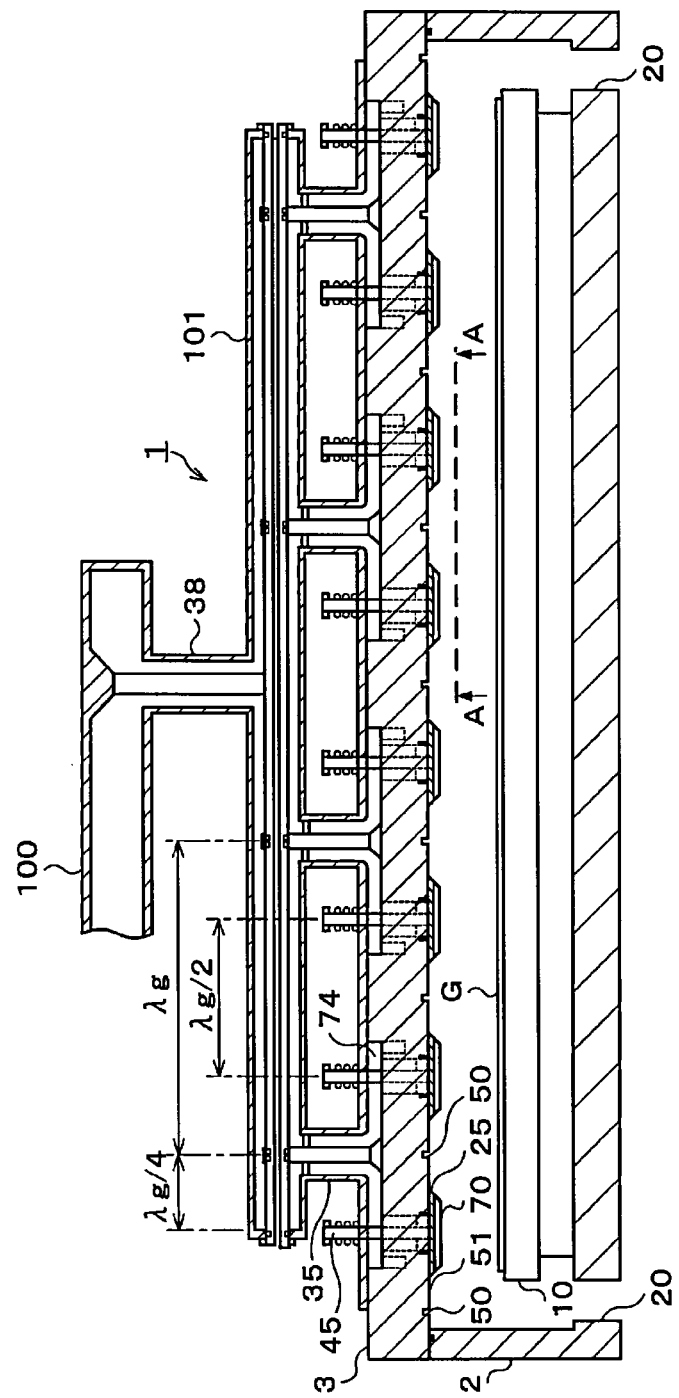
FIG. 30 illustrates a longitudinal cross section view (taken along a line Y-Y of FIG. 31) showing a schematic configuration of a plasma processing apparatus in accordance with an eighth modification example.
Figure 31:
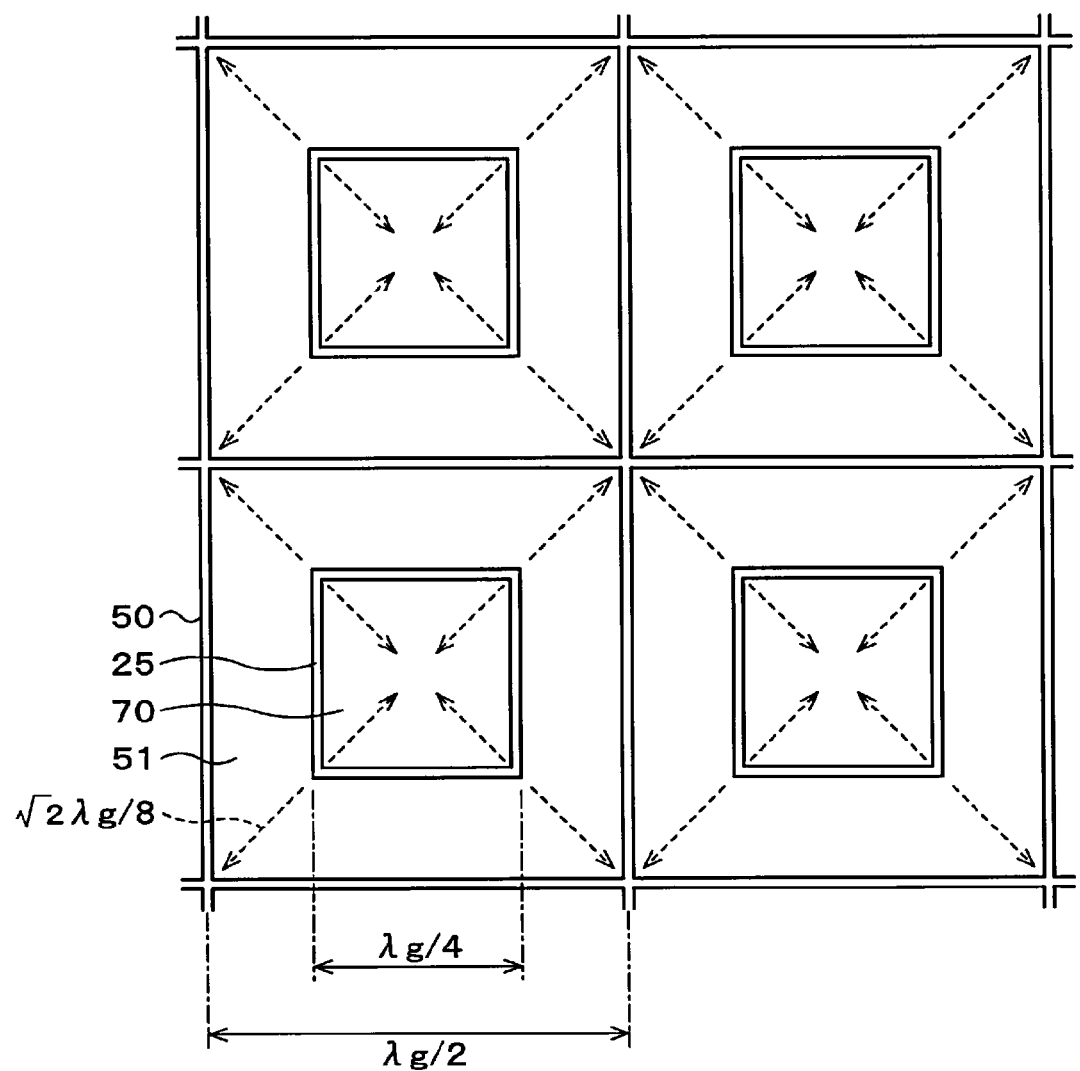
FIG. 31 is a diagram for describing a propagation state of a conductor surface wave propagated to the entire area of a surface wave propagating section from the vicinity of a dielectric member in the plasma processing apparatus in accordance with the eighth modification example.

FIG. 30 is a longitudinal cross section view illustrating a schematic configuration of a plasma processing apparatus 1 in accordance with an eighth modification example. FIG. 31 is a cross section view taken along a line A-A of FIG. 30. In this modification example, the major configuration positioned below coaxial waveguides is almost the same with that of the first modification example shown in FIG. 15 or the like.

Four branch coaxial waveguides 101 are equi-spaced at a distance of $\lambda_g$ (a wavelength in the branch coaxial waveguide 101) in a vertical direction of the paper. Four coaxial waveguides 35 are connected to each branch coaxial waveguide 101 at a same distance of $\lambda_g$. A metal rod 45 is installed in a lower portion of each coaxial waveguide 35 via a distribution waveguide 74 configured to split a microwave into four microwaves, and lengthwise and widthwise pitches of the metal rod 45 and a metal electrode 70 become about $\lambda_g/2$.

A coaxial waveguide 38 is installed between the center of the branch waveguide 101 and a branch waveguide 100. The branch waveguide 100 has a tournament structure in which a T-branch is repeated two times so that the branch waveguide 100 splits a microwave supplied from a non-illustrated microwave source into four microwaves. The microwave uniformly split by the branch waveguide 100 is supplied to plasma through the coaxial waveguide 38, the branch coaxial waveguide 101, the coaxial waveguide 35, the distribution waveguide 74, the metal rod 45 and the dielectric member 25. At this time, since the coaxial waveguides 35 are connected to the branch coaxial waveguide 101 at an interval of an integer multiple (here, twice) of $\lambda_g/2$, the microwaves supplied to the respective coaxial waveguides 35 come to have the same power and phase, so that uniform plasma can be excited.

In the plasma processing apparatus 1 in accordance with the eighth modification example, the same function and effect as obtained by the plasma processing apparatus 1 descried earlier in the first modification example can also be attained. Furthermore, a multi-stage distributor (splitter) capable of uniformly distributing (splitting) the microwave is provided by means of the branch waveguide 100, the branch coaxial waveguide 101 and the distribution waveguide 74, and by increasing the branching (splitting) number of the microwave, a large-size substrate larger than about 2 m×2 m can be effectively processed.

「Limitation in Frequency」

Figure 7:
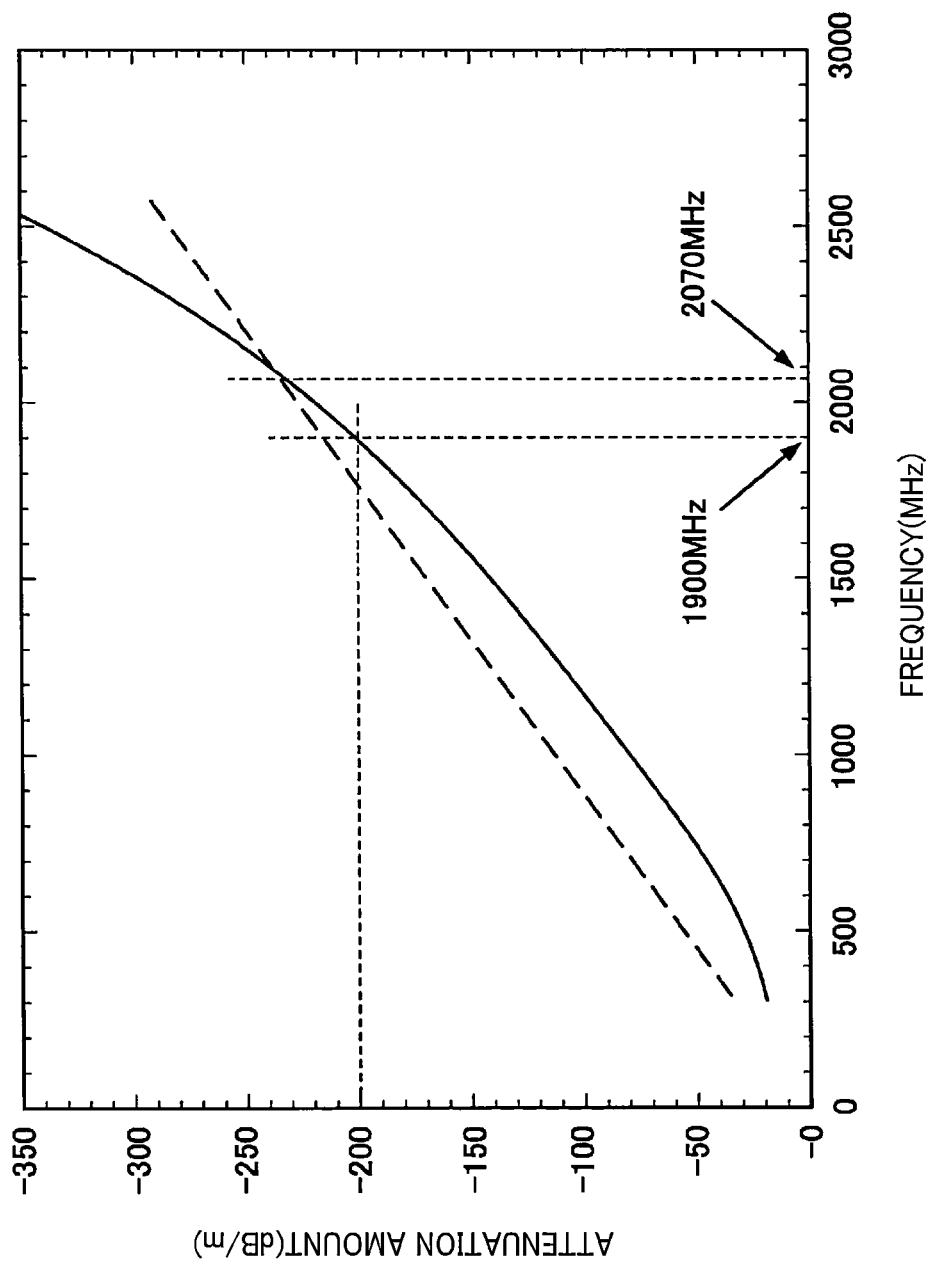
FIG. 7 is a graph showing frequency dependency of a conductor surface wave attenuation amount.

As can be seen from FIG. 7 mentioned earlier, an attenuation amount decreases with a decrease of a frequency. The reason for this is as follows. According to the formula (1), it is found that as a frequency decreases, a real number part $\in_r'$ of the dielectric constant of plasma P increases to a (−) negative direction, resulting in decrease of plasma impedance. Accordingly, a microwave electric field applied to the plasma is weakened as compared to a microwave electric field applied to a sheath. As a result, a microwave loss in the plasma is reduced, so that the attenuation amount of a conductor surface wave TM decreases.

When a conductor surface wave is used for plasma generation, if an excessively high frequency is selected for a frequency of the microwave, the conductor surface wave may not be propagated to a necessary position, so that uniform plasma cannot be generated. To estimate a frequency range in which uniform plasma can be substantially acquired in a plasma processing apparatus for processing a large-size substrate, a propagation distance by which a conductor surface wave needs to be propagated in the plasma processing apparatus 1 in accordance with the eighth modification example shown in FIG. 30 was calculated. The present modification example has a shortest propagation distance of a conductor surface wave in a practical plasma processing apparatus for processing a large-size substrate by using the conductor surface wave for plasma generation, and a higher frequency range within which uniform plasma can be obtained.

As illustrated in FIGS. 30 and 31, when the wavelength in the branch coaxial waveguide 101 is $\lambda_g$, a plurality of dielectric members 25 each having a rectangular shape whose one side has a length of about $\lambda_g/4$ are arranged in column-wise and row-wise at a same distance of $\lambda_g/2$. Further, if a space between an internal conductor and an external conductor of the branch coaxial waveguide 101 is hollow, the wavelength $\lambda_g$ in the branch coaxial waveguide 101 is equal to a wavelength in a free space. For example, $\lambda_g$ is about 328 mm at a frequency of about 915 MHz. A total of 64 dielectric members 25, which are arranged in 8 rows in horizontal direction and 8 columns in vertical direction of the paper, are fastened to the bottom surface of the cover 3 by metal electrodes 70 slightly smaller than the dielectric members 25. A groove 50 having a checkered pattern is formed in the bottom surface of the cover 3 to surround the respective dielectric members 25, thus defining surface wave propagating sections 51.

The microwave propagated through the metal rod 45 is propagated through the dielectric member 25; becomes a conductor surface wave from the vicinity of the dielectric member 25; and is propagated along the bottom surface of the cover 3 and the surface of the metal electrode 70 while exciting plasma.

As illustrated in FIG. 31, it can be found that a maximum propagation distance by which the conductor surface wave TM needs to be propagated without being attenuated considerably (<6 dB) is about $\lambda_g\sqrt{2}/8$. If 6 dB is attenuated when the conductor surface wave is propagated this distance, an attenuation amount per 1 m is indicated by a dashed line in FIG. 7. If an attenuation amount is smaller than this value, uniform plasma P can be excited at the entire surface wave propagating section 51. As for processing conditions at this time, an electron density near the surface of the surface wave propagating section 51 is about $4\times10^{11}$ cm$^{-3}$; an electron temperature is about 2 eV; a sheath voltage is about 24 V; a pressure is about 13.3 Pa; and a processing gas is Ar.

As can be found out from the graph of FIG. 7, a solid line and a dashed line intersects at a frequency of about 2070 MHz. If a frequency is higher than this value, attenuation of the conductor surface wave TM may be increased, resulting in a failure to propagate it to the entire surface wave propagating section 51, so that the uniform plasma P can not be excited. Thus, in order to excite the uniform plasma P by using the conductor surface wave TM, a frequency equal to or less than about 2 GHz needs to be selected with a certain tolerance.

Ninth Modification Example

Figure 32:
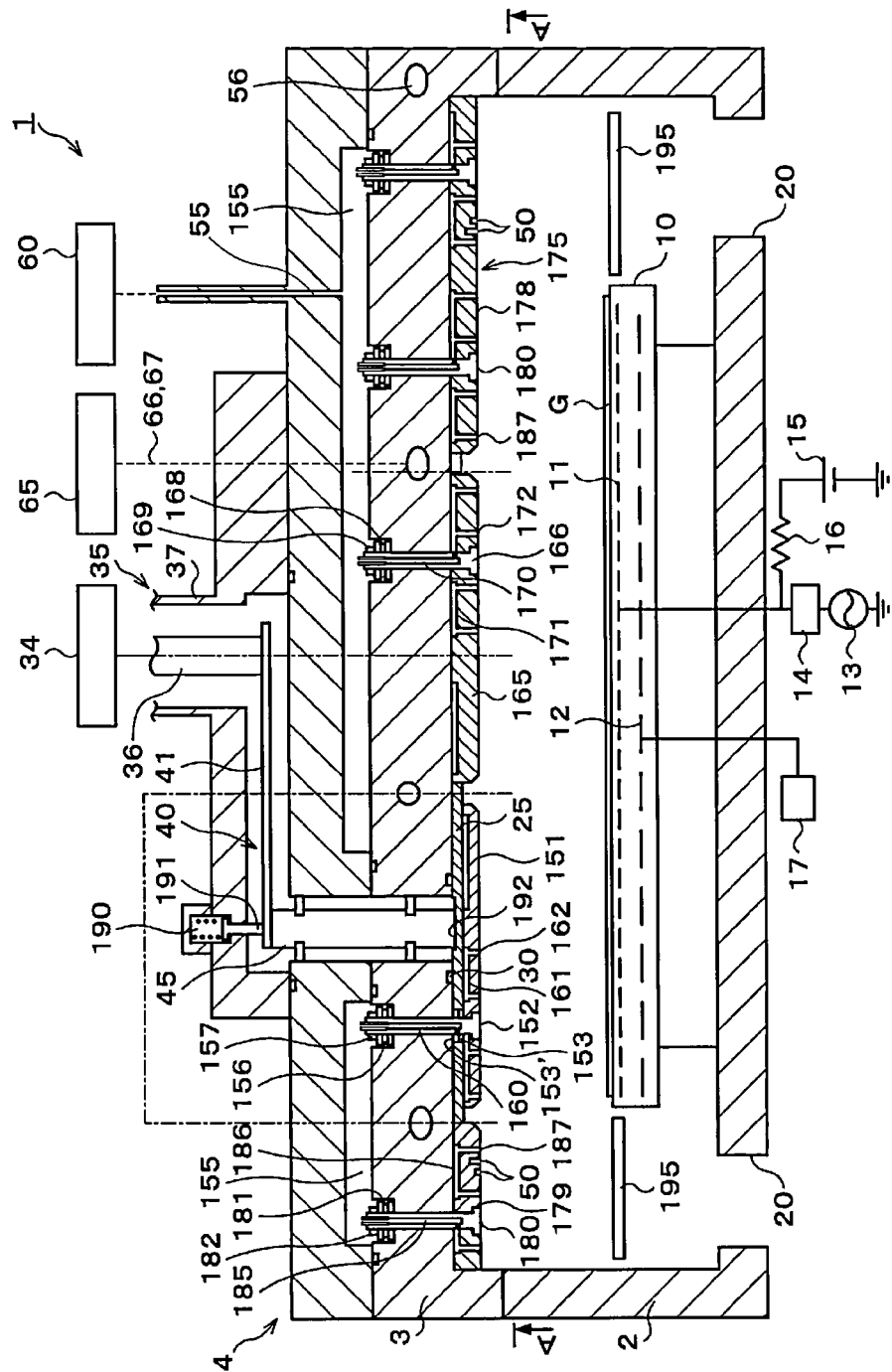
FIG. 32 is a longitudinal cross section view (taken along a line D-O'-O-E of FIG. 33) showing a schematic configuration of a plasma processing apparatus in accordance with a ninth modification example.
Figure 33:
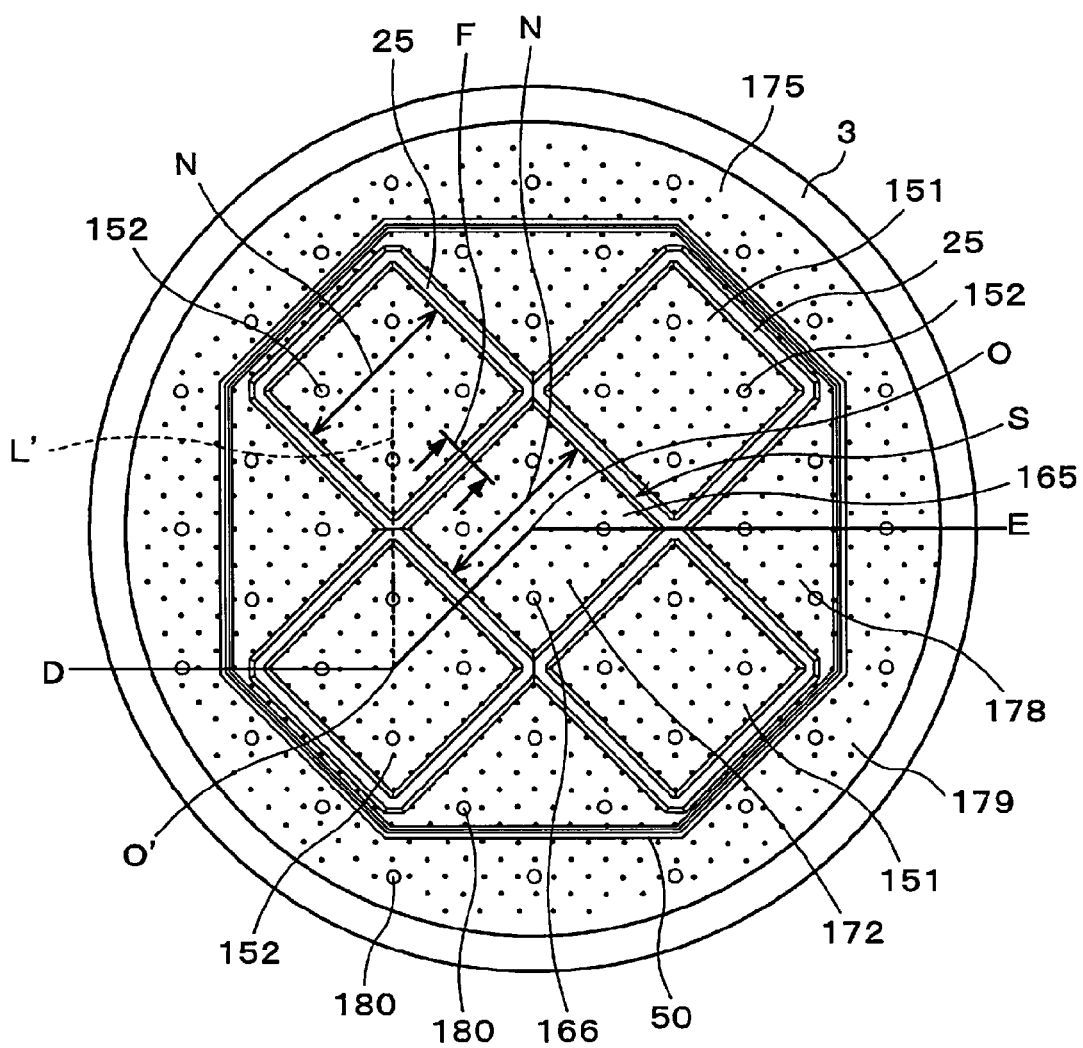
FIG. 33 is a cross section view taken along a line A-A of FIG. 32.
Figure 34:
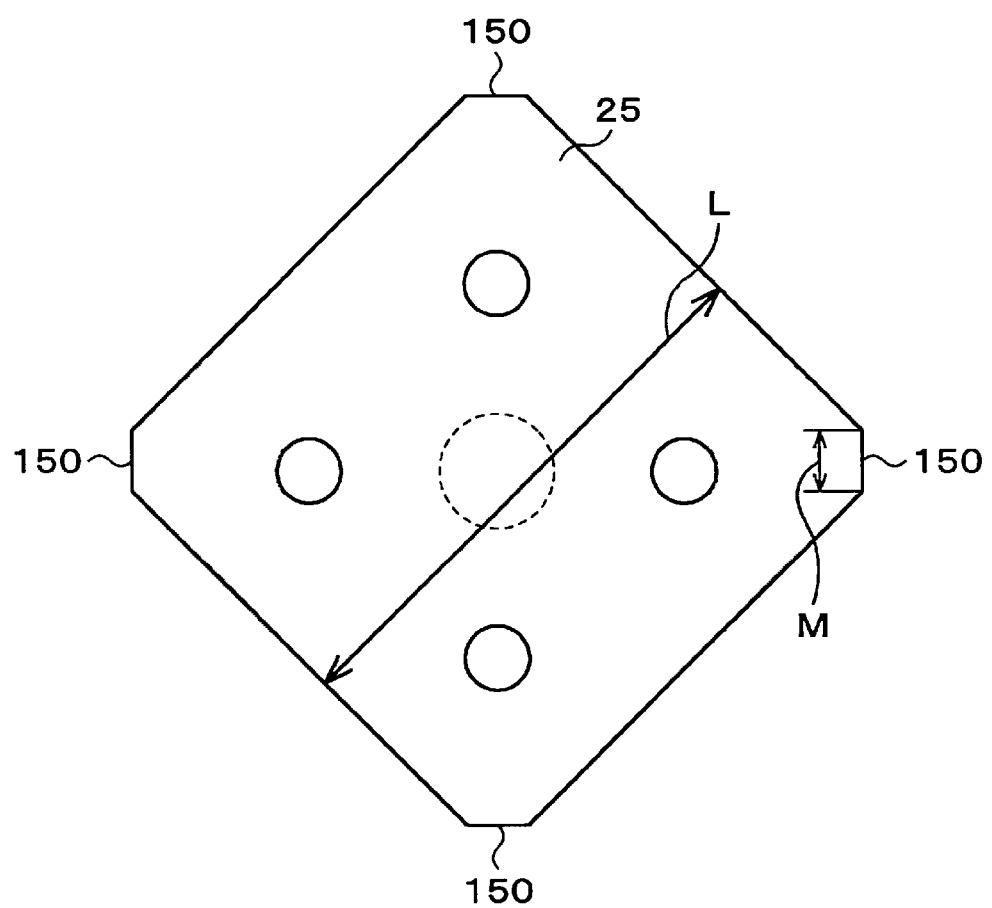
FIG. 34 is a plane view of a dielectric member.

FIG. 32 is a longitudinal cross section view (taken along a line D-O'-O-E of FIG. 33) illustrating a schematic configuration of a plasma processing apparatus 1 in accordance with a ninth modification example. FIG. 33 is a cross section view taken along a line A-A of FIG. 32 and FIG. 34 is a plane view of a dielectric member 25 used in this example. Four dielectric members 25 made of, e.g., $Al_2O_3$ are installed on the bottom surface of a cover 3. A dielectric material such as fluorine resin or quartz may be utilized as the dielectric member 25. As shown in FIG. 34, the dielectric member 25 has a square plate shape. Since the dielectric member 25 has four flat portions 150 cut perpendicularly to diagonal lines thereof at four corners of the dielectric member 25, the dielectric member 25 actually has an octagonal shape if strictly stated. Since, however, the length M of the flat portion 150 is much shorter than the width L of the dielectric member 25, the dielectric member 25 may be considered to have a substantially square shape.

As illustrated in FIG. 33, the four dielectric members 25 are arranged such that their vertex angles (flat portions 150) are adjacent to each other. Further, the vertex angles of the respective dielectric member 25 are arranged on or near a line L' connecting centers O' of the adjacent dielectric members 25. In this way, by arranging the vertex angles of the four dielectric members 25 to be adjacent to each other and locating the vertex angle of each dielectric member 25 on the line L' connecting the centers O' of the adjacent dielectric members 25, a square-shaped area S is formed at the cover 3's central bottom surface, surrounded by the four dielectric members 25.

A metal electrode 151 is installed on the bottom surface of each dielectric member 25. The metal electrode 151 is made of a conductive material such as an aluminum alloy. Like the dielectric member 25, the metal electrode 151 has a square plate shape. Further, in the specification, the plate-shaped metal member installed on the bottom surface of each dielectric member 25 is called "metal electrode." The width N of the metal electrode 151 is slightly shorter than the width L of the dielectric member 25. Accordingly, when viewed from the inside of the processing chamber, the periphery of the dielectric member 25 is exposed in a square outline around the metal electrode 151. Further, when viewed from the inside of the processing chamber 4, vertex angles of the square outlines in the peripheries of the dielectric members 25 are arranged adjacent to each other.

The dielectric member 25 and the metal electrode 151 are fastened to the bottom surface of the cover 3 by connecting members 152 such as screws. The bottom surface of each connecting member 152 exposed to the inside of the processing chamber is located on the same plane as the bottom surface of the metal electrode 151. Alternatively, the bottom surface of the connecting member 152 may not be located on the same plane as the bottom surface of the metal electrode 151. A ring-shaped spacer 153 is installed at a dielectric member 25's portion through which the connecting member 152 is inserted. An elastic member 153' such as a wave washer is provided on the spacer 153, so that no gap is present at the top and bottom surfaces of the dielectric member 25. If there exists an uncontrolled gap at the top and bottom surfaces of the dielectric member 25, wavelength of the microwave propagated through the dielectric member 25 may become unstable, resulting in deterioration of plasma uniformity or instability of load impedance when viewed from the microwave input side. Moreover, if the gap is large, an electric discharge may occur. To fix the dielectric member 25 and the metal electrode 151 to the bottom surface of the cover 3 and contact them electrically and thermally with the connecting member, an elastic member needs to be used for the connecting member. The elastic member 153' may be, for example, a wave washer, a spring washer, a conical spring, or a shield spiral and may be made of stainless steel, an aluminum alloy, or the like. The connecting member 152 is made of a conductive material and the metal electrode 151 is electrically connected with the bottom surface of the cover via the connecting member 152 to be grounded. The connecting members 152 are arranged at four positions on diagonal lines of the quadrangular metal electrode 151.

The upper end of the connecting member 152 is protruded into a space 155 formed within the cover 3. A nut 157 is fastened to the upper end of the connecting member 152 protruded into the space 155 via an elastic member 156 formed of a wave washer. A force is applied by an elasticity of the elastic member 35 such that the dielectric member 25 and the metal electrode 151 are closely in contact with the bottom surface of the cover 3. If there exists an uncontrolled gap at the top and bottom surfaces of the dielectric member 25, wavelength of the microwave propagated through the dielectric member 25 may become unstable, resulting in deterioration of plasma uniformity or instability of load impedance when viewed from the microwave input side. Moreover, if the gap is large, an electric discharge may occur. To fix the dielectric member 25 and the metal electrode 151 to the bottom surface of the cover 3 and contact them electrically and thermally with the connecting member, an elastic member needs to be used for the connecting member. The elastic member 156 may be, for example, a wave washer, a spring washer, a conical spring, or a shield spiral and may be made of stainless steel, an aluminum alloy, or the like. In such a case, the fastening force for the dielectric member 25 and the metal electrode 151 with respect to the bottom surface of the cover 3 is readily controlled by the nut 36.

An O-ring 30 as a sealing member is provided between the bottom surface of the cover 3 and the top surface of the dielectric member 25. The O-ring 30 is, for example, a metal O-ring. The O-ring 30 isolates the internal atmosphere of the processing chamber 4 from the internal atmosphere of the coaxial waveguide 35, so that the internal atmosphere and the external atmosphere of the processing chamber 4 are isolated from each other.

A vertical gas passage 160 is provided in the central portion of the connecting member 162, and a horizontal gas passage 161 is provided between the dielectric member 25 and the metal electrode 151. A plurality of gas discharge openings 152 is dispersedly provided in the bottom surface of the metal electrode 151. A preset gas supplied from a gas supply source 60 into the space 155 within the cover 3 through a gas line 55 is dispersedly supplied into the processing chamber 4 through the gas passages 160 and 161 and the gas discharge holes 162.

A metal cover 165 is installed in the cover 3's bottom surface central area S surrounded by the four dielectric members 25. The metal cover 165 is made of a conductive material such as an aluminum alloy, and is electrically connected with the bottom surface of the cover 3 to be grounded. The metal cover 165 is formed in a square plate shape having a width N, as in the case of the metal electrode 151.

The metal cover 165 has a thickness approximately equivalent to the sum of thicknesses of the dielectric member 25 and the metal electrode 151. Thus, the bottom surface of the metal cover 165 and the bottom surface of the metal electrode 151 are located on the same plane.

The metal cover 165 is fastened to the bottom surface of the cover 3 by connecting members 166 such as screws. The bottom surface of each connecting member 166 exposed to the inside of the processing chamber is located on the same plane as the bottom surface of the metal cover 165. Alternatively, the bottom surface of the connecting member 166 may not be located on the same plane as the bottom surface of the metal cover 165. The connecting members 166 are arranged at four positions on diagonal lines of the metal cover 165 in, for example, a quadrangular shape. To arrange gas discharge holes 172 uniformly, the distance between the center of the dielectric member 25 and each connecting member 166 is set to be about ¼ of an inter-center distance L' between neighboring dielectric members 25.

The upper end of the connecting member 166 is protruded into the space 155 within the cover 3. A nut 169 is fastened to the upper end of the connecting member 166 protruded into the space 155 via an elastic member 168 such as a spring washer or a wave washer. A force is applied by an elasticity of the elastic member 168 such that the metal cover 165 is closely in contact with to the bottom surface of the cover 3.

A vertical gas passage 170 is provided in the central portion of the connecting member 166, and a horizontal gas passage 171 is provided between the bottom surface of the cover 3 and the metal cover 165. A plurality of gas discharge openings 172 is dispersedly provided in the bottom surface of the metal cover 165. The preset gas supplied from the gas supply source 60 into the space 155 within the cover 3 through a gas line 55 is dispersedly supplied into the processing chamber 4 through the gas passages 170 and 171 and the gas discharge holes 172.

A side cover 175 is installed on the bottom surface of the cover 3 in an area outside the four dielectric members 25. The side cover 75 is made of a conductive material such as an aluminum alloy and is electrically connected with the bottom surface of the cover 3 to be grounded. The side cover 175 also has a thickness approximately equivalent to the sum of thicknesses of the dielectric member 25 and the metal electrode 151. Thus, the bottom surface of the side cover 175 is also located on the same plane as the bottom surfaces of the metal cover 165 and the metal electrode 151.

Double grooves 50 are provided in the bottom surface of the side cover 175 to surround the four dielectric members 25, and four side cover inner portions 178 are formed in an inner area of the side cover 175 defined by the double grooves 50. Each of these side cover inner portions 178 has a substantially same shape as an isosceles right triangle obtained by bisecting the metal cover 165 along a diagonal line, when viewed from the inside of the processing chamber 4. However, the height of the isosceles triangle of the side cover inner portion 178 is slightly (by about ¼ of the wavelength of a conductor surface wave) higher than that of the isosceles triangle obtained by bisecting the metal cover 165 along the diagonal line. It is because electric boundary conditions at base sides of the two isosceles triangles are different when viewed from the conductor surface wave.

Further, in the present embodiment, though the grove 50 is formed in an octagonal shape when viewed from the inside of the processing chamber, it may be formed in a quadrangular shape. In such a case, same isosceles right triangles are also formed between corners of the quadrangular grooves 50 and the dielectric member 25. Further, a side cover outer portion 179 that cover the periphery of the bottom surface of the cover 3 is formed in an outer area of the side cover 175 defined by the groove 50.

As will be described later, during a plasma process, a microwave transmitted into each dielectric member 25 from a microwave supply unit 34 is propagated from the vicinity of the dielectric member 25 exposed on the bottom surface of the cover 3 along the bottom surface of the metal cover 165, the bottom surface of the metal electrode 151 and the bottom surface of the side cover inner portion 178. At this time, the groove 50 functions as a propagation obstacle which obstructs a propagation of the microwave, which has been propagated along the bottom surface of the side cover inner portion 178, to the outside (side cover outer portion 179) over the groove 50. Accordingly, the bottom surface of the metal cover 165, the bottom surface of the metal electrode 151 and the bottom surface of the side cover inner portion 178 which are surrounded by the groove 50 on the bottom surface of the cover 3 serve as a surface wave propagating section 51.

The side cover 175 is fastened to the bottom surface of the cover 3 by connecting members 180 such as screws. The bottom surface of each connecting member 180 exposed to the inside of the processing chamber is located on the same plane as the bottom surface of the side cover 175. Alternatively, the bottom surface of the connecting member 180 may not be located on the same plane as the bottom surface of the side cover 175.

The upper end of the connecting member 180 is protruded into the space 155 formed within the cover 3. A nut 182 is fastened to the upper end of the connecting member 180 protruded into the space 155 via an elastic member 181 such as a spring washer or a wave washer. A force is applied by an elasticity of the elastic member 181 such that the side cover 175 is closely in contact with the bottom surface of the cover 3.

A vertical gas passage 185 is provided in the central portion of the connecting member 180, and a horizontal gas passage 186 is provided between the bottom surface of the cover 3 and the side cover 175. A plurality of gas discharge openings 187 is dispersedly provided in the bottom surface of the side cover 175. The preset gas supplied from the gas supply source 60 into the space 155 within the cover 3 through a gas passage 55 is dispersedly supplied into the processing chamber 4 through the gas passages 185 and 186 and the gas discharge holes 187.

A pressing force of a spring 190 installed at an upper portion of the cover 3 is applied to the upper end of a metal rod 45 via a support column 191. The lower end of the metal rod 45 is in contact with the center of the top surface of the dielectric member 25 installed on the bottom surface of the cover 3. Further, a recess 192 accommodating the lower end of the metal rod 45 is formed in the center of the top surface of the dielectric member 25. The metal rod 45 is pressed downward by a pressing force of the spring 190 when the lower end of the metal rod 45 is inserted in the recess 192 in the center of the top surface of the dielectric member 25 without passing through the dielectric member 25. The support column 191 is made of an insulator such as Teflon (registered trademark). Though a reflection when viewed from the microwave input side can be suppressed if the recess 192 is provided, the recess 192 may be omitted. Besides, a baffle plate 195 configured to control a gas flow within the processing chamber 4 in a desired manner is installed around the susceptor 10.

In the plasma processing apparatus 1 in accordance with the ninth modification example configured as described above, a preset gas can be uniformly supplied to the entire processing surface of a substrate G in a shower plate-like manner through the respective gas discharge holes 162, 172 and 187 arranged in the entire bottom surface of the cover 3 during the plasma process. Thus, the gas can be uniformly supplied to the entire surface of the substrate G mounted on the susceptor 10.

While the preset gas is supplied into the processing chamber 4, the substrate G is heated up to a predetermined temperature by a heater 12. Further, a microwave of, e.g., about 915 MHz generated from the microwave supply unit 34 is transmitted to each dielectric member 25 through the coaxial waveguide 35, a branch plate 40 and the electrode rod 45. The microwave transmitted through each dielectric member 25 is propagated in a conductor surface wave state along the bottom surface of the metal cover 165, the bottom surface of the metal electrode 151 and the bottom surface of the side cover inner portion 178 which function as the surface wave propagating section 51 together.

Figure 35:
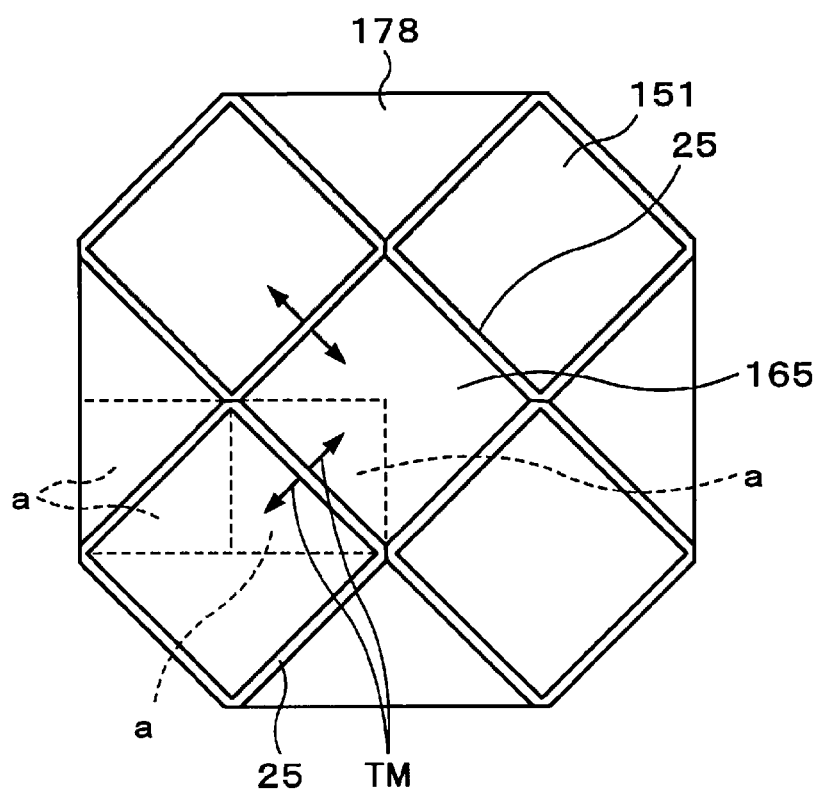
FIG. 35 is a diagram for describing a propagation state of a conductor surface wave on a surface wave propagating section.

Here, FIG. 35 is a diagram for describing a propagation state of the conductor surface wave transmitted along the bottom surface of the metal cover 165, the bottom surface of the metal electrode 151 and the bottom surface of the side cover inner portion 178 which serve as the surface wave propagating section 51. During the plasma process, the conductor surface wave (microwave) TM is transmitted through the dielectric member 25 exposed on the bottom surface of the cover 3 in a lattice shape and is propagated along the bottom surface of the metal cover 165, the bottom surface of the metal electrode 151 and the bottom surface of the side cover inner portion 178. In this case, the metal cover 165 and the metal electrode 151 are of square shapes having a substantially same area, and the four sides of each of the metal cover 165 and the metal electrode 151 are surrounded by the dielectric member 25's portion (periphery portion) exposed to the inside of the processing chamber 4. With this configuration, the conductor surface wave TM transmitted through the dielectric member 25 is propagated in the metal cover 165 and the metal electrode 151 in a substantially same state. As a result, plasma can be generated on the bottom surface of the metal cover 165 and the bottom surface of the metal electrode 151 by the power of the microwave under the substantially uniform condition.

Meanwhile, the four sides of each of the metal cover 165 and the metal electrode 151 are surrounded by the dielectric member 25's portion (periphery portion) exposed to the inside of the processing chamber 4, whereas only two sides of the side cover inner portion 178 are surrounded by the dielectric member 25's portion (periphery portion) exposed to the inside of the processing chamber 4. Thus, on the bottom surface of the side cover inner portion 178, the conductor surface wave TM can be propagated by a power which is about the half of the power for the metal cover 165 or the metal electrode 151. However, the side cover inner portion 178 has the substantially same shape as the isosceles right triangle formed by bisecting the metal cover 165 along a diagonal line, and the area of the side cover inner portion 178 is about the half of the areas of the metal cover 165 or the metal electrode 151. Therefore, plasma can be generated on the bottom surface of the side cover inner portion 178 under the same condition as that for the bottom surface of the metal cover 165 or the metal electrode 151.

Moreover, with respect to the dielectric member 25's portion (periphery portion) exposed to the inside of the processing chamber 4, surface wave propagating sections' portions a having the same shape as the isosceles right triangle are symmetrically formed at both sides of the dielectric member 25's portion exposed to the inside of the processing chamber 4, except for some area, as illustrated in FIG. 35. Thus, the conductor surface wave TM is propagated from the dielectric member 25's portion exposed to the inside of the processing chamber to all of these surface wave propagating sections' portions a under the same condition. As a result, plasma can be generated on the entire surface wave propagating section (i.e., the entire bottom surface of the metal cover 165, the entire bottom surface of the metal electrode 151 and the entire bottom surface of the side cover inner portion 178) by the power of the microwave under the uniform condition.

In the plasma processing apparatus 1, the gas discharge holes 162, 172 and 187 are closely distributed and provided in the entire bottom surfaces of the metal electrode 151, the metal cover 165 and the side cover 175 exposed to the inside of the processing chamber 4 as described above, whereby a preset gas can be supplied uniformly on the entire surface of the substrate G mounted on the susceptor 10. Accordingly, the plasma is generated on the entire bottom surfaces of the metal cover 165, the metal electrode 151 and the side cover inner portion 178 which serve as the surface wave propagating sections 51 by the power of the microwave under the uniform condition, so that the more uniform plasma process can be performed on the entire processing surface of the substrate G.

(Thickness of the Dielectric Member 25)

In the plasma processing apparatus 1 in accordance with the ninth modification example, the dielectric member 25 and the metal electrode 151 are fastened to the bottom surface of the cover 3 by the connecting member 152, but in the vicinity of the connecting member 152 electrically connecting the metal electrode 151 to the cover 3, the microwave can not be propagated through the dielectric member 25. The microwave transmitted through the vicinity of the connecting member 152 is introduced into an angled portion of the dielectric member 25 to some extent by a diffraction effect, but microwave electric field strength at the angled portion of the dielectric member 25 tends to become weakened in comparison to other portions. If too weak, plasma uniformity becomes deteriorated.

Figure 36:
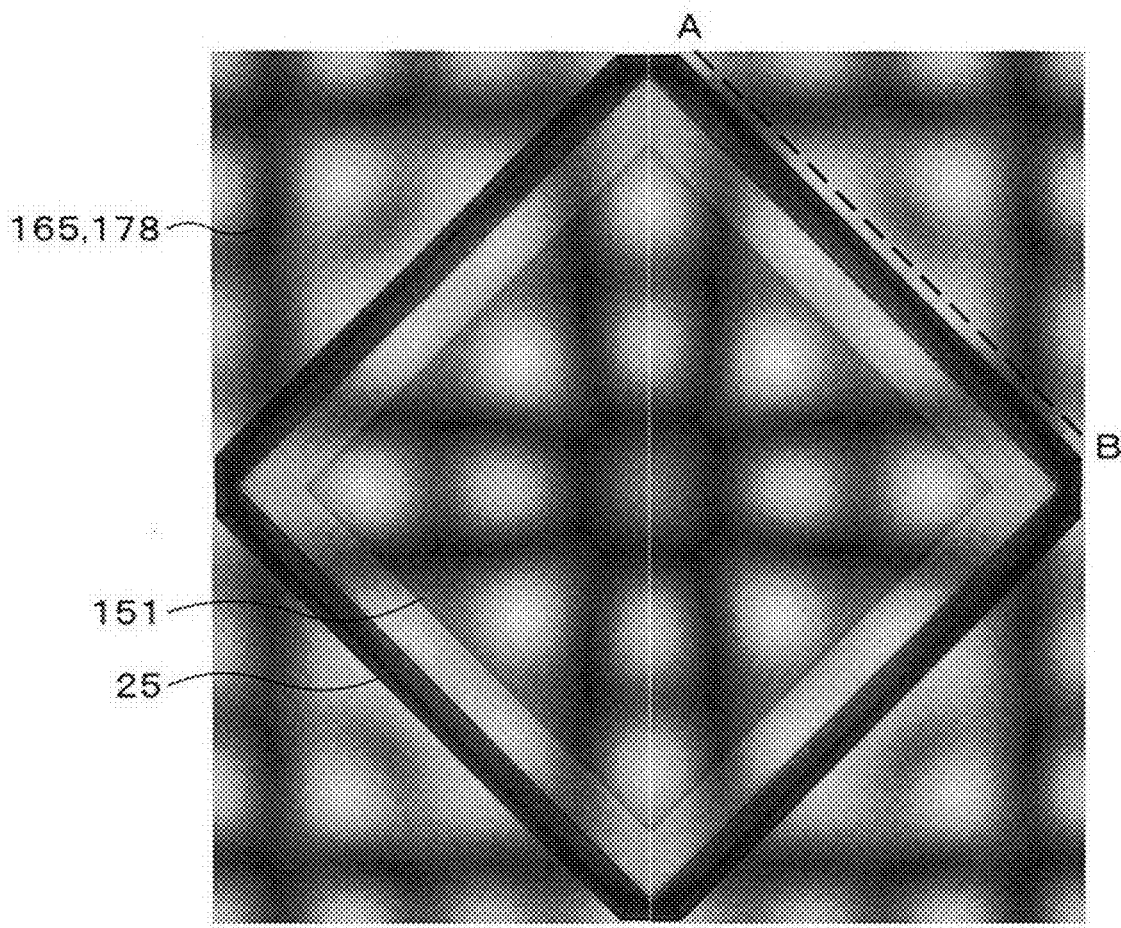
FIG. 36 is a diagram for describing a standing wave distribution of a microwave electric field in a sheath obtained by an electromagnetic field simulation.

FIG. 36 illustrates a standing wave distribution of a microwave electric field in a sheath, which is obtained by an electromagnetic field simulation. A material of the dielectric member 25 is alumina. An electron density of the plasma is about $3 \times 10^{11}$ cm$^{-3}$ and a pressure thereof is about 13.3 Pa. Further, as illustrated in FIG. 36, a unit including a sheet of the metal electrode 151 as a center and an area having the center of the adjacent metal cover 165 as a vertex (or an area bisected from the side cover inner portion 178 functioning the same as the area having the center of the adjacent metal cover 165 as a vertex) is called "cell." The supposed cell has a square shape of which each side has a length of about 164 mm. The dielectric member 25 rotated by about 45° with respect to the cell is positioned at the center of the cell. Portions having strong electric field strength are highlighted in the drawing. It can be seen that a two-dimensional standing wave is regularly and symmetrically generated on the bottom surfaces of the metal electrode 151, the metal cover 165, and the side cover inner portion 178. It is a result obtained by the simulation, but it has been known that the completely same distribution can be observed from an actual experiment using plasma.

Figure 37:
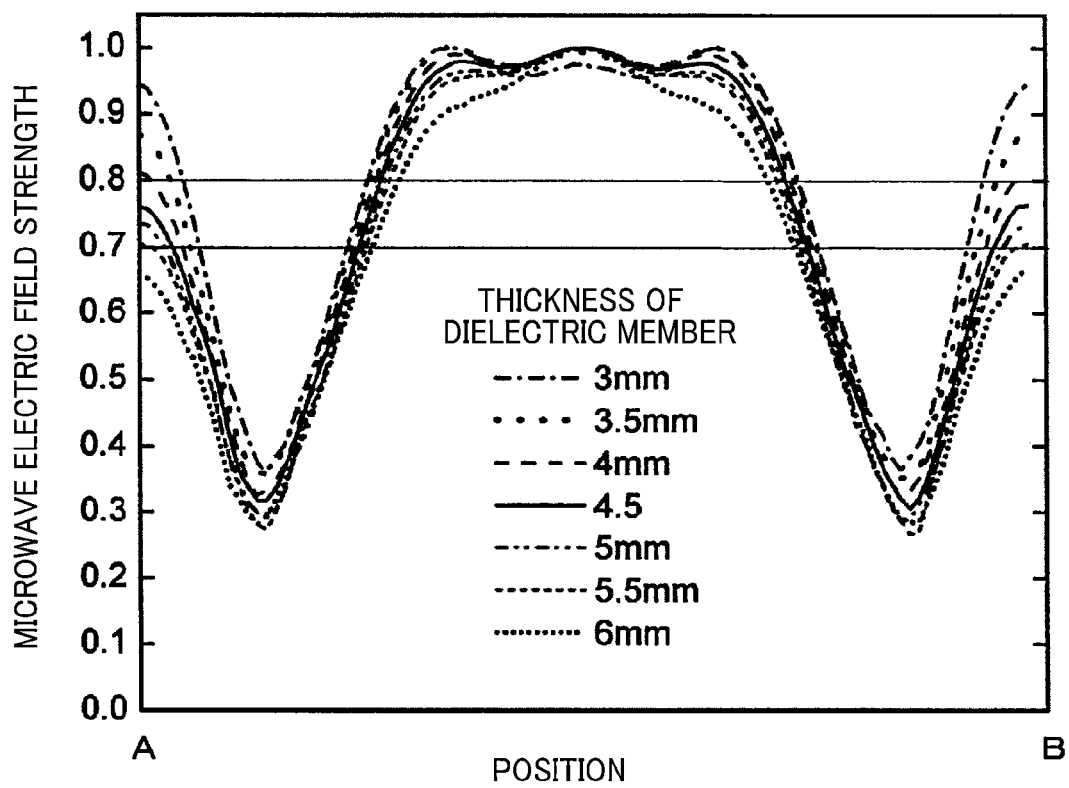
FIG. 37 depicts a graph showing a microwave electric field strength distribution in a sheath at a straight line A-B of FIG. 36.

FIG. 37 shows a microwave electric field strength distribution in a sheath at a straight line A-B of FIG. 36 when the thickness of the dielectric member 25 increases from about 3 mm to about 6 mm. The vertical axis is normalized by the maximum electric field strength in the straight line A-B. It can be seen that antinodes (peaks) of the standing wave are positioned at the center portion and end portions (angled portion of the metal cover) and nodes of the standing wave are positioned therebetween. It is desirable that the center portion and the end portions have substantially the same electric field strength, but it can be seen that the electric field strength is weak at the end portions.

Figure 38:
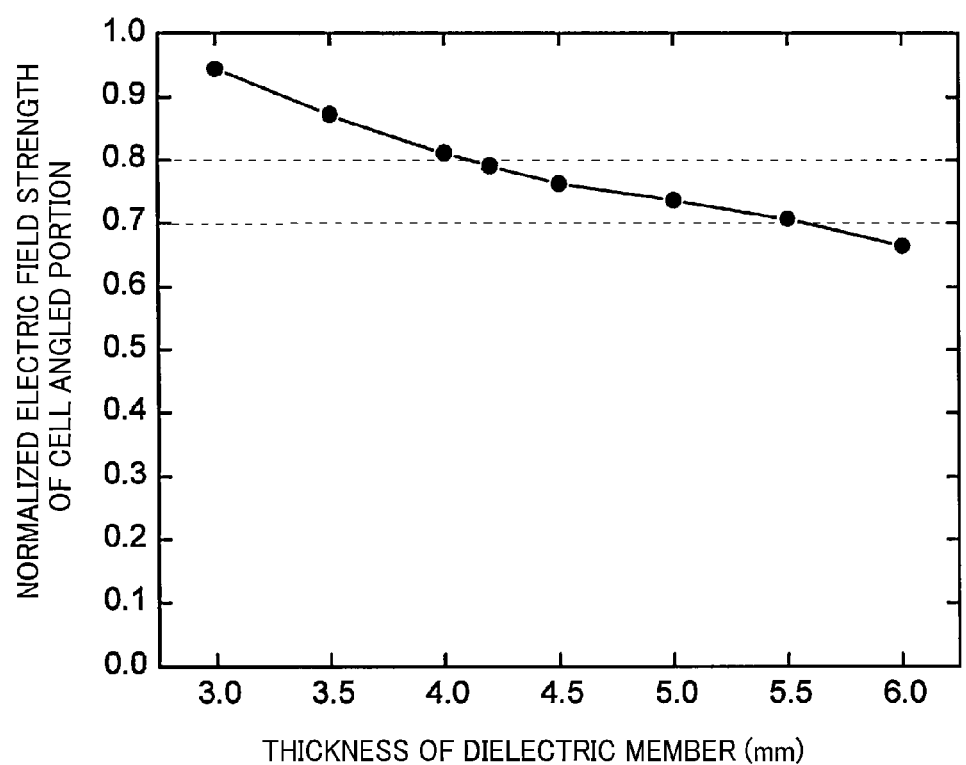
FIG. 38 is a graph showing normalized electric field strength of a cell angled portion.

FIG. 38 illustrates normalized electric field strength at the angled portion of the metal cover. It can be seen that normalized electric field strength is about 93% when the thickness of the dielectric member 25 is about 3 mm and if the thickness of the dielectric member 25 increases to about 6 mm, normalized electric field strength is decreased to about 66%. In consideration of the plasma uniformity, the normalized electric field strength at the angled portion of the bottom surface of the metal electrode 151 or the angled portion of the metal cover 165 is desirably about 70% or higher and, more desirably, about 80% or higher. It can be seen from FIG. 38 that the thickness of the dielectric member 25 needs to be 5.1 mm or less in order for the normalized electric field strength to be 70% or more, and the thickness of the dielectric member 25 needs to be 4.1 mm or less in order for the normalized electric field strength to be 80% or more.

The strength of the microwave reaching the dielectric member 25 by means of diffraction of the microwave propagated through the dielectric member 25 varies depending on a distance between the dielectric member 25 and the connecting member 152 serving as a propagation obstacle as well as the thickness of the dielectric member 25. Therefore, as this distance is increased, the strength of the microwave reaching the dielectric member 25 becomes increased. A distance between the connecting member 152 and the angled portion of the dielectric member 25 is approximately proportional to a distance (cell pitch) between the centers of the dielectric members 25. Accordingly, the thickness of the dielectric member 25 may be set to a predetermined value or less with respect to the distance between the centers of the dielectric members 25. Since the cell pitch is about 164 mm in FIG. 36, the thickness of the dielectric member 25 needs to be set to about ½₁ or less of the distance between the centers of the dielectric members 25 in order for the normalized electric field strength to be 70% or more, and the thickness of the dielectric member 25 needs to be set to about ¼₀ or less in order for the normalized electric field strength to be 80% or more.

(Area of an Exposed Portion of the Dielectric Member 25 within the Processing Chamber 4)

The microwave transmitted through the dielectric member to the end portion of the dielectric member 25 is propagated on the metal surface (i.e., the bottom surfaces of the metal cover 165, the metal electrode 151 and the side cover inner portion 178) adjacent to the dielectric member 25 as a conductor surface wave. As illustrated in FIG. 35, two surface wave propagating sections' portions a are symmetrically formed at both sides of the dielectric member 25' portion exposed to the inside of the processing chamber 4. Further, if microwave energy is equally distributed to these two surface wave propagating sections' portions a, plasma having the same density and the same distribution is excited at both surface wave propagating sections' portions a, so that uniform plasma can be easily obtained at the entire surface wave propagating section.

Meanwhile, plasma is also excited at a portion where the dielectric member 25 is exposed to the inside of the processing chamber 4 by a dielectric surface wave. In case of the dielectric surface wave, the microwave electric field is applied to both the dielectric member 25 and the plasma, but in case of the conductor surface wave, the microwave electric field is applied only to the plasma. Therefore, generally, in case of the conductor surface wave, the microwave electric field applied to the plasma becomes strong. Accordingly, plasma excited on the metal surface such as the surface wave propagating sections (i.e., the bottom surfaces of the metal cover 165, the metal electrode 151 and the side cover inner portion 178) has a higher density than plasma excited on the surface of the dielectric member 25.

If the area of the exposed portion of the dielectric member 25 is sufficiently smaller than the area of the surface wave propagating section's portion a, uniform plasma can be obtained in the vicinity of the substrate G by means of diffusion of the plasma. However, if the area of the exposed portion of the dielectric member 25 is larger than the area of one of the surface wave propagating section's portion a, i.e., the total area of the exposed portion of the dielectric member 25 is larger than about a half of the area of all the surface wave propagating sections, plasma becomes non-uniform and abnormal electric discharge or sputtering may occur because power is concentrated on the small-area surface wave propagating sections. Accordingly, the total area of the exposed portion of the dielectric member 25 is desirably about ½ or less, more desirably about ⅕ or less of the area of the surface wave propagating sections.

Tenth Modification Example

Figure 39:
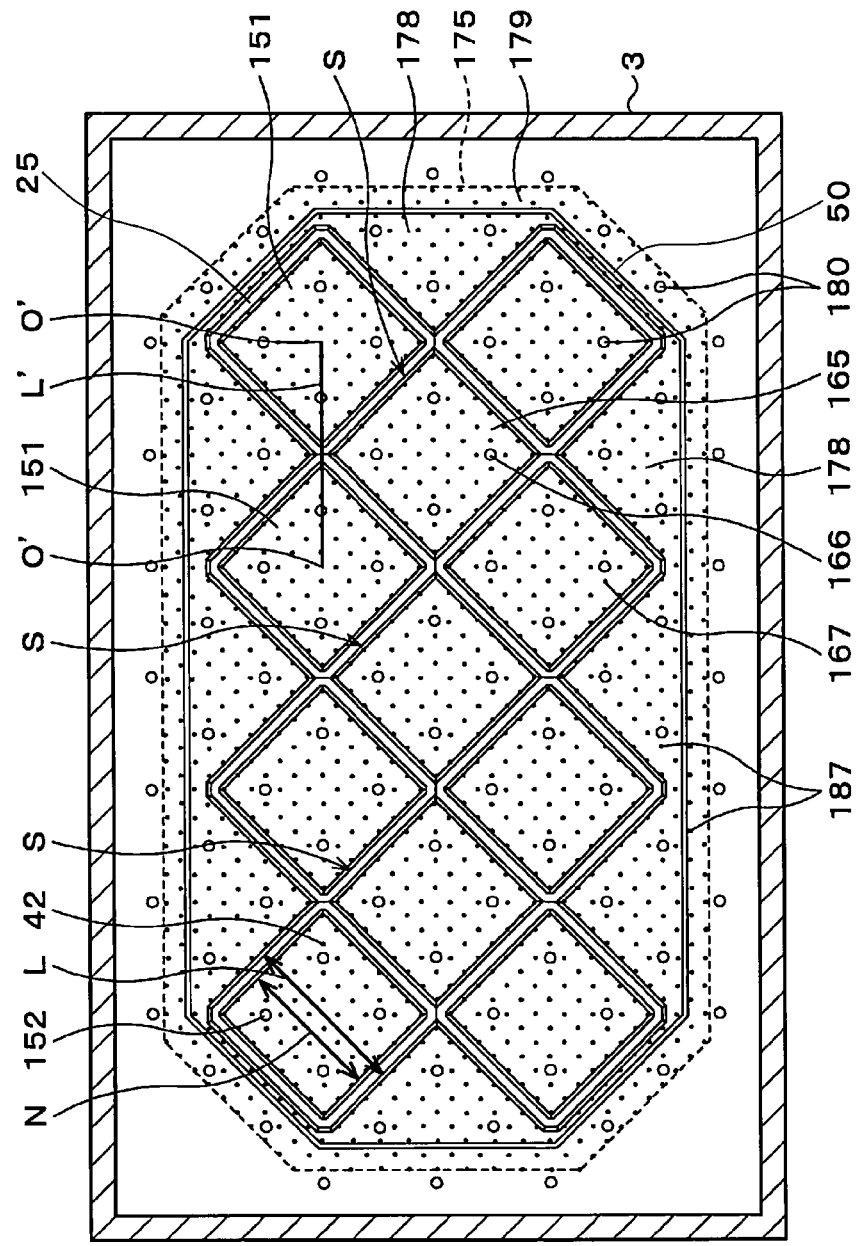
FIG. 39 provides a bottom view of a cover of a plasma processing apparatus in accordance with a tenth modification example.

FIG. 39 illustrates a bottom view of the cover 3 of the plasma processing apparatus 1 in accordance with a tenth modification example. In the plasma processing apparatus 1 in accordance with this tenth modification example, eight dielectric members 25 made of, e.g., $Al_2O_3$ are installed on a bottom surface of the cover 3. In the same manner as the ninth modification example, each dielectric member 25 is formed in a substantially square plate shape as illustrated in FIG. 39. The dielectric members 25 are arranged such that their vertex angles are adjacent to each other. Further, the vertex angles of the respective dielectric member 25 are arranged on or near a line L' connecting centers O' of the adjacent dielectric members 25. In this way, by arranging the vertex angles of the eight dielectric members 25 to be adjacent to each other and locating the vertex angle of each dielectric member 25 on the line L' connecting the centers O' of the adjacent dielectric members 25, square-shaped areas S each surrounded by four dielectric members 25 are formed at three locations on the bottom surface of the cover 3.

A metal electrode 151 is installed on the bottom surface of each dielectric member 25. The metal electrode 151 is made of a conductive material such as an aluminum alloy. Like the dielectric member 25, the metal electrode 151 has a square plate shape. The width N of the metal electrode 151 is slightly shorter than the width L of the dielectric member 25. Accordingly, when viewed from the inside of the processing chamber, the periphery of the dielectric member 25 is exposed in a square outline around the metal electrode 151. Further, when viewed from the inside of the processing chamber 4, vertex angles of the square outlines in the peripheries of the dielectric members 25 are arranged adjacent to each other.

The dielectric member 25 and the metal electrode 151 are fastened to the bottom surface of the cover 3 by connecting members 152 such as screws. The metal electrode 151 is electrically connected with the bottom surface of the cover 3 via the connecting member 152 to be grounded. A plurality of gas discharge openings 42 is dispersedly provided in the bottom surface of the metal electrode 151.

The metal cover 165 is installed to each area S on the bottom surface of the cover 3. The metal cover 165 is made of a conductive material such as an aluminum alloy, and is electrically connected with the bottom surface of the cover 3 to be grounded. The metal cover 165 is formed in a square plate shape having a width N, as in the case of the metal electrode 151.

The metal cover 165 has a thickness approximately equivalent to the sum of thicknesses of the dielectric member 25 and the metal electrode 151. Thus, the bottom surface of the metal cover 165 and the bottom surface of the metal electrode 151 are located on the same plane.

The metal cover 165 is fastened to the bottom surface of the cover 3 by connecting members 166 such as screws. A plurality of gas discharge openings 167 is dispersedly provided in the bottom surface of the metal cover 165.

A side cover 175 is installed on the bottom surface of the cover 3 in an area outside the eight dielectric members 25. The side cover 75 is made of a conductive material such as an aluminum alloy and is electrically connected with the bottom surface of the cover 3 to be grounded. The side cover 175 also has a thickness approximately equivalent to the sum of thicknesses of the dielectric member 25 and the metal electrode 151. Thus, the bottom surface of the side cover 175 is also located on the same plane as the bottom surfaces of the metal cover 165 and the metal electrode 151.

Grooves 50 are consecutively provided in the bottom surface of the side cover 175 to surround the eight dielectric members 25, and eight side cover inner portions 178 are formed in an inner area of the side cover 175 defined by the grooves 50. Each of these side cover inner portions 178 has a substantially same shape as an isosceles right triangle obtained by bisecting the metal cover 165 along a diagonal line, when viewed from the inside of the processing chamber 4. However, the height of the isosceles triangle of the side cover inner portion 178 is slightly (by about ¼ of the wavelength of a conductor surface wave) higher than that of the isosceles triangle obtained by bisecting the metal cover 165 along the diagonal line. It is because electric boundary conditions at base sides of the two isosceles triangles are different when viewed from the conductor surface wave.

Further, in the present embodiment, though the grove 50 is formed in an octagonal shape when viewed from the inside of the processing chamber, it may be formed in a quadrangular shape. In such a case, same isosceles right triangles are also formed between corners of the quadrangular grooves 50 and the dielectric member 25. Further, a side cover outer portion 179 that cover the periphery of the bottom surface of the cover 3 is formed in an outer area of the side cover 175 defined by the groove 50.

During a plasma process, a microwave transmitted into each dielectric member 25 from a microwave supply unit 34 is propagated from the vicinity of the dielectric member 25 exposed on the bottom surface of the cover 3 along the bottom surface of the metal cover 165, the bottom surface of the metal electrode 151 and the bottom surface of the side cover inner portion 178. Accordingly, the bottom surface of the metal cover 165, the bottom surface of the metal electrode 151 and the bottom surface of the side cover inner portion 178 which are surrounded by the groove 50 on the bottom surface of the cover 3 serve as a surface wave propagating section 51.

The side cover 175 is fastened to the bottom surface of the cover 3 by connecting members 180 such as screws. A plurality of gas discharge openings 187 is dispersedly provided in the bottom surface of the side cover 175.

In the plasma processing apparatus 1 in accordance with the tenth modification example, the plasma is generated on the entire bottom surfaces of the metal cover 165, the metal electrode 151 and the side cover inner portion 178 which serve as the surface wave propagating sections 51 by the power of the microwave under the uniform condition, so that the more uniform plasma process can be performed on the entire processing surface of the substrate G. The number of the dielectric members 25 installed to the bottom surface of the cover 3 and an arrangement thereof may be varied arbitrarily.

Eleventh Modification Example

Figure 40:
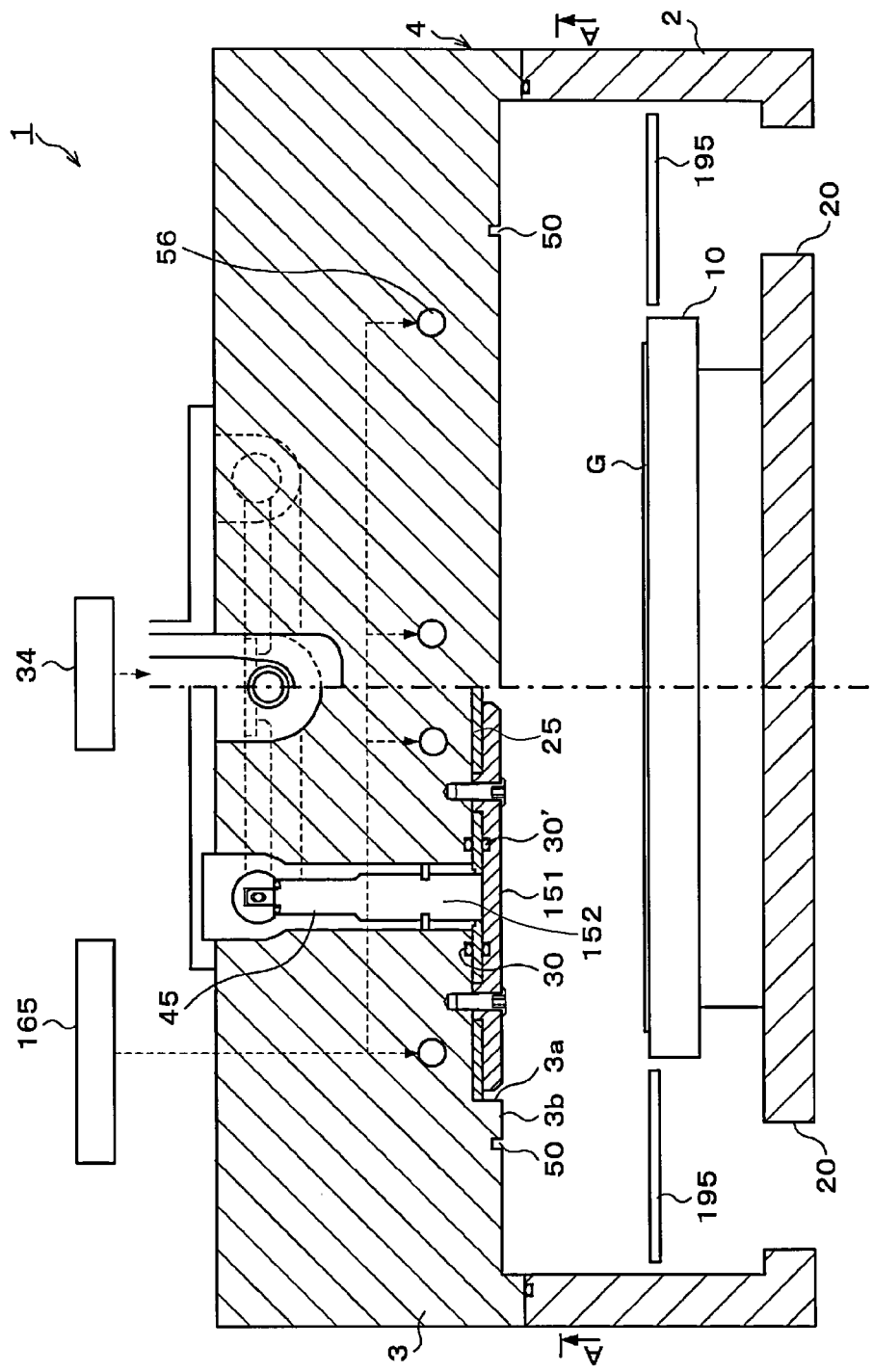
FIG. 40 sets forth a longitudinal cross section view (taken along a line D-O'-O-E of FIG. 41) showing a schematic configuration of a plasma processing apparatus in accordance with an eleventh modification example.
Figure 41:
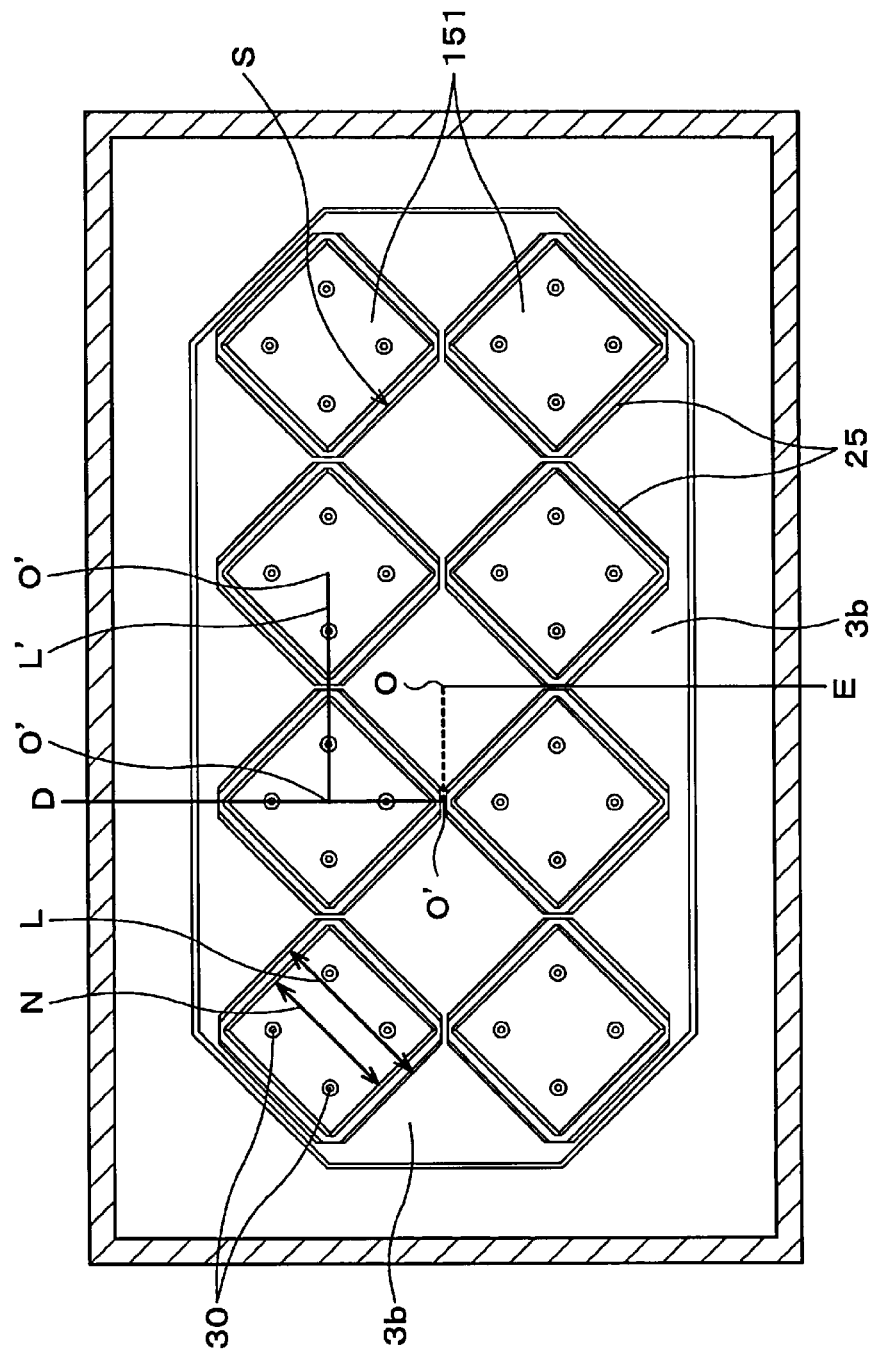
FIG. 41 is a cross section view taken along a line A-A of FIG. 40.

FIG. 40 shows a longitudinal cross section view (taken along a line D-O'-O-E of FIG. 41) illustrating a schematic configuration of a plasma processing apparatus 1 in accordance with an eleventh modification example. In the plasma processing apparatus 1 in accordance with this eleventh modification example, eight dielectric members 25 made of, e.g., $Al_2O_3$ are installed on a bottom surface of the cover 3. As described above, each dielectric member 25 has a substantially square plate shape. The dielectric members 25 are arranged such that their vertex angles are adjacent to each other. Further, the vertex angles of the respective dielectric member 25 are arranged on or near a line L' connecting centers O' of the adjacent dielectric members 25. In this way, by arranging the vertex angles of the eight dielectric members 25 to be adjacent to each other and locating the vertex angle of each dielectric member 25 on the line L' connecting the centers O' of the adjacent dielectric members 25, square-shaped areas S each surrounded by four dielectric members 25 are formed at three locations on the bottom surface of the cover 3.

A metal electrode 151 is installed on the bottom surface of each dielectric member 25. The metal electrode 151 is made of a conductive material such as an aluminum alloy. Like the dielectric member 25, the metal electrode 151 has a square plate shape. The width N of the metal electrode 151 is slightly shorter than the width L of the dielectric member 25. Accordingly, when viewed from the inside of the processing chamber, the periphery of the dielectric member 25 is exposed in a square outline around the metal electrode 151. Further, when viewed from the inside of the processing chamber 4, vertex angles of the square outlines in the peripheries of the dielectric members 25 are arranged adjacent to each other.

The dielectric member 25 and the metal electrode 151 are fastened to the bottom surface of the cover 3 by connecting members 152 such as screws. In this modification example, a lower end of a metal rod 45 is inserted through the dielectric member 25 to be in contact with a top surface of the metal electrode 151. An O-ring 30' serving as a sealing member is installed between a bottom surface of the dielectric member 25 and a top surface of the metal electrode 151 to surround a connection part of the lower end of the metal rod 45 and the top surface of the metal electrode 151. The metal electrode 151 is electrically connected with the bottom surface of the cover 3 via the connecting member 152 to be grounded.

In this modification example, the bottom surface of the cover 3 is exposed to the inside of the processing chamber 4 at each area S on the bottom surface of the cover and the outer area of the eight dielectric members 25. Further, recesses 3a into which the dielectric member 25 and the metal electrode 151 are inserted are formed in the bottom surface of the cover 3. The dielectric member 25 and the metal electrode 151 are inserted into each recess 3a, whereby the bottom surface of cover 30 exposed to the inside of the processing chamber 4 is located on the same plane as the bottom surface of the metal electrode 151.

In the bottom surface of the cover 3, a groove 50 is consecutively formed so as to surround the eight dielectric members 25, and in an inner area of the bottom surface of the cover 3 defined by the groove 50, eight inner portions 3b of the cover bottom surface are formed. Each of the inner portions 3b of the cover bottom surface has a substantially same shape as an isosceles right triangle obtained by bisecting the metal electrode 151 along a diagonal line, when viewed from the inside of the processing chamber 4.

In the plasma processing apparatus 1 in accordance with the eleventh modification example, during a plasma process, a microwave transmitted into each dielectric member from a microwave supply unit 34 is propagated from the vicinity of the dielectric member 25 exposed on the bottom surface of the cover 3 along the bottom surface of the metal electrode 151, each area S of the cover 3 and the bottom surface of the cover bottom surface inner portion 3b. In the plasma processing apparatus 1 in accordance with the eleventh modification example, the plasma is generated on the bottom surface of the metal electrode 151, each area S of the cover 3 and the bottom surface of the cover bottom surface inner portion 3b which serve as the surface wave propagating sections 51 by the power of the microwave under the uniform condition, so that the more uniform plasma process can be performed on the entire processing surface of the substrate G.

Twelfth Modification Example

Figure 42:
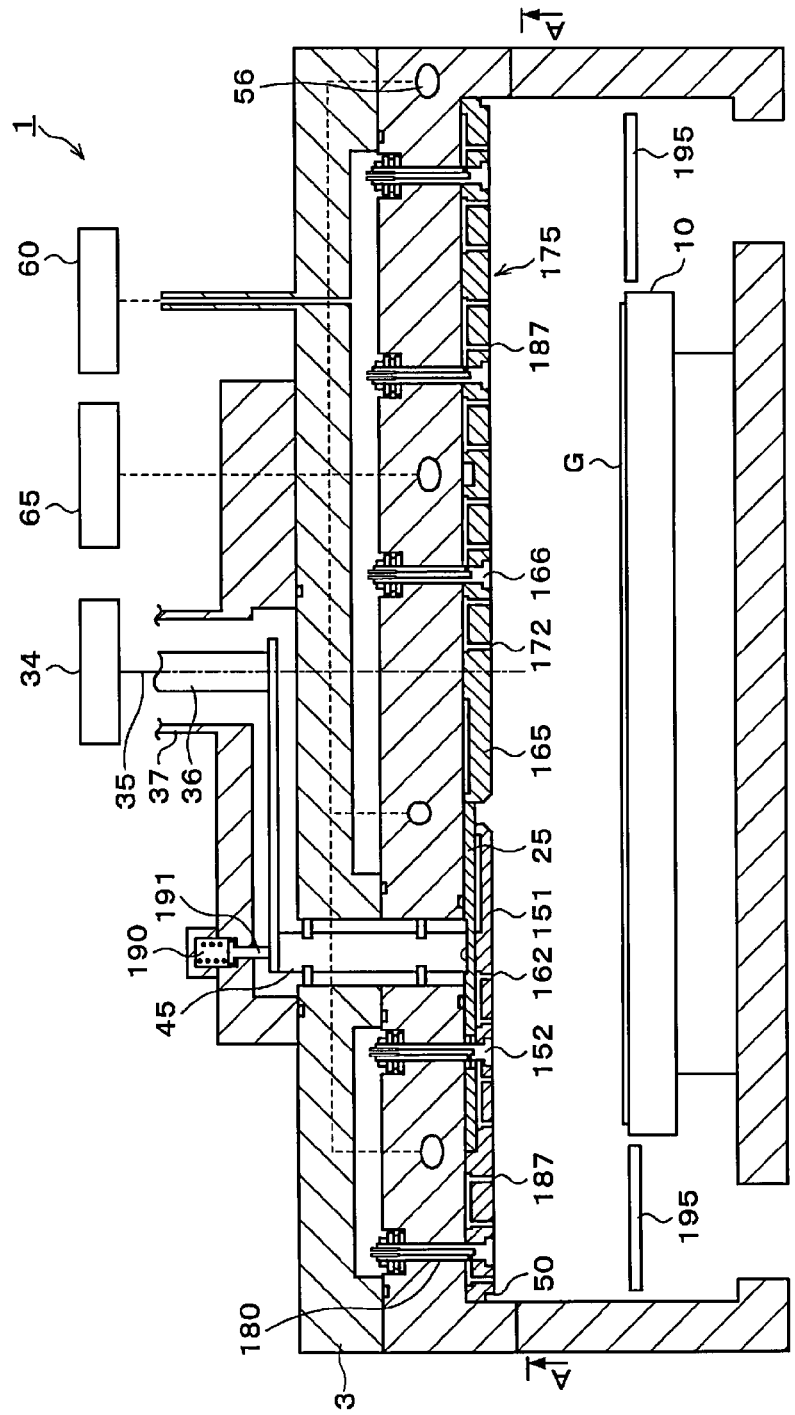
FIG. 42 presents a longitudinal cross section view (taken along a line D-O'-O-E of FIG. 43) showing a schematic configuration of a plasma processing apparatus in accordance with a twelfth modification example.
Figure 43:
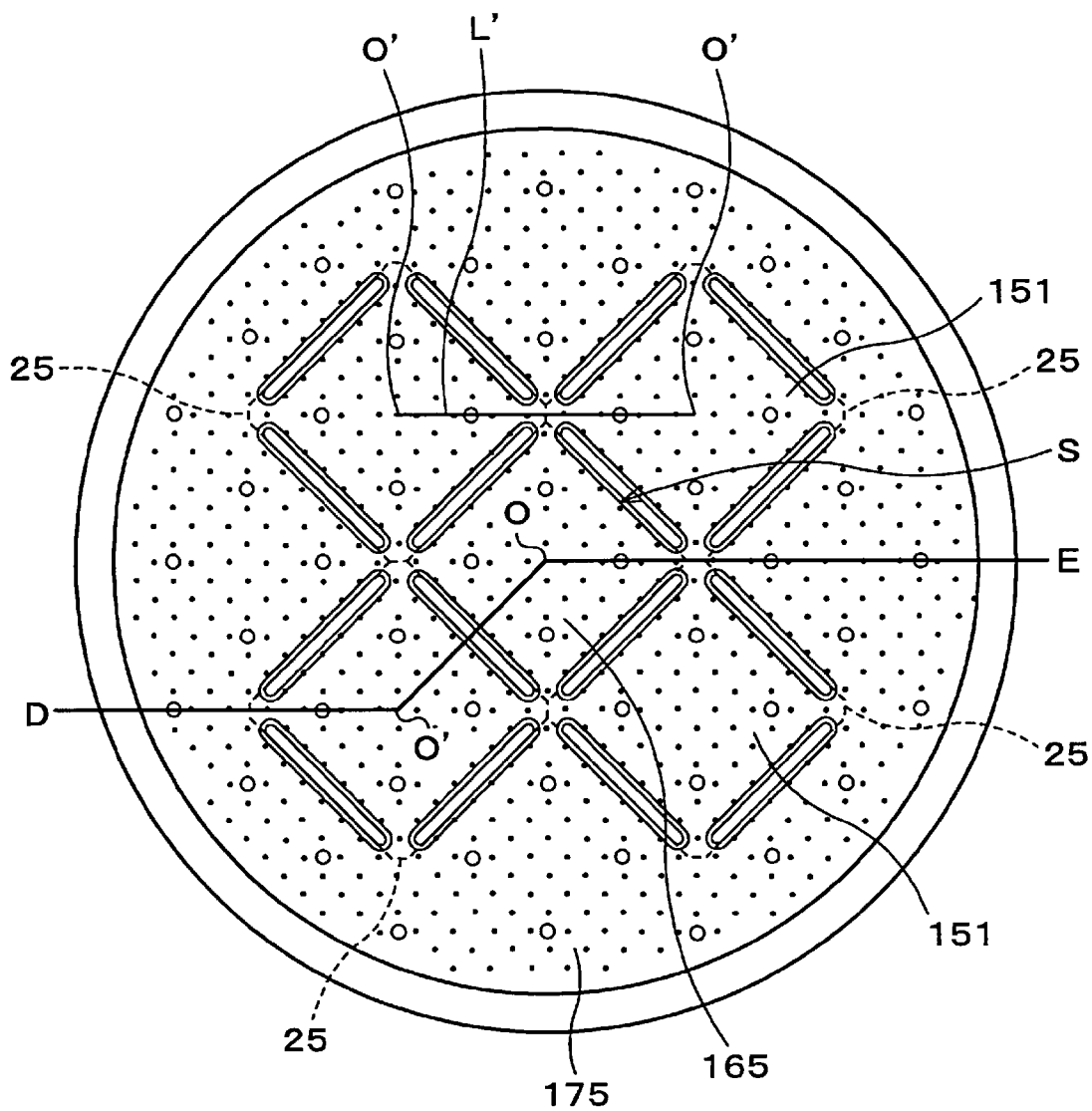
FIG. 43 presents a cross section view taken along a line A-A of FIG. 42.

FIG. 42 is a longitudinal cross section view (taken along a line D-O'-O-E of FIG. 43) illustrating a schematic configuration of a plasma processing apparatus 1 in accordance with a twelfth modification example. FIG. 43 is a cross section view taken along a line A-A of FIG. 42. In the plasma processing apparatus 1 in accordance with the twelfth modification example, four dielectric members 25 made of, e.g., $Al_2O_3$ are installed on the bottom surface of a cover 3. Each of dielectric members 25 has a substantially square plate shape.

The dielectric members 25 are arranged such that their vertex angles are adjacent to each other. Further, the vertex angles of the respective dielectric member 25 are arranged on or near a line L' connecting centers O' of the adjacent dielectric members 25. In this way, by arranging the vertex angles of the four dielectric members 25 to be adjacent to each other and locating the vertex angle of each dielectric member 25 on the line L' connecting the centers O' of the adjacent dielectric members 25, a square-shaped area S surrounded by the dielectric members 25 is formed at the cover 3's central bottom surface.

In the plasma processing apparatus 1 in accordance with the twelfth modification example, a metal electrode 151 fastened to a bottom surface of each dielectric member 25; a metal cover 165 fastened to the area S; and a side cover 175 fastened to an outer area of the dielectric member 25 are configured as one body. Further, a groove 50 is consecutively formed in a periphery of the bottom surface of the side cover 175, and an entire inner area (i.e., the bottom surfaces of the metal electrode 151, the metal cover 165 and the side cover 175) defined by the groove 50 serves as a surface wave propagating section.

In the plasma processing apparatus 1 in accordance with the twelfth modification example, the plasma is generated on the entire bottom surfaces of the metal electrode 151, the metal cover 165 and the side cover 175 which serve as the surface wave propagating sections 51 by the power of the microwave under the uniform condition, so that the more uniform plasma process can be performed on the entire processing surface of the substrate G.

Thirteenth Modification Example

Figure 44:
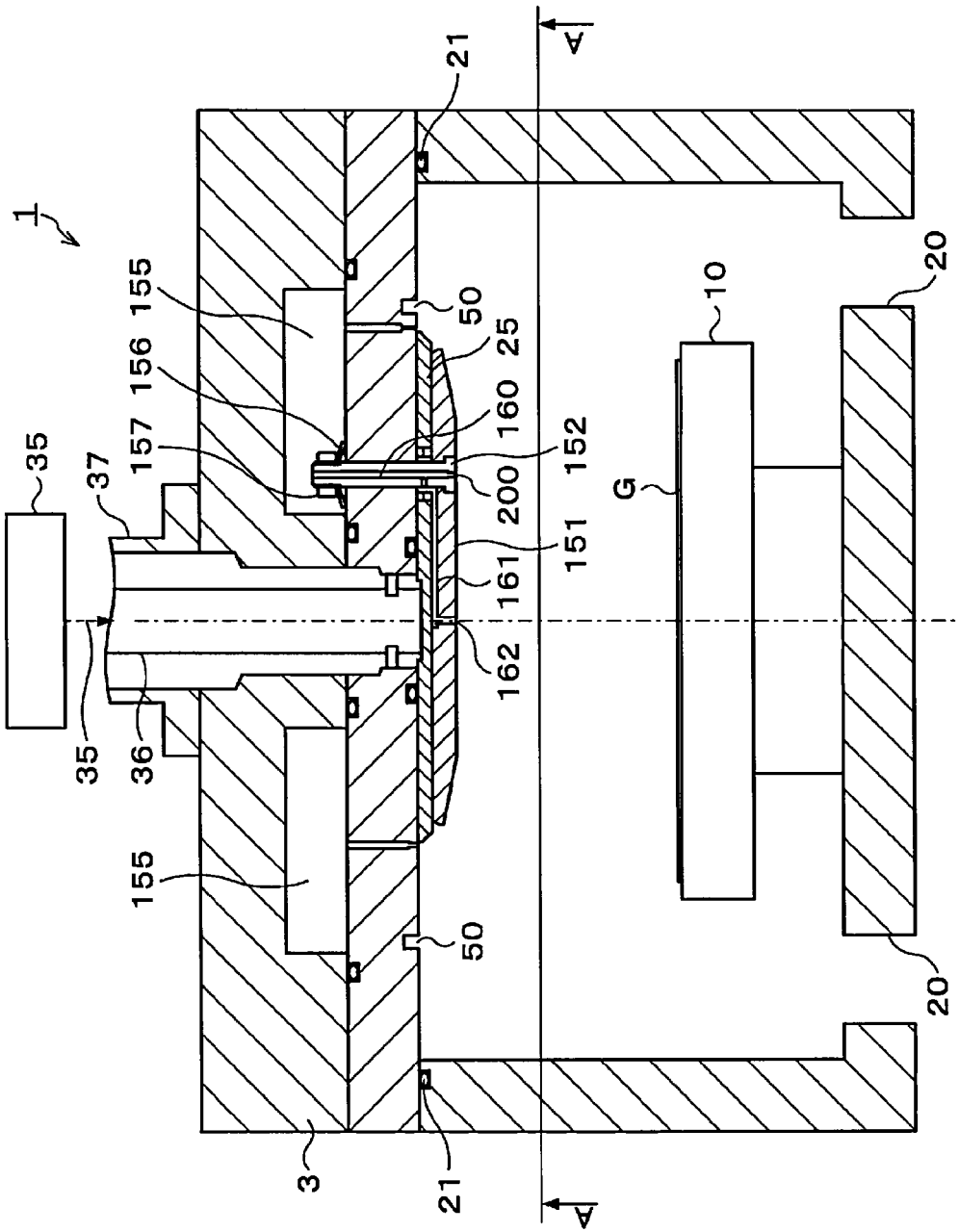
FIG. 44 depicts a longitudinal cross section view (taken along a line B-O-C of FIG. 45) showing a schematic configuration of a plasma processing apparatus in accordance with a thirteenth modification example.
Figure 45:
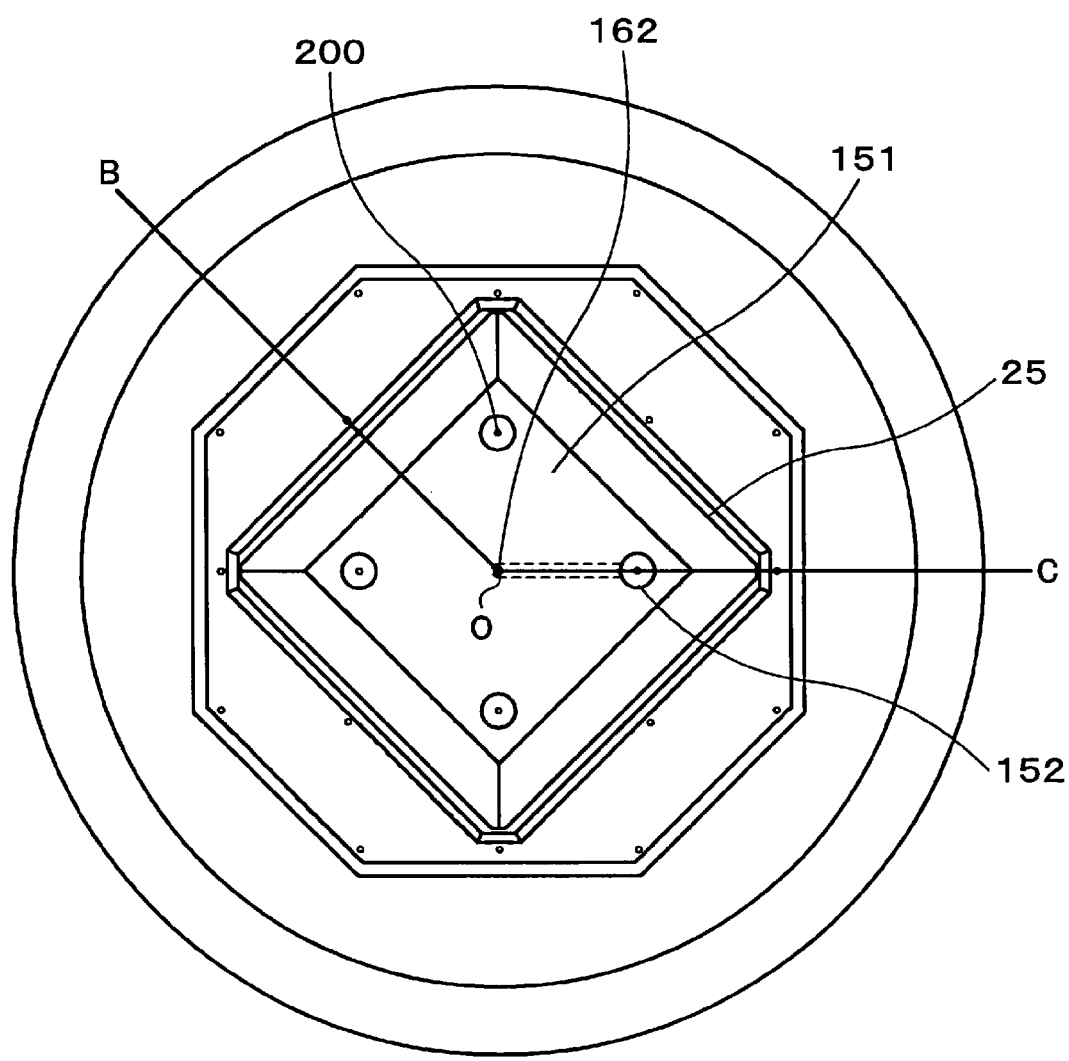
FIG. 45 depicts a cross section view taken along a line A-A of FIG. 44.

FIG. 44 shows a longitudinal cross section view (taken along a line B-O-C of FIG. 45) illustrating a schematic configuration of a plasma processing apparatus in accordance with a thirteenth modification example. FIG. 45 illustrates a cross section view taken along a line A-A of FIG. 44. In the plasma processing apparatus 1 in accordance with the thirteenth modification example, a dielectric member 25 made of, e.g., $Al_2O_3$ is installed on the bottom surface of a cover 3. The dielectric member 25 has a substantially square plate shape.

The dielectric member 25 and a metal electrode 151 are fastened to the bottom surface of the cover 3 by a connecting member 152 such as a screw. An upper end of the connecting member 152 is protruded into a space 155 formed within the cover 3. A nut 157 is fastened to the upper end of the connecting member 152 protruded into the space 155 via an elastic member 156 such as a conical spring. A gas discharge hole 200 is formed in a bottom surface of the connecting member 152. Further, another gas discharge hole 162 is formed in the center of the metal electrode 151.

The bottom surface of the cover 3 is exposed in the vicinity of the dielectric member 25. A groove 50 is formed in the bottom surface of the cover 3 to surround the dielectric member 25. An inner area of the bottom surface of the cover 3 defined by the groove 50 and a bottom surface of the metal electrode 151 serve as a surface wave propagating section.

In the plasma processing apparatus 1 in accordance with the thirteenth modification example, the plasma is generated on the inner area of the bottom surface of the cover 3 defined by the groove 50 and the bottom surface of the metal electrode 151 which serve as the surface wave propagating sections 51 by the power of the microwave under the uniform condition, so that the more uniform plasma process can be performed on the entire processing surface of the substrate G.

Fourteenth Modification Example

Figure 46:
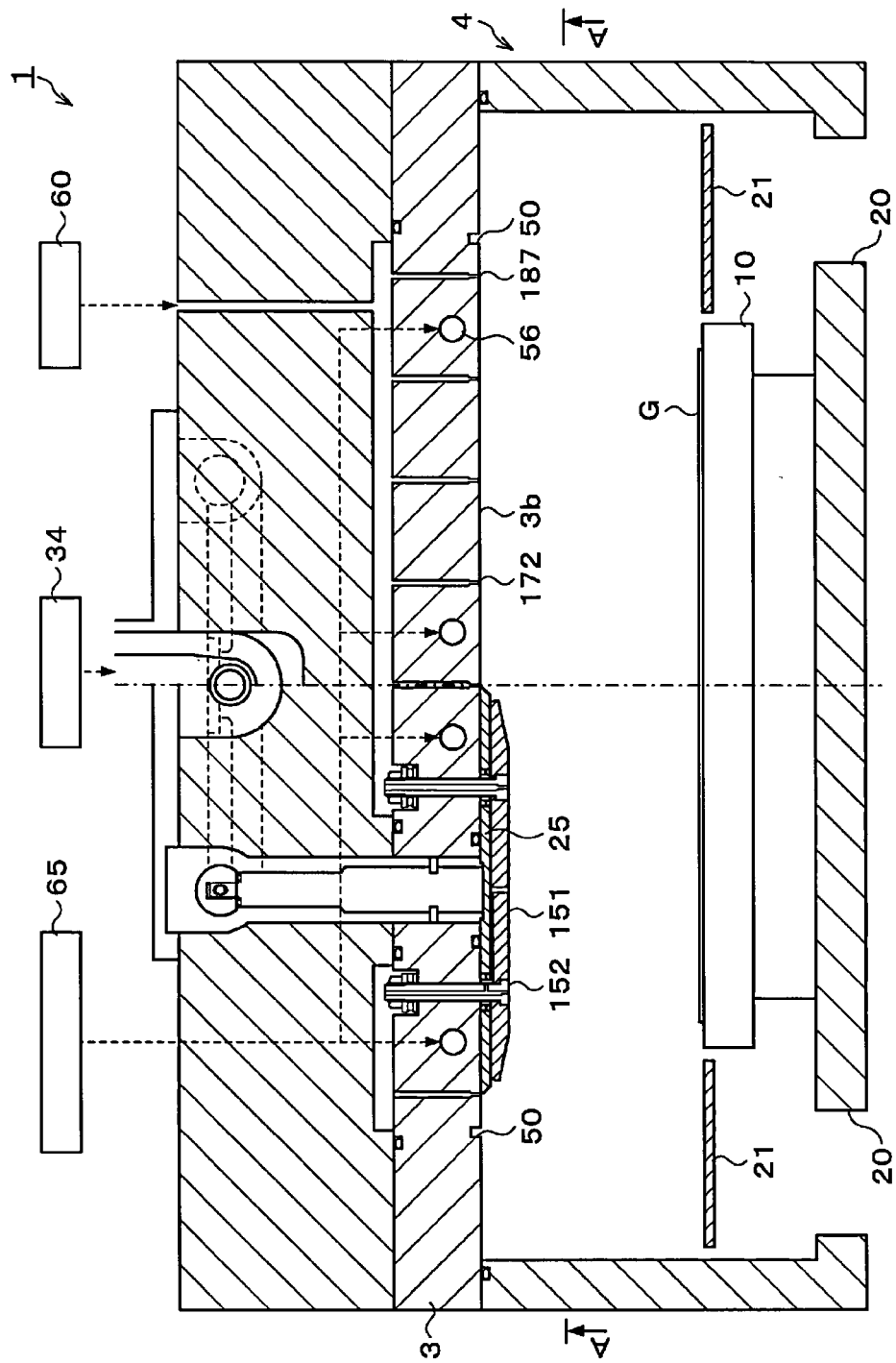
FIG. 46 sets forth a longitudinal cross section view (taken along a line B-O-C of FIG. 47) showing a schematic configuration of a plasma processing apparatus in accordance with a fourteenth modification example.
Figure 47:
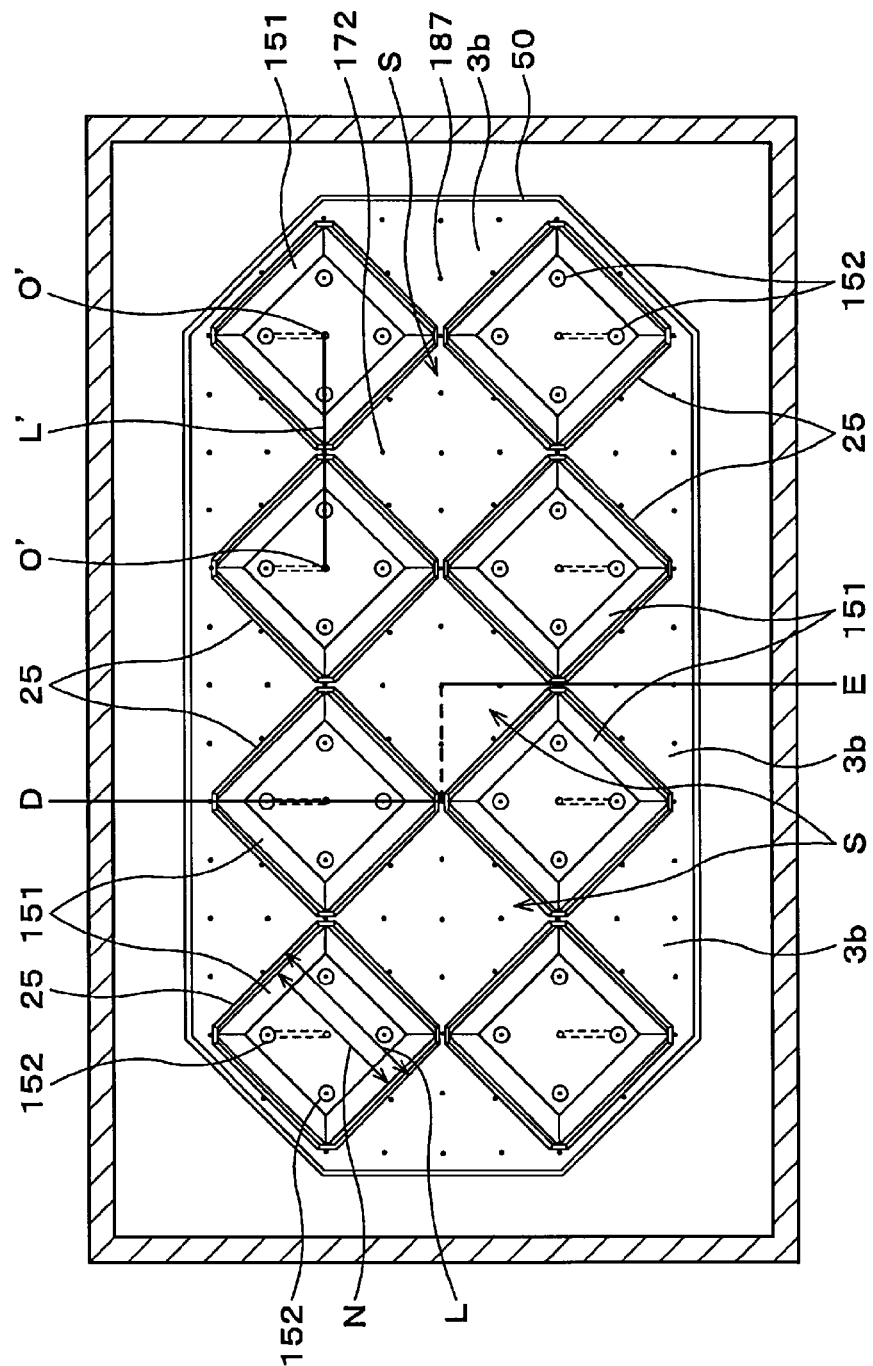
FIG. 47 sets forth a cross section view taken along a line A-A of FIG. 46.

FIG. 46 is a longitudinal cross section view (taken along a line D-O'-O-E of FIG. 47) illustrating a schematic configuration of a plasma processing apparatus 1 in accordance with a fourteenth modification example. FIG. 47 is a cross section view taken along a line A-A of FIG. 46. In the plasma processing apparatus 1 in accordance with the fourteenth modification example, eight dielectric members 25 made of, e.g., $Al_2O_3$ are installed on a bottom surface of the cover 3. As illustrated in FIG. 34, each dielectric member is formed in a substantially square plate shape. The dielectric members 25 are arranged such that their vertex angles are adjacent to each other. Further, the vertex angles of the respective dielectric member 25 are arranged on or near a line L' connecting centers O' of the adjacent dielectric members 25. In this way, by arranging the vertex angles of the eight dielectric members 25 to be adjacent to each other and locating the vertex angle of each dielectric member 25 on the line L' connecting the centers O' of the adjacent dielectric members 25, square-shaped areas S each surrounded by four dielectric members 25 are formed at three locations on the bottom surface of the cover 3.

A metal electrode 151 is installed on the bottom surface of each dielectric member 25. The metal electrode 151 is made of a conductive material such as an aluminum alloy. Like the dielectric member 25, the metal electrode 151 has a square plate shape. The width N of the metal electrode 151 is slightly shorter than the width L of the dielectric member 25. Accordingly, when viewed from the inside of the processing chamber, the periphery of the dielectric member 25 is exposed in a square outline around the metal electrode 151. Further, when viewed from the inside of the processing chamber 4, vertex angles of the square outlines in the peripheries of the dielectric members 25 are arranged adjacent to each other.

The dielectric member 25 and the metal electrode 151 are fastened to the bottom surface of the cover 3 by connecting members 152 such as screws. The metal electrode 151 is electrically connected with the bottom surface of the cover 3 via the connecting member 152 to be grounded.

In this modification example, the bottom surface of the cover 3 is exposed to the inside of the processing chamber 4 at each area S on the bottom surface of the cover 3 and the outer area of the eight dielectric members 25. Further, the bottom surface of the cover 3 is formed in a planar shape on the whole. Accordingly, the bottom surface of the metal electrode 151 is positioned below the bottom surface of the cover 3.

In the bottom surface of the cover 3, a groove 50 is consecutively formed so as to surround the eight dielectric members 25, and in an inner area of the bottom surface of the cover 3 defined by the groove 50, eight inner portions 3b of the cover bottom surface are formed. Each of the inner portions 3b of the cover bottom surface has a substantially same shape as an isosceles right triangle obtained by bisecting the metal electrode 151 along a diagonal line, when viewed from the inside of the processing chamber 4. Further, a plurality of gas discharge holes 172 is dispersedly provided in each area S on the bottom surface of the cover 3, and a plurality of gas discharge holes 187 is dispersedly provided in each inner portion 3b of the cover bottom surface.

In the plasma processing apparatus 1 in accordance with the fourteenth modification example, during a plasma process, a microwave transmitted into each dielectric member from a microwave supply unit 34 is propagated from the vicinity of the dielectric member 25 exposed on the bottom surface of the cover 3 along the bottom surface of the metal electrode 151, each area S of the cover 3 and the bottom surface of the cover bottom surface inner portion 3b. In the plasma processing apparatus 1 in accordance with the fourteenth modification example, the plasma is generated on the bottom surface of the metal electrode 151, each area S of the cover 3 and the bottom surface of the cover bottom surface inner portion 3b which serve as the surface wave propagating sections 51 by the power of the microwave under the uniform condition, so that the more uniform plasma process can be performed on the entire processing surface of the substrate G.

(Position of an Outer Periphery of a Dielectric)

Figure 48:
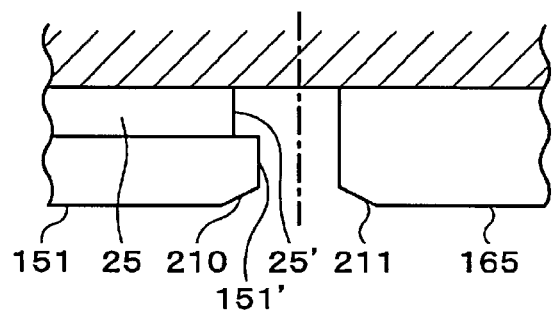
FIG. 48 is a diagram for describing a modification example in which the outer periphery of a dielectric member is located inside the outer periphery of a metal electrode when viewed from the inside of a processing chamber.

FIGS. 48 to 54 are cross section views (corresponding to a cross section F of FIG. 33) each illustrating an outer periphery of a dielectric member 25, a metal electrode 151 and a metal cover 165 (a metal cover 165a). As illustrated in FIG. 48, an outer periphery 25' of the dielectric member may be positioned more inside than an outer periphery 151' of the metal electrode 151 when viewed from the inside of the processing chamber 4, or only a side surface (the outer periphery 25') of the dielectric member 25 may be exposed to the inside of the processing chamber 4. Alternatively, the outer periphery 25' of the dielectric member 25 may be aligned in the same line with the outer periphery 151' of the metal electrode 151 when viewed from the inside of the processing chamber 4.

Figure 49:
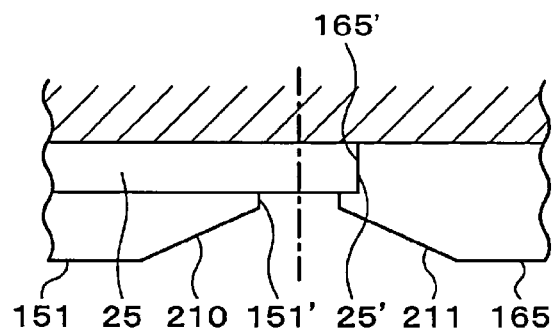
FIG. 49 is a diagram for describing a modification example in which a recess portion accommodating therein the outer periphery of the dielectric member is formed on a lateral surface of a metal cover.

Further, as illustrated in FIG. 49, when the outer periphery 25' of the dielectric member 25 is positioned more outside than the outer periphery 151' of the metal electrode 151, a recess 165' configured to receive the outer periphery 25' of the dielectric member 25 may be formed in a side surface of the metal cover 165.

(Shape of a Bottom Surface of a Cover)

Figure 50:
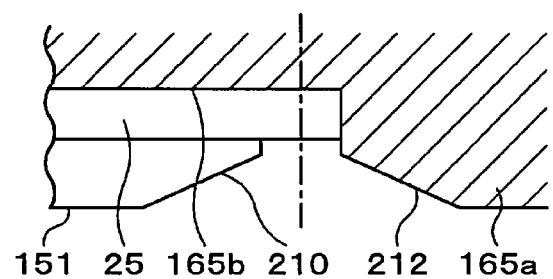
FIG. 50 is a diagram for describing a modification example in which a dielectric member is inserted in a groove in a bottom surface of a cover.
Figure 51:
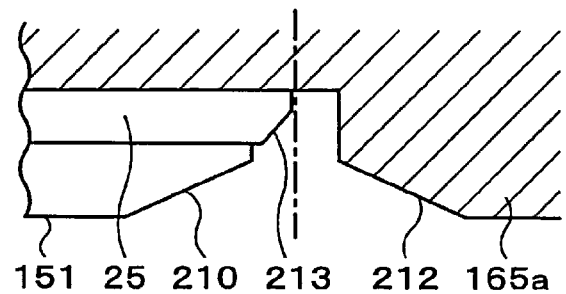
FIG. 51 is a diagram for describing another modification example in which a dielectric member is inserted in a recess portion in a bottom surface of a cover.

As illustrated in FIGS. 50 and 51, the metal cover 165a having the same shape as that of the metal cover 165 is formed on the cover 3 as one body, and the dielectric member 25 may be inserted into a recess 165b adjacent to the metal cover 165a on the bottom surface of the cover 3. In this case, an center line average roughness of the bottom surface of the metal cover 165a is desirably about 2.4 μm or less, more desirably about 0.6 μm or less.

Further, as illustrated in FIG. 50, the outer periphery of the dielectric member 25 may be adjacent to a side surface of the metal cover 165a, or as illustrated in FIG. 51, the outer periphery of the dielectric member 25 may be apart form the side surface of the metal cover 165a.

Figure 52:
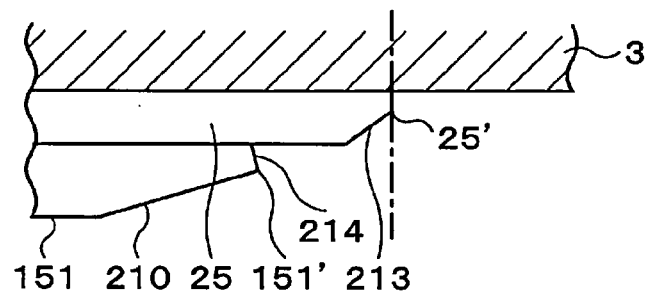
FIG. 52 is a diagram for describing a modification example in which a planar cover is exposed in the vicinity of the dielectric member.
Figure 53:
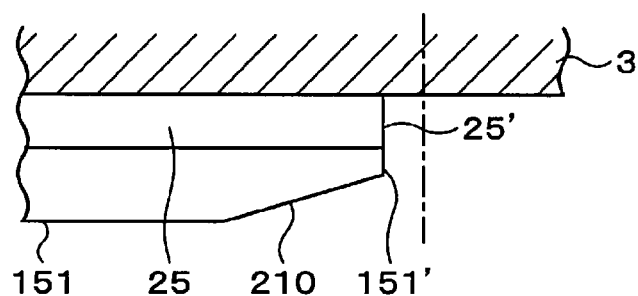
FIG. 53 is a diagram for describing another modification example in which a planar cover is exposed in the vicinity of a dielectric member.
Figure 54:
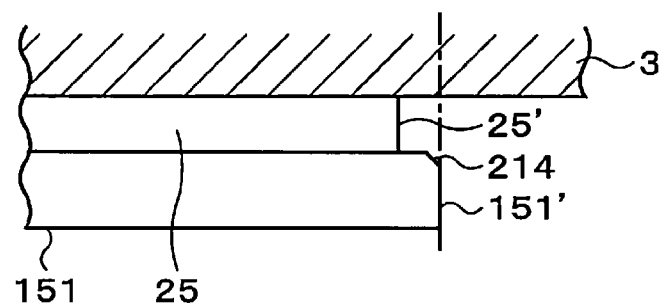
FIG. 54 is a diagram for describing still another modification example in which a planar cover is exposed in the vicinity of a dielectric member.

Furthermore, as illustrated in FIGS. 52 to 54, the metal cover 165 may be omitted and the bottom surface of the planar cover 3 may be exposed in the vicinity of the dielectric member 25. In this case, when viewed from the inside of the processing chamber 4, a shape of the bottom surface of the cover 3 surrounded by the plurality of the dielectric members 25 may be substantially the same as a shape of the bottom surface of the metal electrode 151 fastened to the dielectric member 25. Moreover, a center line average roughness of the bottom surface of the cover 3 is desirably about 2.4 μm or less, more desirably about 0.6 μm or less.

As illustrated in FIG. 52, the outer periphery 25' of the dielectric member 25 may be positioned more outside than the outer periphery 151' of the metal electrode 151 when viewed from the processing chamber 4. Alternatively, as illustrated in FIG. 53, the outer periphery 25' of the dielectric member 25 may be aligned in the same line with the outer periphery 151' of the metal electrode 151 when viewed from the inside of the processing chamber 4. Further alternatively, as illustrated in FIG. 54, the outer periphery 25' of the dielectric member 25 may be positioned more inside than an outer periphery 151' of the metal electrode 151 when viewed from the inside of the processing chamber 4. Further, as illustrated in FIGS. 48 to 53, a taper 210 may be formed at the outer periphery 151' of the metal electrode 151. Alternatively, as illustrated in FIGS. 48 and 49, a taper 211 may be formed at the outer periphery of the metal cover 165. Further alternatively, as illustrated in FIGS. 50 and 51, a taper 212 may be formed at the outer periphery of the metal cover 165a integrated with the cover 3. Moreover, as illustrated in FIGS. 51 and 52, a taper 213 may be formed at the outer periphery of the dielectric member 25. Besides, as illustrated in FIGS. 52 and 54, a reverse taper 214 may be formed at the outer periphery 151' of the metal electrode 151.

(Shapes of a Dielectric Member and a Metal Electrode)

Figure 55:
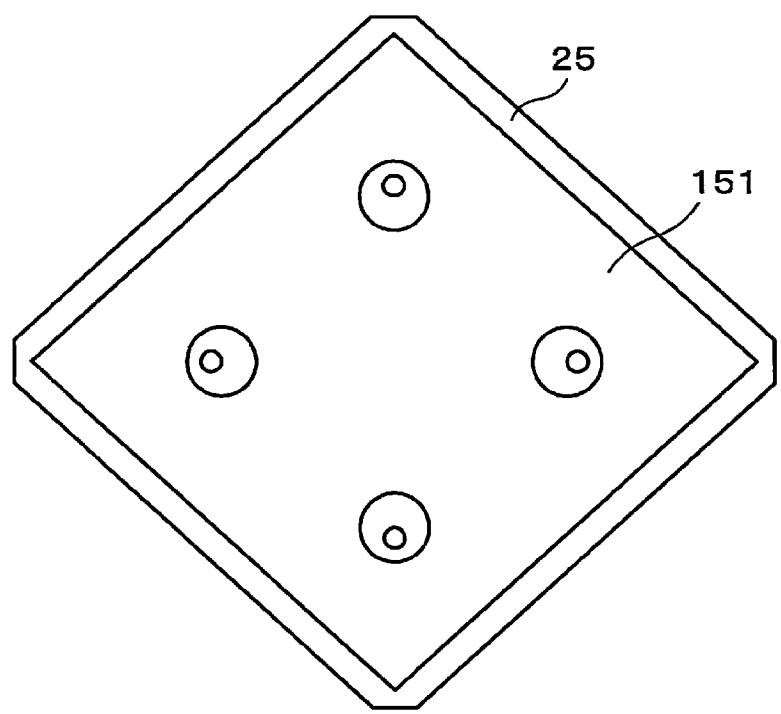
FIG. 55 is a diagram for describing lozenge-shaped dielectric member.

As illustrated in FIG. 55, the dielectric member 25 formed in a rhombus shape may be used. In this case, if the metal electrode 151 fastened to the bottom surface of the dielectric member 25 may be formed similarly in a rhombus shape slightly smaller than the dielectric member 25, the periphery of the dielectric member 25 is present as a rhombus-shaped outline around the metal electrode 151 and is exposed to the inside of the processing chamber 4.

Figure 56:
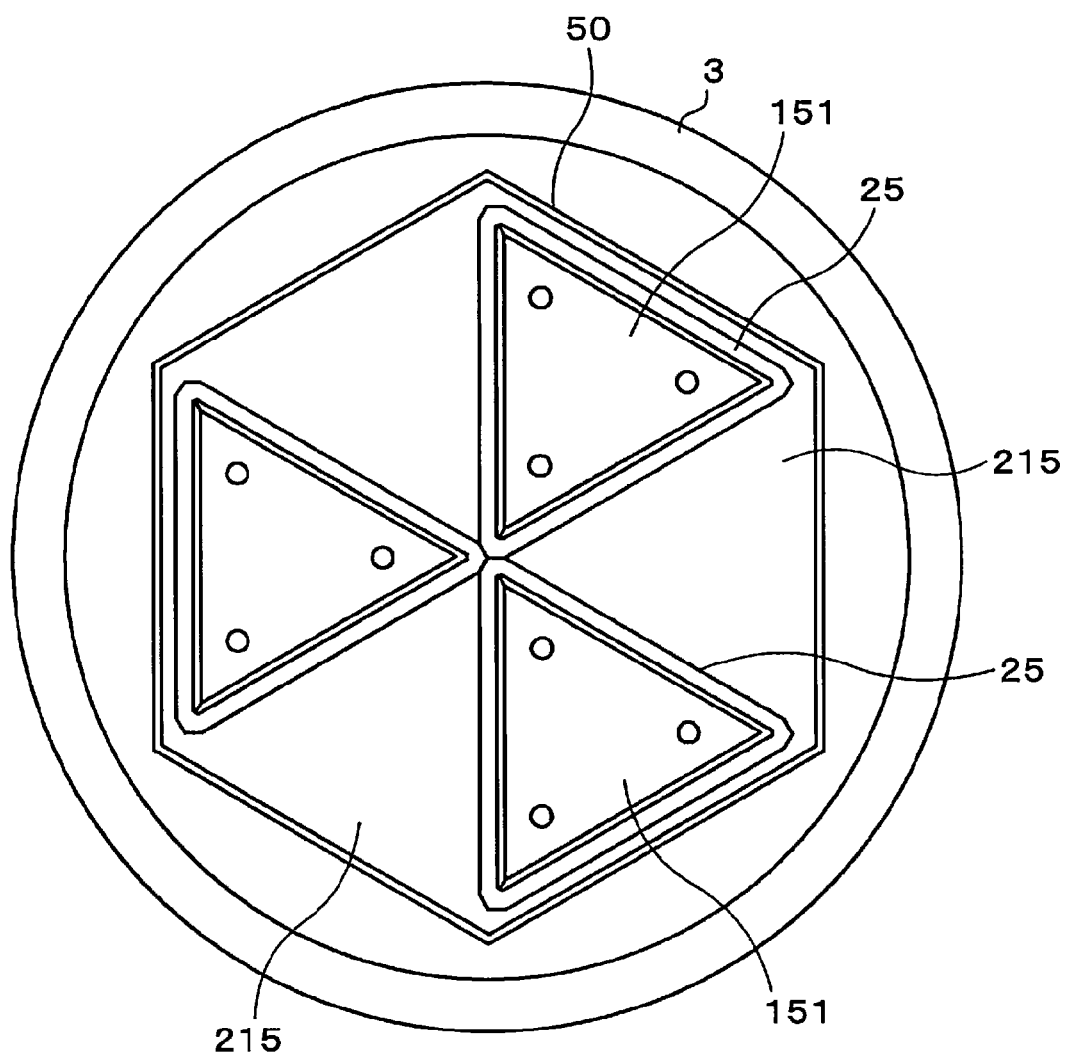
FIG. 56 depicts a bottom view of a cover of a plasma processing apparatus in accordance with a modification example using an equilateral triangle-shaped dielectric member.

Further, as illustrated in FIG. 56, the dielectric members 25 formed in an equilateral triangle shape may be used. In this case, if the metal electrode 151 fastened to the bottom surface of the dielectric member 25 may be formed similarly in an equilateral triangle shape slightly smaller than the dielectric member 25, the periphery of the dielectric member 25 is present as an equilateral triangle-shaped outline around the metal electrode 151 and is exposed to the inside of the processing chamber 4. Furthermore, when the equilateral triangle-shaped dielectric members 25 are used, if vertex angles of three dielectric members 25 are arranged to be adjacent to one another such that central angles therebetween are equal to one another, surface wave propagating sections 215 can be provided in the same shape as that of the metal electrode 151 between any two of the dielectric members 25.

(Configuration of a Connecting Member)

Figure 57:
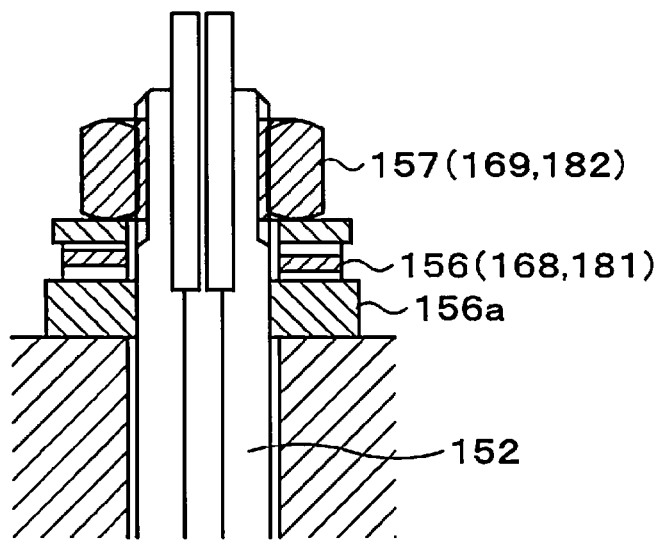
FIG. 57 is a diagram for describing a structure of a connecting member using a elastic member.

As described above, the dielectric member 25 and the metal electrode 151 are fastened to the bottom surface of the cover 3 by the connecting member 152. In this case, as illustrated in FIG. 57, a gap between a lower washer 156a positioned underneath the elastic member 156 and the screw (connecting member 152) needs to be small. A wave washer, a conical spring, a spring washer, a metal spring or the like can be used as the elastic member 156. Alternatively, the elastic member 156 may be omitted.

Figure 58:
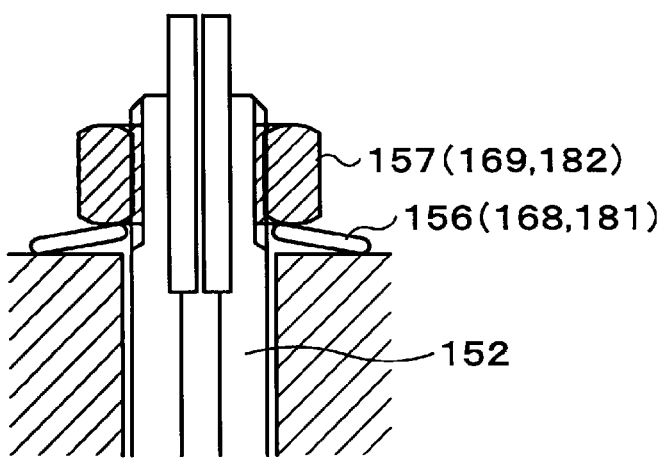
FIG. 58 is a diagram for describing a structure of a connecting member using a conical spring.

FIG. 58 illustrates a case of using a conical spring as the elastic member 156. The conical spring has a spring force strong enough to deform the O-ring 30. Since upper and lower angled portions of the conical spring are closely in contact with the nut 157 and the cover 3, gas leakage can be suppressed. The conical spring is made of, e.g., Ni-plated SUS.

Figure 59:
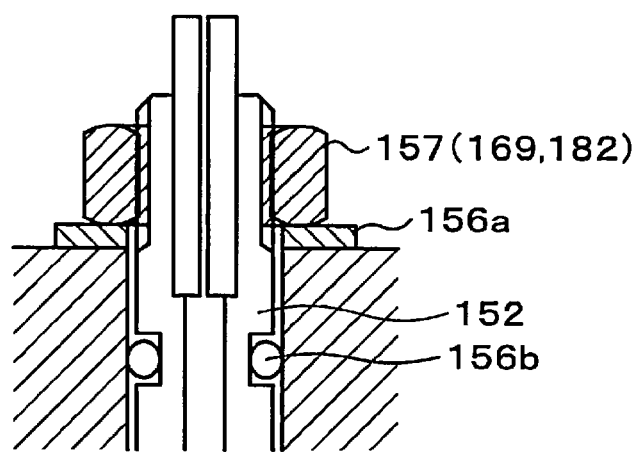
FIG. 59 is a diagram for describing a structure of a connecting member using an O-ring.

FIG. 59 illustrates a case of using an O-ring 156b for sealing. In this case, gas leakage can be suppressed. The O-ring 156b may be positioned at an angled portion of the hole. Together with the O-ring 156b, the elastic member such as the wave washer and the conical spring may be used. Instead of the O-ring 156b for sealing, a seal washer may be used.

Figure 60:
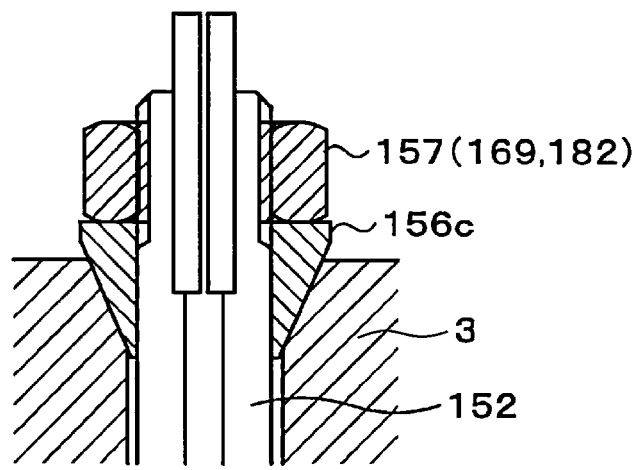
FIG. 60 is a diagram for describing a structure of a connecting member using a taper washer.

FIG. 60 illustrates a case of using a taper washer 156c. When the nut 157 is fastened, the taper washer 156c is closely in contact with the cover 3 and the screw (connecting member 152), thereby achieving secure sealing with no gaps therebetween. Since the screw (connecting member 152) is fixed to the cover 3 by the taper washer 156c, the screw (connecting member 152) are not rotated along with the nut 157 when the nut 157 is fastened. Accordingly, there is no risk that the screw (connecting member 152) and the metal electrode 151 are abraded, resulting in scratch on the surface or peeling of a protective film formed on the surface. The taper washer 156c is desirably made of metal or resin.

The above-mentioned connecting member 152 configured to fix the dielectric member 25 and the metal electrode 151 can applied to the connecting member 166 fixing the metal cover 165 and the connecting member 180 fixing the side cover 175 in the same manner. Even though a rotation stop function of the screw (connecting member 152) is not illustrated in FIGS. 57 to 59, the screw (connecting member 152) may be fixed to the metal electrode 151 or the like by means of press fitting, shrinkage fitting, welding, cementing or the like, or the screw (connecting member 152) and the metal electrode 151 may be configured as one body. Further, a key groove may be formed between the screw (connecting member 152) and the cover 3, and by inserting a key thereinto, rotation may be prevented. Furthermore, a hexagon-shaped part may be provided in an end portion (upper portion) of the screw (connecting member 152), and while pressing it with a wrench or the like, the screw (connecting member 152) may be fastened.

(Groove, Protrusion)

Figure 61D:
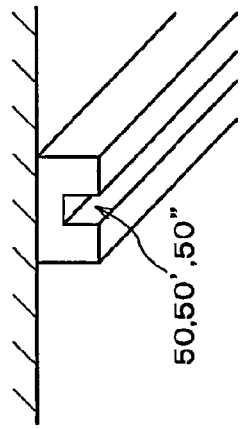
FIGS. 61A to 61F are diagrams for describing an example of various grooves.
Figure 61E:
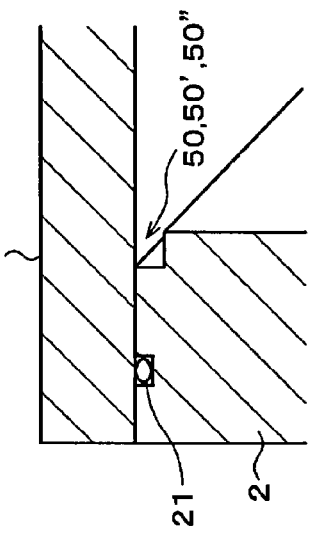
Figure 61F:
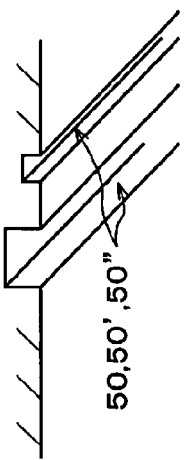
Figure 61A:
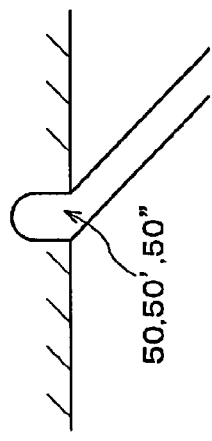
Figure 61B:
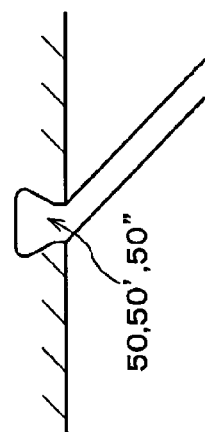
Figure 61C:
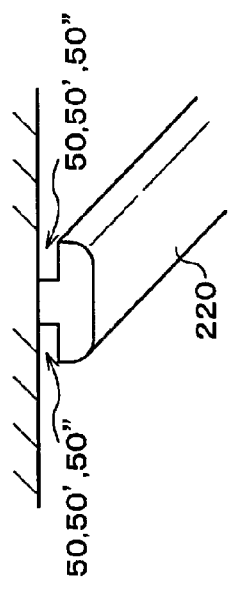

Grooves 50, 50' and 50" can be, e.g., a domed-rectangular groove in FIG. 61A, an dovetail groove in FIG. 61B, grooves positioned symmetrically with respect to a notch 220 in FIG. 61C, a C-shaped groove in FIG. 61D, a groove formed between the top surface of the chamber main body 2 and the bottom surface of the cover 3 in FIG. 61E, double grooves having different sizes in FIG. 61F.

Instead of or together with the grooves 50, 50' and 50", protrusions may be formed. It is difficult to change a shape of the groove in the future, but it is relatively easy to change a shape of the protrusion.

Figure 62:
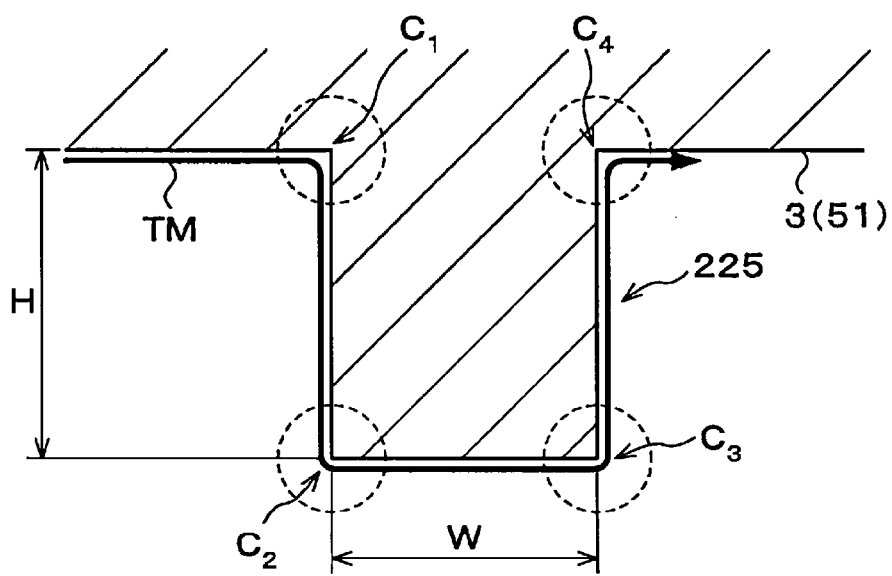
FIG. 62 is a diagram for describing a conductor surface wave propagated in a protrusion.

As illustrated in FIG. 62, when a conductor surface wave TM is propagated along a surface of a protrusion 225, four angled portions $C_1$~$C_4$ can be regarded as discontinuous points of impedance and three planar portions between the angled portions $C_1$ to $C_4$ can be regarded as transmission lines having an impedance of a certain property. The four discontinuous points of impedance can be regarded as a transmission line filter combined with the three transmission lines. Even though a single angled portion $C_1$~$C_4$ can not reflect the conductor surface wave TM sufficiently, a small amount of transmission can be achieved on the whole by optimizing a length of the planar portions (length of the transmission lines) of the protrusion 225.

In this case, a height H of the protrusion 225 is desirable to be as low as possible. If the height H of the protrusion 225 is set to be higher than needs be, an electron and an ion in plasma P are recombined with each other at a wall surface of the protrusion 225, so that a plasma density is undesirably lowered. A phase of a reflection coefficient of the transmission line is rotated 360 degrees with a length of about ½ of a wavelength, so that all the impedance can be obtained by setting the height H of the protrusion 225 to be about ½ or less of a wavelength of the conductor surface wave TM.

In the same manner as the groove, the height H of the protrusion 225 needs to be higher than a thickness t of a sheath because if the protrusion 225 has a height that can not be recognized as a level difference by the conductor surface wave TM, the protrusion 225 can not perform a propagation suppress function.

In view of the foregoing, the inventors have reached a conclusion that in order to suppress propagation of the conductor surface wave TM, the height H of the protrusion 225 needs to be higher than the thickness t of the sheath and shorter than about ½ of the wavelength λ of the conductor surface wave TM.

As described above, the embodiments of the present invention has been explained with reference to the accompanying drawings, but the present invention is not limited to these embodiments. It is obvious that various modification and amendments can be derived by those skilled in the art within a scope of the claims, and it shall be understood that all the modifications are included in the scope of the present invention.

For example, a conductive film, e.g., a Ni film or an Al film, having a thickness of about 10 μm may be formed on the surface of the dielectric member 25 except a portion exposed to the inside of the processing chamber 4. In this way, by forming the conductive film on the surface of the dielectric member 25, a microwave is not propagated to an area except the portion exposed to the inside of the processing chamber 4, thereby preventing a bad influence upon the O-ring 30 or the like. The position on which the conductive film is formed can be the recess 3a formed in the center of the top surface of the dielectric member 25, an area adjacent to the connecting member 152 or at least a part of a surface in contact with the metal electrode 151 in addition to an area in contact with the O-ring 30.

An alumina film, an yttrium oxide film, a Teflon (registered trademark) film or the like can be used as a protective film on the bottom surface of the cover 3 or the inner surface of the chamber main body 2. Further, the plasma processing apparatus in accordance with the present invention may perform a plasma processing on, e.g., a large-sized glass substrate, a disk-shaped silicon wafer or a quadrangular silicon-on-insulator (SOI). Furthermore, in the plasma processing apparatus in accordance with the present invention, all kinds of plasma processes such as a film forming process, a diffusion process, an etching process, and an asking process can be carried out.

In the above-described embodiments, the microwave having a frequency of about 915 MHz is employed as the microwave having a frequency of about 2 GHz or less, but there is no limitation to this frequency, so that any other microwave having a frequency of about 896 MHz, 922 MHz or the like may be employed. Besides, an electromagnetic wave other than the microwave can be employed. Further, an alumina film may be formed on the surfaces of the cover 3, the chamber main body 2, the metal electrode 151, the metal cover 165, the side cover 175, the connecting members 152, 166 and 180 or the like. In the above-described embodiments, although the gas is discharged from the gas discharge holes 162, 172 and 187 opened toward the top surface of the processing chamber 4, the gas may also be discharged toward the space under the cover 3 from the side wall of the chamber. Moreover, the metal electrode 151 may be a metal film deposited on the bottom surface of the dielectric member 25 instead of the metal plate.

INDUSTRIAL APPLICABILITY

The present invention can be applied to, e.g., a CVD process and an etching process.

What is claimed is:

1. A plasma processing apparatus comprising:
a processing chamber produced from a metal;
a susceptor configured to mount a substrate and installed in the processing chamber;
an electromagnetic wave source that supplies an electromagnetic wave necessary to excite plasma in the processing chamber;

one or more dielectric member provided on a bottom surface of a cover of the processing chamber, and configured to transmit the electromagnetic wave supplied from the electromagnetic wave source into an inside of the processing chamber, the bottom surface of the cover facing the susceptor;

one or more metal electrode, wherein each metal electrode is installed on a bottom surface of each dielectric member such that a peripheral part of the each dielectric member is exposed to the inside of the processing chamber; and a metal cover facing the susceptor, the metal cover being installed adjacent to the dielectric member and on the bottom surface of the cover, and being exposed to the inside of the processing chamber, wherein a bottom surface of the metal cover and a bottom surface of the metal electrode are positioned on the same plane, the metal cover does not overlap with the dielectric member when viewed from inside of the processing chamber, and the metal cover and the metal electrode are formed of square shapes, and four sides of each of the metal cover and the metal electrode are surrounded by the part of the dielectric member exposed to the inside of the processing chamber.

2. The plasma processing apparatus of claim 1, wherein the processing chamber comprises a chamber main body and the cover, and the dielectric member and the metal cover are installed on the bottom surface of the cover, and the bottom surface of the metal cover serves as a surface wave propagating section.

3. The plasma processing apparatus of claim 2, wherein the metal cover has a thickness equivalent to a sum of thicknesses of the dielectric member and the metal electrode.

4. The plasma processing apparatus of claim 2, further comprising:
one or more gas discharge hole through which a gas is discharged into the processing chamber,
wherein the gas discharge hole is provided in the bottom surface of the metal cover.

5. The plasma processing apparatus of claim 1, wherein the one or more dielectric member is plural in number, and at least two dielectric members are spaced apart from each other, and the metal cover is positioned between the two dielectric members.

6. The plasma processing apparatus of claim 5, further comprising:
a groove or a protrusion installed on the bottom surface of the cover of the processing chamber,
wherein a plurality of the dielectric members are surrounded by the groove or the protrusion.

7. The plasma processing apparatus of claim 1, wherein the bottom surface of the metal cover is a single continuous flat section.

8. The plasma processing apparatus of claim 1, wherein one or more metal rod serving to propagate the electromagnetic wave to the dielectric member are provided in a top portion of the dielectric member such that a bottom end of each metal rod is adjacent or close to a top surface of the dielectric member.

9. The plasma processing apparatus of claim 1, wherein sealing members are installed between a top surface of the dielectric member and the bottom surface of the cover of the processing chamber, and between the bottom surface of the dielectric member and the metal electrode.

10. The plasma processing apparatus of claim 1, further comprising:
one or more connecting member provided to connect the metal electrode and the bottom surface of the cover of the processing chamber through a hole in the dielectric member.

11. The plasma processing apparatus of claim 10, wherein the metal electrode is provided with one or more gas discharge hole through which a gas is discharged into the processing chamber, and the connecting member is provided with a gas passage through which the gas flows to reach the gas discharge hole.

12. The plasma processing apparatus of claim 1, further comprising:
one or more gas discharge hole through which a gas is discharged into the processing chamber,
wherein the gas discharge hole is provided in the bottom surface of the cover.

13. The plasma processing apparatus of claim 1, wherein a frequency of the electromagnetic wave supplied from the electromagnetic wave source is equal to or less than about 2 GHz.

14. The plasma processing apparatus of claim 1, wherein a surface of the dielectric member exposed to the inside of the processing chamber is extended continuously while forming a circle or a polygon.

15. The plasma processing apparatus of claim 1, wherein the bottom surface of the metal cover is covered with a protective film having a thin thickness so as not to substantially affect the propagation of the electromagnetic wave.

16. The plasma processing apparatus of claim 1, an area of the metal cover and an area of the metal electrode are substantially the same.

* * * * *

UNITED STATES PATENT AND TRADEMARK OFFICE
CERTIFICATE OF CORRECTION

PATENT NO. : 8,733,281 B2
APPLICATION NO. : 13/726913
DATED : May 27, 2014
INVENTOR(S) : Masaki Hirayama et al.

It is certified that error appears in the above-identified patent and that said Letters Patent is hereby corrected as shown below:

In the specification

Column 11, line 54, please replace "$\delta=-1/\text{Im}$" with - $\delta = -1/\text{Im}(k)$ -

Column 12, under [Eq. 8], please replace " $H_y = A\cos(h_i x)e^{-\gamma z} 0 < x < 1$ " with - $H_y = A\cos(h_i x)e^{-\gamma z}$       $0 < x < t$ -

Column 12, under [Eq. 8], please replace " $H_y = Be^{-jh_e x}e^{-\gamma z} x > 1$ " with - $H_y = Be^{-jh_e x}e^{-\gamma z}$       $x > t$ -

Column 13, under [Eq. 9], please replace " $h_i^2 - h_e^2 = (1 - \epsilon_r + j\epsilon_r'')k_0^2$ " with - $h_i^2 - h_e^2 = (1 - \varepsilon_r' + j\varepsilon_r'')k_0^2$ -

Column 16, line 28, please add - 50 - between "groove" and "is"

Column 22, line 48, please add - 1 - between "apparatus" and "in"

Column 24, line 54, please add - 94 - between "rod" and "inserted"

Column 26, line 66, please add - 35 - between "waveguides" and "is"

Column 29, line 52, please add - 3 - between "cover" and "via"

Column 35, line 14, please add - 25 - before "to the end portion"

Column 38, line 22, please add - 3 - between "cover" and "and"

Signed and Sealed this
Sixteenth Day of September, 2014

Michelle K. Lee
*Deputy Director of the United States Patent and Trademark Office*

Column 38, line 42, please add - 25 - between "member" and "from"

Column 40, line 14, please add - 25 - between "member" and "is"

Column 40, line 66, please add - 25 - after "dielectric member"

Column 41, line 18, please add - 25 - between "member" and "may"